(12) United States Patent
Lin et al.

(10) Patent No.: US 12,520,562 B2
(45) Date of Patent: Jan. 6, 2026

(54) SEMICONDUCTOR DEVICE WITH GERMANIUM-BASED CHANNEL

(71) Applicant: TAIWAN SEMICONDUCTOR MANUFACTURING COMPANY, LTD., Hsinchu (TW)

(72) Inventors: Cheng-Ming Lin, Kaohsiung (TW); Wei-Yen Woon, Taoyuan (TW); Szuya Liao, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 414 days.

(21) Appl. No.: 18/321,674

(22) Filed: May 22, 2023

(65) Prior Publication Data

US 2024/0395812 A1 Nov. 28, 2024

(51) Int. Cl.
| | |
|---|---|
| *H10D 84/01* | (2025.01) |
| *H10D 30/01* | (2025.01) |
| *H10D 30/43* | (2025.01) |
| *H10D 30/67* | (2025.01) |
| *H10D 62/10* | (2025.01) |
| *H10D 64/01* | (2025.01) |

(Continued)

(52) U.S. Cl.
CPC ....... *H10D 84/0181* (2025.01); *H10D 30/014* (2025.01); *H10D 30/43* (2025.01); *H10D 30/6735* (2025.01); *H10D 30/6757* (2025.01); *H10D 62/121* (2025.01); *H10D 64/017* (2025.01); *H10D 84/0167* (2025.01); *H10D 84/017* (2025.01); *H10D 84/038* (2025.01); *H10D 84/85* (2025.01)

(58) Field of Classification Search
CPC ................. H10D 30/01; H10D 30/014; H10D 30/019–0198; H10D 30/43; H10D 30/435; H10D 30/501–509; H10D 30/6735; H10D 30/674; H10D 30/6757; H10D 62/121; H10D 64/017; H10D 64/685; H10D 84/01; H10D 84/0167; H10D 84/017; H10D 84/0181; H10D 84/038; H10D 84/8311; H10D 84/8312; H10D 84/83135; H10D 84/83138; H10D 84/8314; H10D 84/8316; H10D 84/851–852; H10D 88/00; H10D 84/85
See application file for complete search history.

(56) References Cited

U.S. PATENT DOCUMENTS

| 9,209,247 B2 | 12/2015 | Colinge et al. |
| 9,236,267 B2 | 1/2016 | De et al. |

(Continued)

FOREIGN PATENT DOCUMENTS

| CN | 115911010 A | 4/2023 |
| TW | 202301478 A | 1/2023 |

*Primary Examiner* — Cheung Lee
(74) *Attorney, Agent, or Firm* — Maschoff Brennan

(57) ABSTRACT

A device includes a gate structure, first and second gate spacers, source/drain regions, a refill metal structure, and a first dielectric liner. The gate structure is on a substrate. The first and second gate spacers are on opposite sides of the gate structure, respectively. The source/drain regions are spaced part from the gate structure at least in part by the first and second gate spacers. The refill metal structure is on the gate structure and between the first and second gate spacers. The first dielectric liner is atop the gate structure. The first dielectric liner interposes the refill metal structure and the first gate spacer.

20 Claims, 49 Drawing Sheets

(51) Int. Cl.
*H10D 84/03* (2025.01)
*H10D 84/85* (2025.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 12,166,079 B2 | 12/2024 | Khaderbad et al. |
| 2023/0178435 A1 | 6/2023 | Huang et al. |

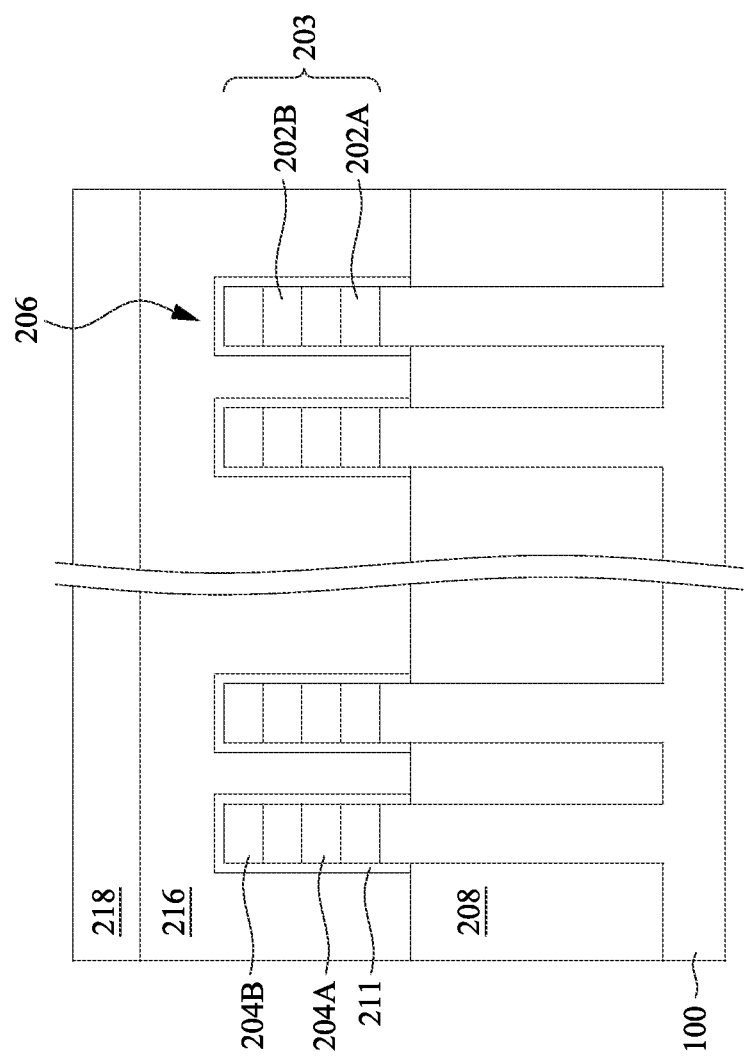

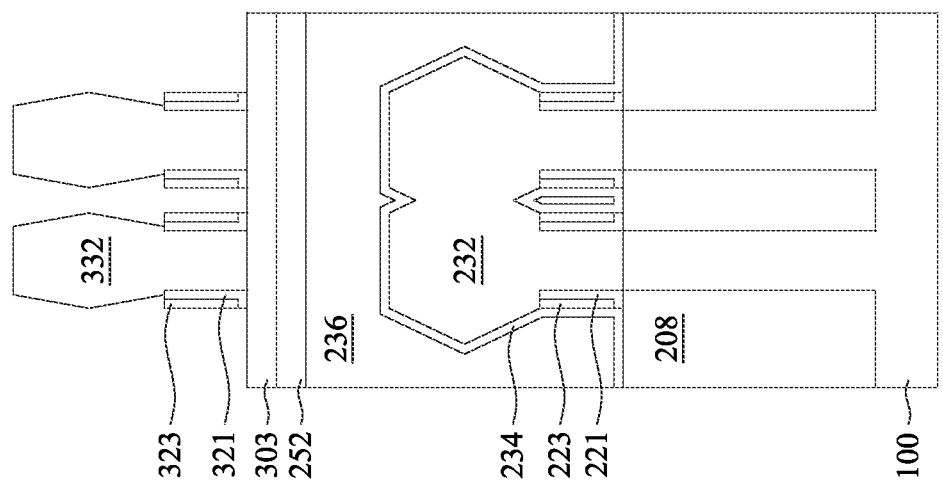

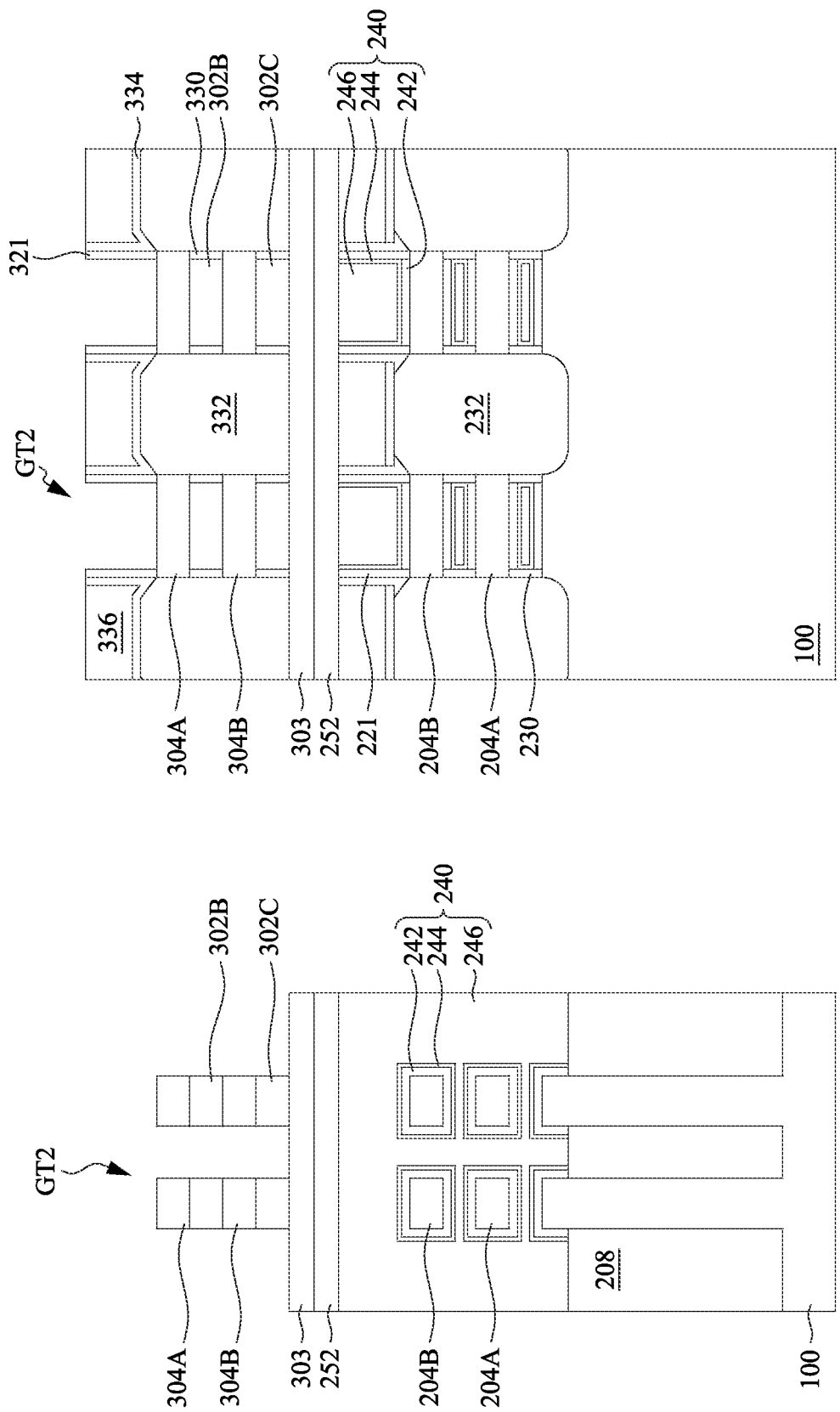

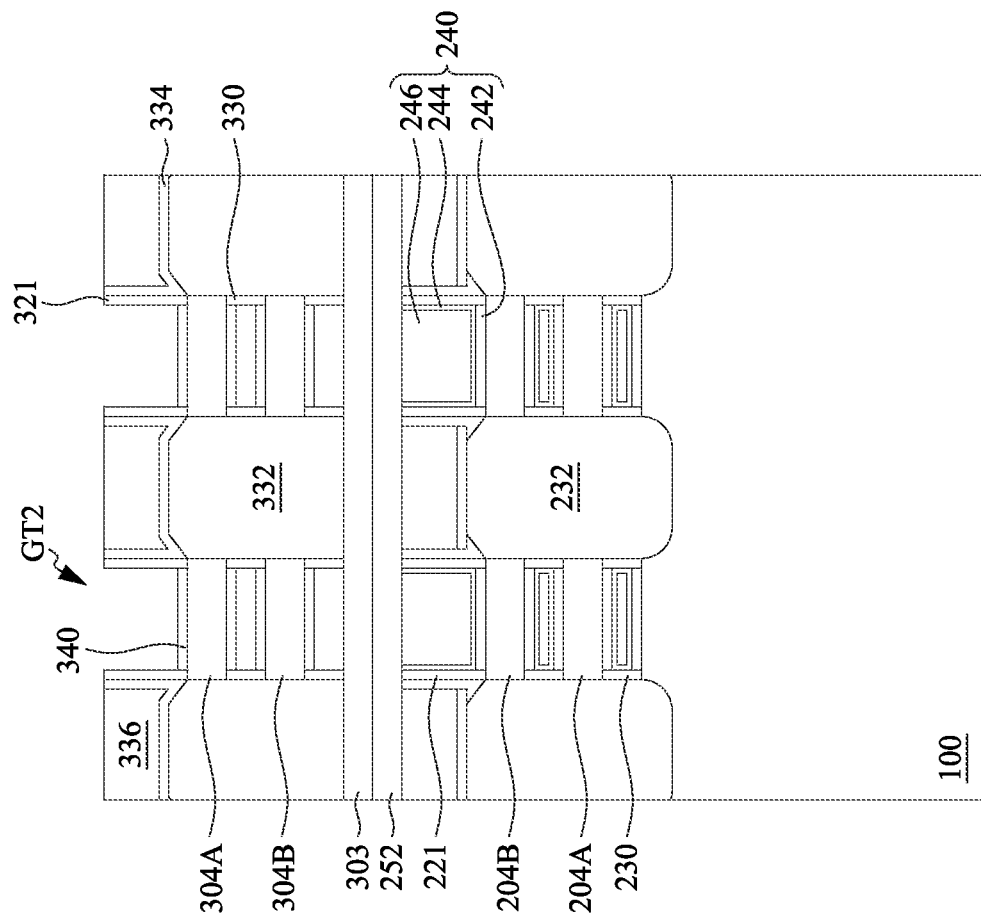
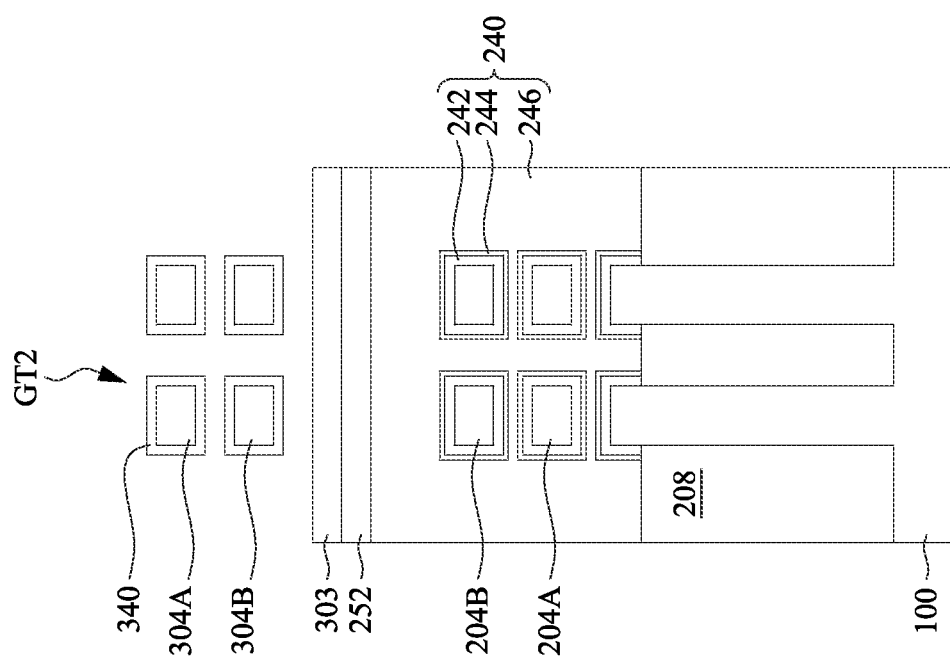
Fig. 34B
Fig. 34A

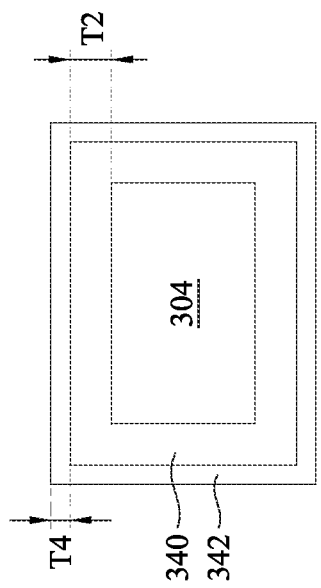
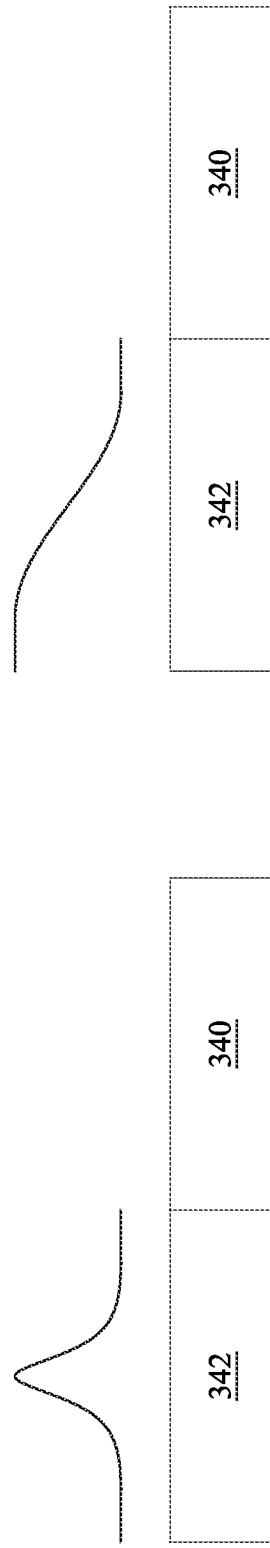

SEMICONDUCTOR DEVICE WITH GERMANIUM-BASED CHANNEL

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 5, 6A, 13A, 14A, 15A, 16A, 17A, 18A, 19A, 21A, 22A, 23A, 24A, 30A, 31A, 32A, 33A, 34A, 35A, 36A and 37A illustrate reference cross-section A-A illustrated in FIG. 1 that extends through a gate region along a longitudinal axis of the gate region, in accordance with some embodiments of the present disclosure.

FIGS. 6B, 7B, 8B, 9B, 10B, 11B, 11C, 12B, 12D, 13B, 14B, 15B, 16B, 17B, 18B, 19B, 20, 21B, 22B, 23B, 24B, 25, 26B, 27B, 28B, 28C, 29B, 30B, 31B, 32B, 33B, 34B, 35B, 36B, and 37B illustrate reference cross-section C-C illustrated in FIG. 1 that extends in a direction of current flow between source/drain regions, in accordance with some embodiments of the present disclosure.

FIGS. 7A, 8A, 9A, 10A, 11A, 12A, 12C, 13C, 26A, 27A, 28A, 29A, 29C, 30C illustrate reference cross-section B-B illustrated in FIG. 1 that extends through source/drain regions along the longitudinal direction of the gate region, in accordance with some embodiments of the present disclosure.

FIGS. 34C, 35C, and 36C are zoomed-in views of a partial region of a top device illustrated in the respective cross-sectional views of FIGS. 32A, 33A, 34A, and 35A, in accordance with some embodiments of the present disclosure.

FIGS. 36D and 36E illustrate various example nitrogen concentration profiles along a thickness direction of a dual-layer interfacial structure, in accordance with some embodiments, in accordance with some embodiments of the present disclosure.

DETAILED DESCRIPTION

Figure 1:
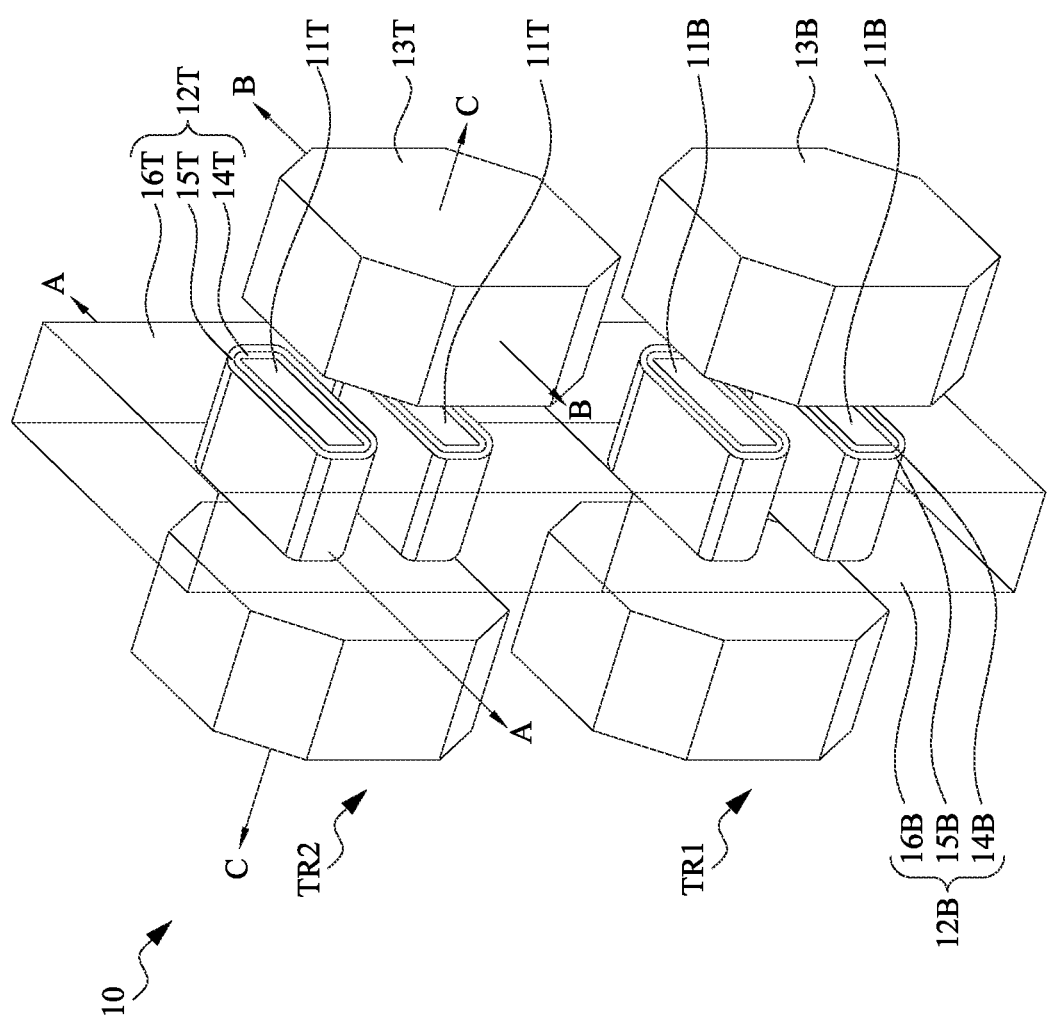
FIG. 1 is a perspective view of an example CFET structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 230 degrees or at other orientations) and the spatially relative descriptors used herein may likewise be interpreted accordingly. As used herein, "around," "about," "approximately," or "substantially" may generally mean within 20 percent, or within 10 percent, or within 5 percent of a given value or range. Numerical quantities given herein are approximate, meaning that the term "around," "about," "approximately," or "substantially" can be inferred if not expressly stated. One skilled in the art will realize, however, that the values or ranges recited throughout the description are merely examples, and may be reduced with the downscaling of the integrated circuits.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is generally related to integrated circuit (IC) structures and methods of forming the same, and more particularly to fabricating gate-all-around (GAA) transistors. It is also noted that the present disclosure presents embodiments in the form of multi-gate transistors. Multi-gate transistors include those transistors whose gate structures are formed on at least two-sides of a channel region. These multi-gate devices may include a p-type metal-oxide-semiconductor device or an n-type metal-oxide-semiconductor device. Specific examples may be presented and referred to herein as FinFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), and/or other suitable channel configuration. Presented herein are embodiments of devices that may have one or more channel regions (e.g., nanosheets) associated with a single, contiguous gate structure. However, one of ordinary skill would recognize that the teaching can apply to a single channel (e.g., single nanosheet) or any number of channels. One of ordinary skill may recognize other examples of semiconductor devices (e.g., planar transistors) that may benefit from aspects of the present disclosure.

As scales of the fin width in fin field effect transistors (FinFET) decreases, channel width variations might cause mobility loss. GAA transistors, such as nanosheet transistors are being studied as an alternative to fin field effect transistors. In a GAA transistor, the gate of the transistor is made all around the channel (e.g., a nanosheet channel or a nanowire channel) such that the channel is surrounded or encapsulated by the gate. Such a transistor has the advantage of improving the electrostatic control of the channel by the gate, which also mitigates leakage currents. Stacked transistor structures, such as complementary field effect transistors (CFETs) including vertically stacked p-type FETs and n-type FETs, can provide further reduced footprint and density improvement for advanced IC technology nodes (particularly as IC technology nodes advance to 3 nm (N3) and below).

FIG. 1 is a perspective view of an example CFET structure in accordance with some embodiments of the present disclosure. In some embodiments of the present disclosure, a CFET structure 10 includes a first transistor TR1 and a second transistor TR2 vertically stacked over the first transistor TR1, and thus the second transistor TR2 can be interchangeably referred to as a top transistor and the first transistor TR1 can be interchangeably referred to as a bottom transistor. In some embodiments, the first transistor TR1 and the second transistor TR2 are GAA FET transistors. The first transistor TR1 includes first semiconductor channel layers 11B disposed one above another, a first gate structure 12B wrapping around each of the first semiconductor channel layers 11B, and first source/drain epitaxy structures 13B on opposite sides of each of the first semiconductor channel layers 11B. The second transistor TR2 includes second semiconductor channel layers 11T vertically stacked one above another, a second metal gate structure 12T wrapping around each of the second semiconductor channel layers 11T, and second source/drain epitaxy structures 13T on opposite sides of each of the second semiconductor channel layers 11T. The first gate structure 12B may include an interfacial layer 14B, a high-k gate dielectric layer 15B around the interfacial layer, and one or more gate metal layers 16B around the high-k gate dielectric layer 15B. The second gate structure 12T may include an interfacial layer 14T, a gate dielectric layer 15T, and a one or more gate metal layers 16T. In some embodiments, the second gate structure 12T can be electrically isolated from first gate structure 12B by dielectric bonding materials (not shown), as will be described in greater detail below. In some embodiments, the first transistor TR1 has a first conductivity type (e.g., n-type) and the second transistor TR2 has a second conductivity type (e.g., p-type) different from the first conductivity type.

FIG. 1 further illustrates reference cross-sections that are used in later figures. Cross-section A-A is along a longitudinal axis of gate structures 12B, 12T and in a direction, for example, perpendicular to the direction of current flow between the epitaxial source/drain structures 13B of the bottom transistor TR1 and the direction of current flow between the epitaxial source/drain structures 13T of the top transistor TR2. Cross-section B-B is parallel to cross-section A-A and extends through epitaxial source/drain structures 13B of the bottom transistor TR1 and epitaxial source/drain structures 13T of the top transistor TR2. Cross-section C-C is perpendicular to cross-sections A-A and B-B and is parallel to the direction of current flow between the epitaxial source/drain structures 13B of the bottom transistor TR1 and the direction of current flow between the epitaxial source/drain structures 13T of the top transistor TR2. Subsequent figures refer to these reference cross-sections for clarity.

Germanium-based (Ge-based) channels can be used due to their advantageous electrical properties, such as higher carrier mobility than Si. Moreover, the Ge-based channels, in combination with a high-k/metal gate (HKMG) structure, are beneficial for effective oxide thickness (EOT) scaling, because it allows for enhanced electrostatic control over the channel, increased carrier mobility, reduced gate leakage current, improved device reliability, and so on. However, a major challenge associated with Ge-based channels is the formation of a high-quality interfacial layer. For example, Ge-based channels may use germanium oxide ($GeO_2$) as interfacial layers to provide a low interface trap density. However, during or after depositing a high-k dielectric material over the $GeO_2$ layer, the $GeO_2$ layer may intermix with the high-k dielectric material, leading to a degradation in the quality of interfacial layer, which may results in degraded on-current (Ion) and/or increased leakage current. To address this issue, an alternative approach involves replacing $GeO_2$ with germanium oxynitride ($Ge(O)N_x$), which can reduce intermixing. However, this substitution results in a high interface trap density on the Ge-based channels, compromising device performance.

The present disclosure, in various embodiments, provides a solution to the aforementioned challenges by forming a dual-layer interfacial structure for Ge-based channels. The dual-layer interfacial structure comprises a $GeO_2$ layer formed directly over the Ge-based channels and a $Ge(O)N_x$ layer formed over the $GeO_2$ layer. The $GeO_2$ layer serves to provide low interface trap density, while the $Ge(O)N_x$ layer acts as an intermixing barrier to prevent intermixing between the high-k dielectric material and the $GeO_2$. Therefore, the dual-layer interfacial structure offers a synergistic solution for achieving both low interface trap density and reduced intermixing in the high-k/metal gate structure. Moreover, EOT scaling can be achieved by GeO desorption treatment performed on the dual-layer interfacial structure, which in turn reduces the thickness of the gate dielectric layer, leading to improved electrostatic control over the channel, increased device performance, lower power consumption, enhanced device reliability, and so on. In some embodiments, the GeO desorption is a thermal treatment performed at a temperature lower than about 500° C., making it suitable for EOT scaling engineering in fabricating the top device of a CFET. This is because high temperatures may degrade the electrical performance and/or reliability of the bottom transistor of the CFET.

Some embodiments discussed herein are discussed in the context of GAA-FETs formed using a gate-last process. In other embodiments, a gate-first process may be used. Also, some embodiments contemplate aspects used in planar devices, such as planar FETs or in fin field-effect transistors (FinFETs).

FIGS. 2 through 37C are example cross-sectional views of intermediate stages in the manufacturing of GAA-FETs, in accordance with some embodiments. FIGS. 2 through 5, 6A, 13A, 14A, 15A, 16A, 17A, 18A, 19A, 21A, 22A, 23A, 24A, 30A, 31A, 32A, 33A, 34A, 35A, 36A and 37A illustrate reference cross-section A-A illustrated in FIG. 1 that extends through a gate region along a longitudinal axis of the gate region. FIGS. 6B, 7B, 8B, 9B, 10B, 11B, 11C, 12B, 12D, 13B, 14B, 15B, 16B, 17B, 18B, 19B, 20, 21B, 22B, 23B, 24B, 25, 26B, 27B, 28B, 28C, 29B, 30B, 31B, 32B, 33B, 34B, 35B, 36B, and 37B illustrate reference cross-section C-C illustrated in FIG. 1 that extends in a direction of current flow between source/drain regions. FIGS. 7A, 8A, 9A, 10A, 11A, 12A, 12C, 13C, 26A, 27A, 28A, 29A, 29C, 30C illustrate reference cross-section B-B illustrated in FIG. 1 that extends through source/drain regions along the longitudinal direction of the gate region. FIGS. 34C, 35C, and 36C are zoomed-in views of a partial region of a top device illustrated in the respective cross-sectional views of FIGS. 32A, 33A, 34A, and 35A. FIG. 37C illustrates a combined zoom-in view of the top device and the bottom device illustrated in FIG. 37A. FIGS. 36D and 36E illustrate various example nitrogen concentration profiles along a thickness direction of a dual-layer interfacial structure, in accordance with some embodiments.

Figure 2:
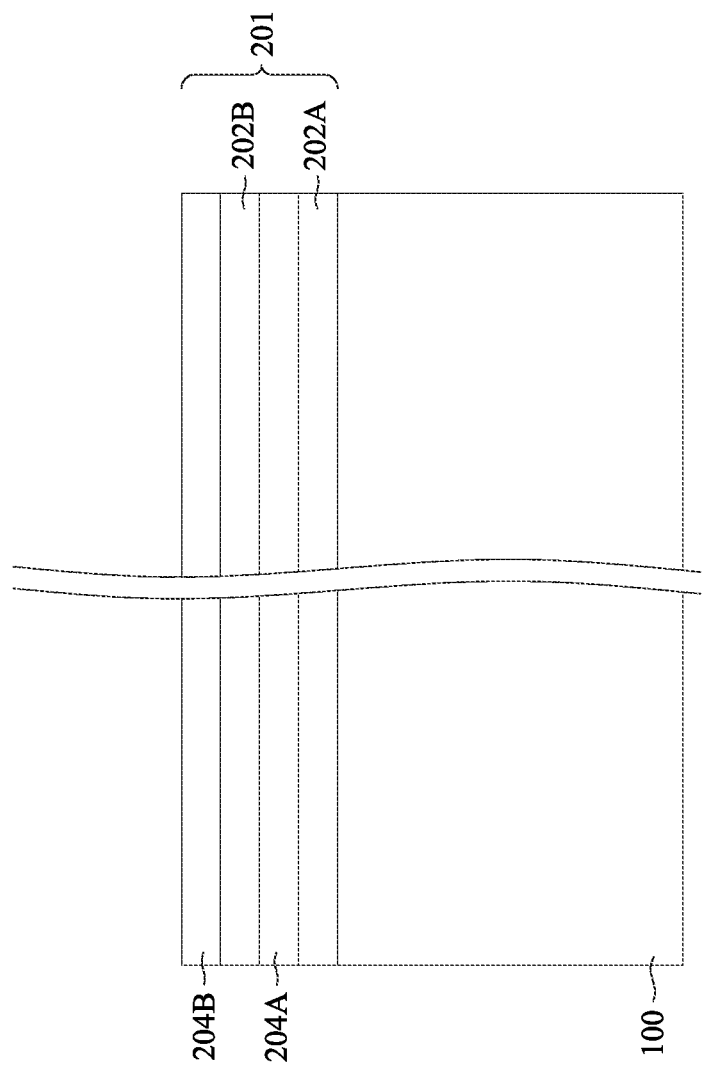

In FIG. 2, a substrate 100 is provided. The substrate 100 may be a semiconductor substrate, such as a bulk semiconductor, a semiconductor-on-insulator (SOI) substrate, or the like, which may be doped (e.g., with a p-type or an n-type dopant) or undoped. The substrate 100 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, such as a silicon or glass substrate. Other substrates, such as a multi-layered or gradient substrate may also be used. In some embodiments, the semiconductor material of the substrate 100 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

Further in FIG. 2, a first multi-layer stack 201 is formed over the substrate 100. The multi-layer stack 201 includes alternating layers of first semiconductor layers 202A-B (collectively referred to as first semiconductor layers 202) and second semiconductor layers 204A-B (collectively referred to as second semiconductor layers 204). For purposes of illustration and as discussed in greater detail below, the first semiconductor layers 202 will be removed and the second semiconductor layers 204 will be patterned to form channel regions of bottom GAA-FETs.

The first multi-layer stack 201 is illustrated as including two layers of each of the first semiconductor layers 202 and the second semiconductor layers 204 for illustrative purposes. In some embodiments, the multi-layer stack 201 may include any number of the first semiconductor layers 202 and the second semiconductor layers 204. Each of the layers of the multi-layer stack 201 may be epitaxially grown using a process such as chemical vapor deposition (CVD), atomic layer deposition (ALD), vapor phase epitaxy (VPE), molecular beam epitaxy (MBE), or the like. In various embodiments, the second semiconductor layers 204 may be formed of a semiconductor material suitable for serving as channel regions of bottom GAA-FETs, such as silicon, silicon carbon, silicon germanium, or the like. In some embodiments, the second semiconductor layers 204 may be formed of a Group IV-based material or a Group III-V-based material.

The first semiconductor materials and the second semiconductor materials may be materials having a high-etch selectivity to one another. As such, the first semiconductor layers 202 of the first semiconductor material may be removed without significantly removing the second semiconductor layers 204 of the second semiconductor material, thereby allowing the second semiconductor layers 204 to serve as channel regions of bottom GAA-FETs. In some embodiments, the first semiconductor layers 202 are silicon germanium and the second semiconductor layers 204 are pure silicon (Si) having an etch selectivity to silicon germanium. In some embodiments, the first semiconductor layers 202 are silicon germanium and the second semiconductor layers 204 are pure germanium (Ge) having an etch selectivity to silicon germanium. In some embodiments, the first semiconductor layers 202 are germanium tin ($GeSn_x$, x ranging from about 0.05 to about 0.95) and the second semiconductor layers 204 are pure germanium (Ge) having an etch selectivity to germanium tin.

Figure 3:
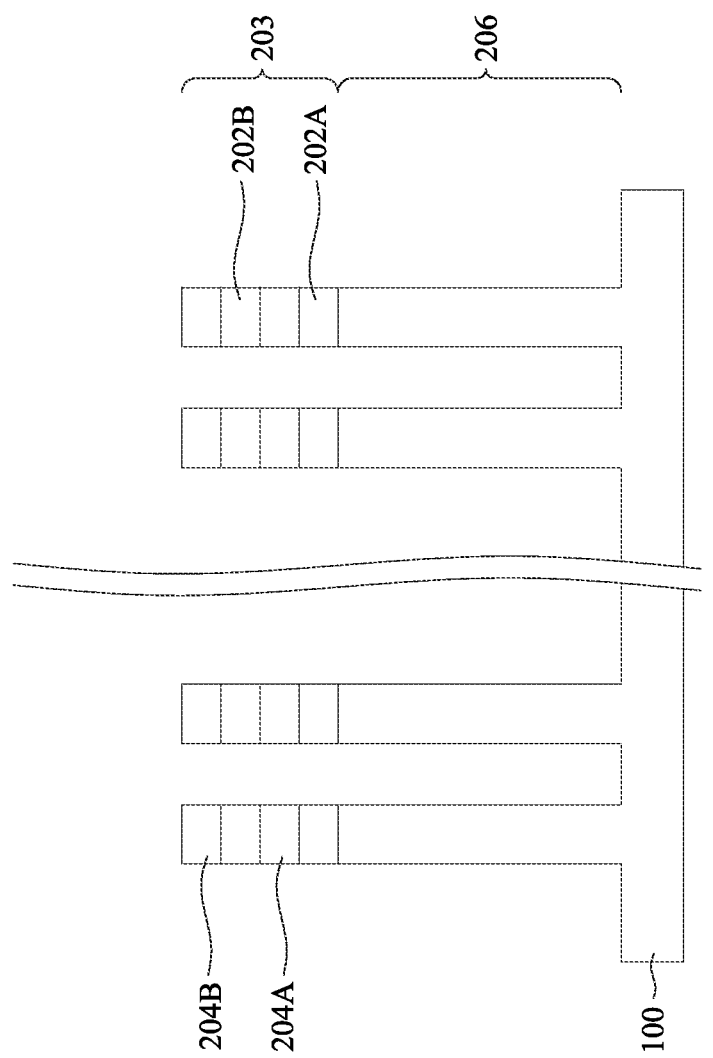

Referring now to FIG. 3, fin structures 206 are formed in the substrate 100 and nanostructures 203 are formed in the multi-layer stack 201, in accordance with some embodiments. In some embodiments, the nanostructures 203 and the fin structures 206 may be formed in the multi-layer stack 201 and the substrate 100, respectively, by etching trenches in the multi-layer stack 201 and the substrate 100. Each fin structure 206 and overlying nanostructures 203 can be collectively referred to as a semiconductor fin extending from the substrate 100. The etching may be any acceptable etch process, such as a reactive ion etch (RIE), neutral beam etch (NBE), the like, or a combination thereof. The etching may be anisotropic. Forming the nanostructures 203 by etching the multi-layer stack 201 may further define first nanostructures 202A-B (collectively referred to as the first nanostructures 202) from the first semiconductor layers 202 and define second nanostructures 204A-B (collectively referred to as the second nanostructures 204) from the second semiconductor layers 204. The first nanostructures 202 and the second nanostructures 204 may further be collectively referred to as nanostructures 203.

The fin structures 206 and the nanostructures 203 may be patterned by any suitable method. For example, the fin structures 206 and the nanostructures 203 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures 206. While each of the fin structures 206 and the nanostructures 203 are illustrated as having a consistent width throughout, in other embodiments, the fin structures 206 and/or the nanostructures 203 may have tapered sidewalls such that a width of each of the fin structures 206 and/or the nanostructures 203 continuously increases in a direction towards the substrate 100. In such embodiments, each of the nanostructures 203 may have a different width and be trapezoidal in shape.

Figure 4:
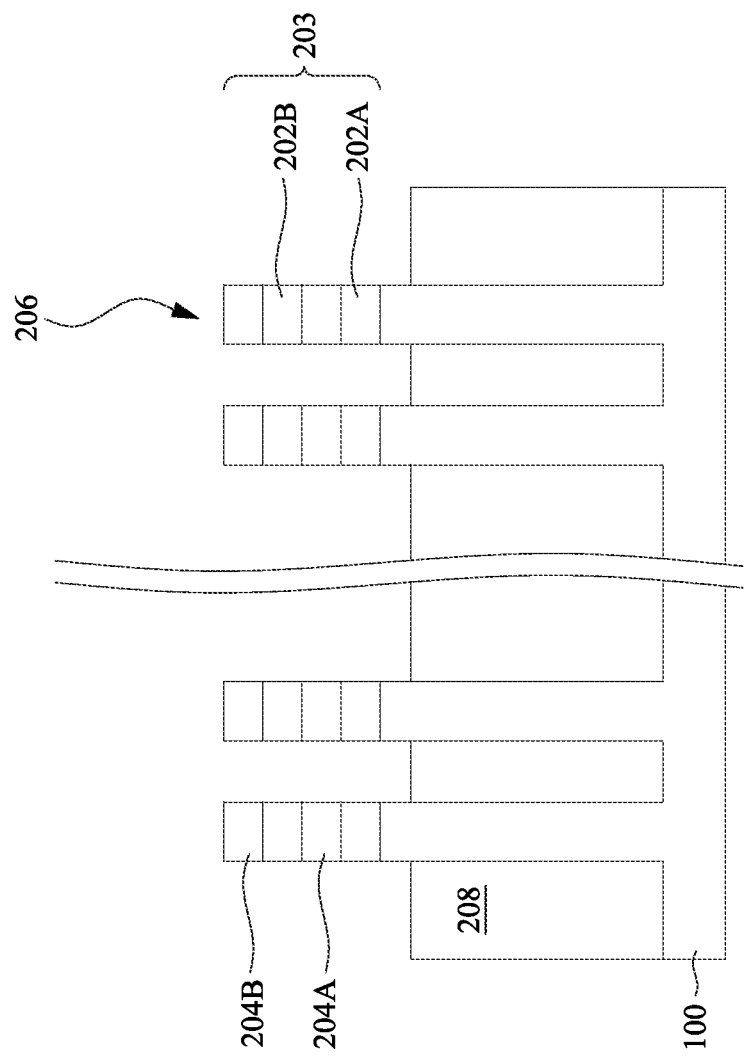

In FIG. 4, shallow trench isolation (STI) regions 208 are formed adjacent the fin structures 206. The STI regions 208 may be formed by depositing an insulation material over the substrate 100, the fin structures 206, and nanostructures 203, and between adjacent fin structures 206. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 203. Although the insulation material is illustrated as a single layer, some embodiments may utilize multiple layers. For example, in some embodiments a liner (not separately illustrated) may first be formed along a surface of the substrate 100, the fin structures 206, and the nanostructures 203. Thereafter, a fill material, such as those discussed above may be formed over the liner.

A removal process is then applied to the insulation material to remove excess insulation material over the nanostructures 203. In some embodiments, a planarization process such as a chemical mechanical polish (CMP), an etch-back process, combinations thereof, or the like may be utilized. The planarization process exposes the nanostructures 203 such that top surfaces of the nanostructures 203 and the insulation material are level after the planarization process is complete.

The insulation material is then recessed to form the STI regions 208. The insulation material is recessed such that upper portions of fin structures 206 protrude from between neighboring STI regions 208. Further, the top surfaces of the STI regions 208 may have a flat surface as illustrated, a convex surface, a concave surface (such as dishing), or a combination thereof. The top surfaces of the STI regions 208 may be formed flat, convex, and/or concave by an appropriate etch. The STI regions 208 may be recessed using an acceptable etching process, such as one that is selective to the material of the insulation material (e.g., etches the material of the insulation material at a faster rate than the material of the fin structures 206 and the nanostructures 203). For example, an oxide removal using, for example, dilute hydrofluoric (dHF) acid may be used.

The process described above with respect to FIGS. 2 through 4 is just one example of how the fin structures 206 and the nanostructures 203 may be formed. In some embodiments, the fin structures 206 and/or the nanostructures 203 may be formed using a mask and an epitaxial growth process. For example, a dielectric layer can be formed over a top surface of the substrate 100, and trenches can be etched through the dielectric layer to expose the underlying substrate 100. Epitaxial structures can be epitaxially grown in the trenches, and the dielectric layer can be recessed such that the epitaxial structures protrude from the dielectric layer to form the fin structures 206 and/or the nanostructures 203. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Further in FIG. 4, appropriate wells (not separately illustrated) may be formed in the fin structures 206 and/or the nanostructures 203. In some embodiments with different well types in different device regions (e.g., NFET region and PFET region), different implant steps may be achieved using a photoresist or other masks (not separately illustrated). For example, a photoresist may be formed over the fin structures 206 and the STI regions 208 in the NFET region and the PFET region. The photoresist is patterned to expose the PFET region. The photoresist can be formed by using a spin-on technique and can be patterned using acceptable photolithography techniques. Once the photoresist is patterned, a first impurity (e.g., n-type impurity such as phosphorus, arsenic, antimony, or the like) implant is performed in the PFET region, and the photoresist may act as a mask to substantially prevent the first impurities from being implanted into the NFET region. After the implant, the photoresist is removed, such as by an acceptable ashing process.

Following or prior to the implanting of the PFET region, a photoresist or other masks (not separately illustrated) is formed over the fin structures 206, the nanostructures 203, and the STI regions 208 in the NFET region and the PFET region. The photoresist is then patterned to expose the NFET region. The photoresist can be formed by using a spin-on technique and can be patterned using acceptable photolithography techniques. Once the photoresist is patterned, a second impurity (e.g., p-type impurity such as boron, boron fluoride, indium, or the like) implant may be performed in the NFET region, and the photoresist may act as a mask to substantially prevent p-type impurities from being implanted into the PFET region. After the implant, the photoresist may be removed, such as by an acceptable ashing process.

After one or more well implants of the NFET region and PFET region, an anneal process may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
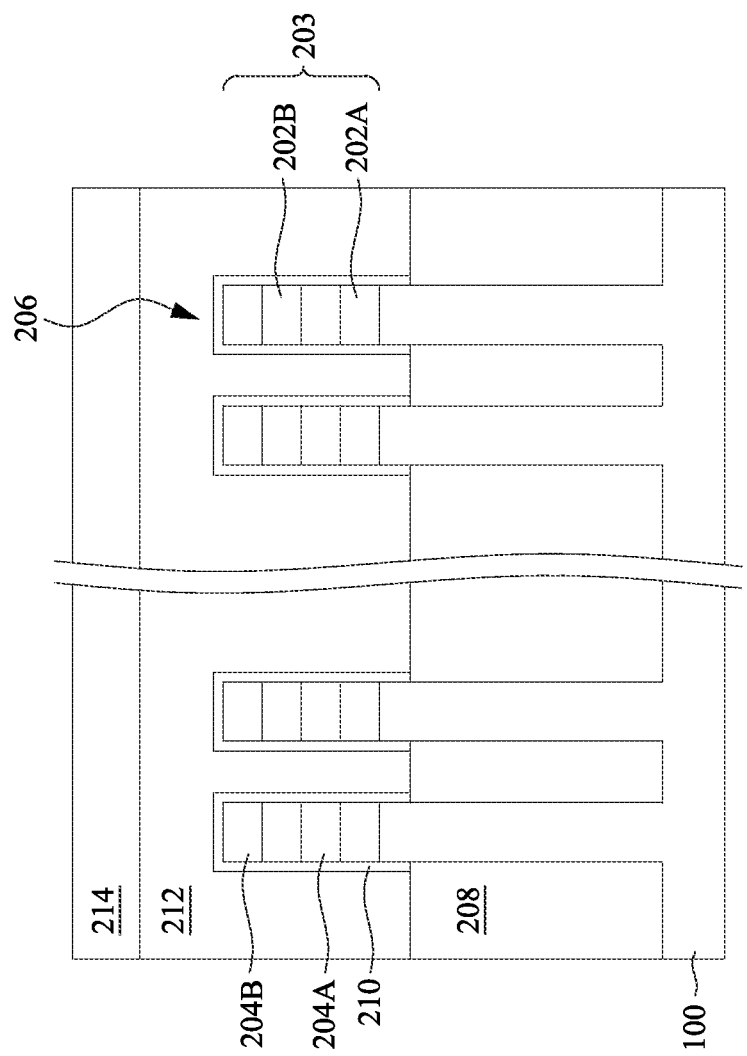

In FIG. 5, a dummy dielectric layer 210 is formed on the fin structures 206 and/or the nanostructures 203. The dummy dielectric layer 210 may be, for example, silicon oxide, silicon nitride, a combination thereof, or the like, and may be deposited or thermally grown according to acceptable techniques. A dummy gate layer 212 is formed over the dummy dielectric layer 210, and a mask layer 214 is formed over the dummy gate layer 212. The dummy gate layer 212 may be deposited over the dummy dielectric layer 210 and then planarized, such as by a CMP. The mask layer 214 may be deposited over the dummy gate layer 212. The dummy gate layer 212 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 212 may be deposited by physical vapor deposition (PVD), CVD, sputter deposition, or other techniques for depositing the selected material. The dummy gate layer 212 may be made of other materials that have a high etching selectivity from the etching of isolation regions. The mask layer 214 may include, for example, silicon nitride, silicon oxynitride, or the like. It is noted that the dummy dielectric layer 210 is shown covering only the fin structures 206 and the nanostructures 203 for illustrative purposes only. In some embodiments, the dummy dielectric layer 210 may be deposited such that the dummy dielectric layer 210 covers the STI regions 208, such that the dummy dielectric layer 210 extends between the dummy gate layer 212 and the STI regions 208.

Figure 6B:
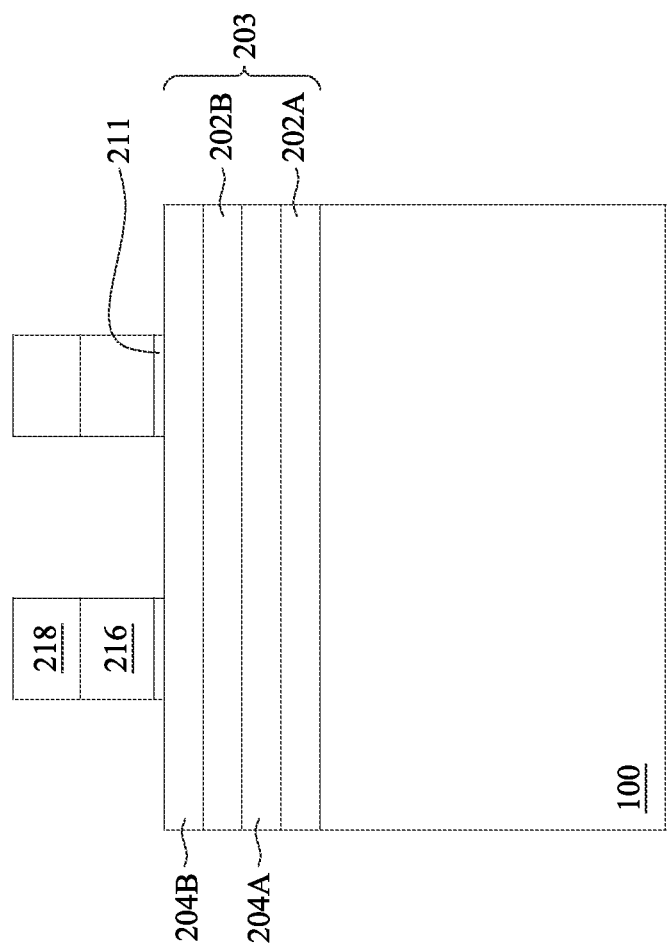

In FIGS. 6A and 6B, the mask layer 214 (see FIG. 5) may be patterned using acceptable photolithography and etching techniques to form masks 218. The pattern of the masks 218 can then be transferred to the dummy gate layer 212 and to the dummy dielectric layer 210, resulting in the formation of dummy gates 216 and dummy gate dielectrics 211, respectively. The dummy gates 216 cover respective channel regions of the fin structures 206. The pattern of the masks 218 may be employed to physically separate each of the dummy gates 216 from adjacent dummy gates 216. The dummy gates 216 may also have a lengthwise direction substantially perpendicular to the lengthwise direction of respective fin structures 206.

Figure 7B:
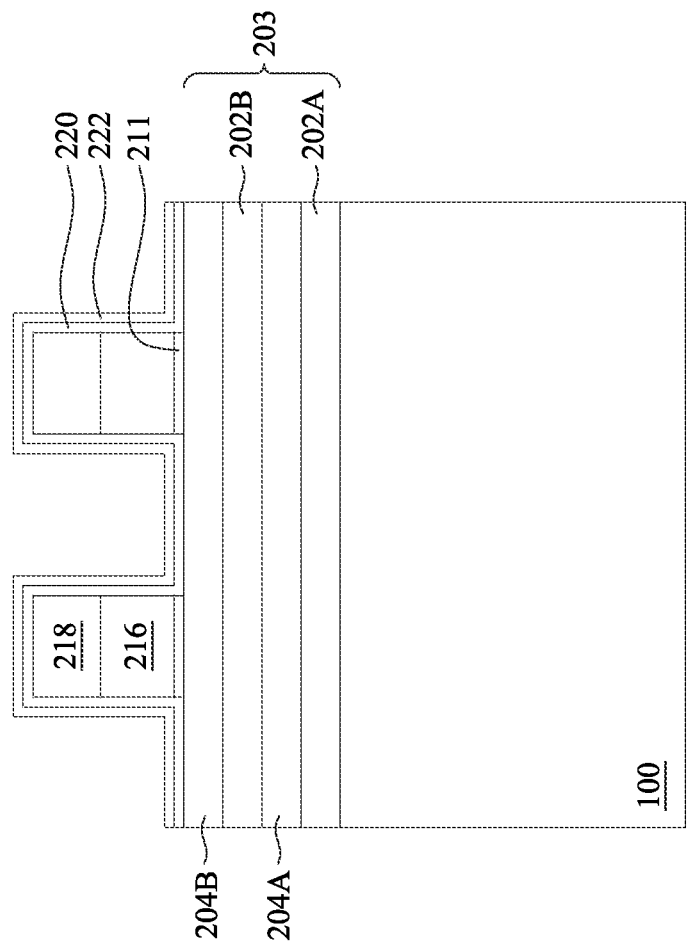
Figure 7A:
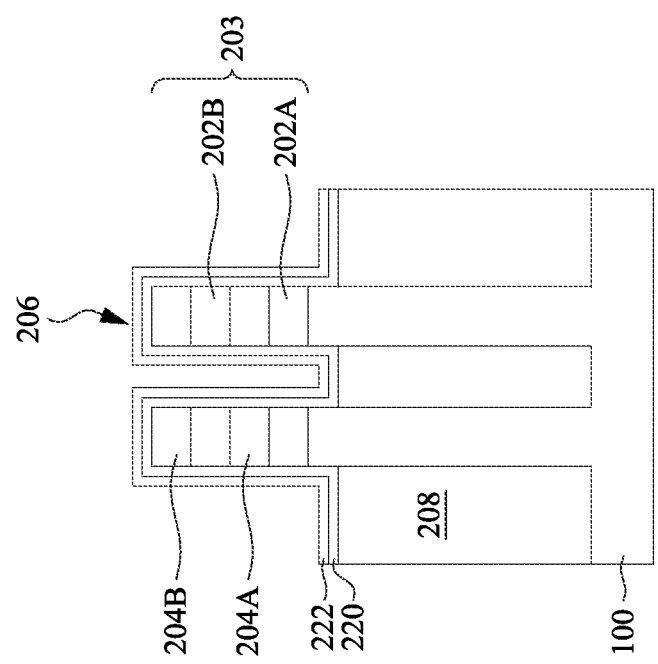

In FIGS. 7A and 7B, a first spacer layer 220 and a second spacer layer 222 are formed over the structures illustrated in FIGS. 6A and 6B, respectively. The first spacer layer 220 and the second spacer layer 222 will be subsequently patterned to act as spacers for forming self-aligned source/drain regions. In FIGS. 7A and 7B, the first spacer layer 220 is formed on top surfaces of the STI regions 208; top surfaces and sidewalls of the fin structures 206, the nanostructures 203, and the masks 218; and sidewalls of the dummy gates 216 and the dummy gate dielectric 211. The second spacer layer 222 is deposited over the first spacer layer 220. The first spacer layer 220 may be formed of silicon oxide, silicon nitride, silicon oxynitride, or the like, using techniques such as thermal oxidation or deposited by CVD, ALD, or the like. The second spacer layer 222 may be formed of a material having a different etch rate than the material of the first spacer layer 220, such as silicon oxide, silicon nitride, silicon oxynitride, or the like, and may be deposited by CVD, ALD, or the like.

Figure 8B:
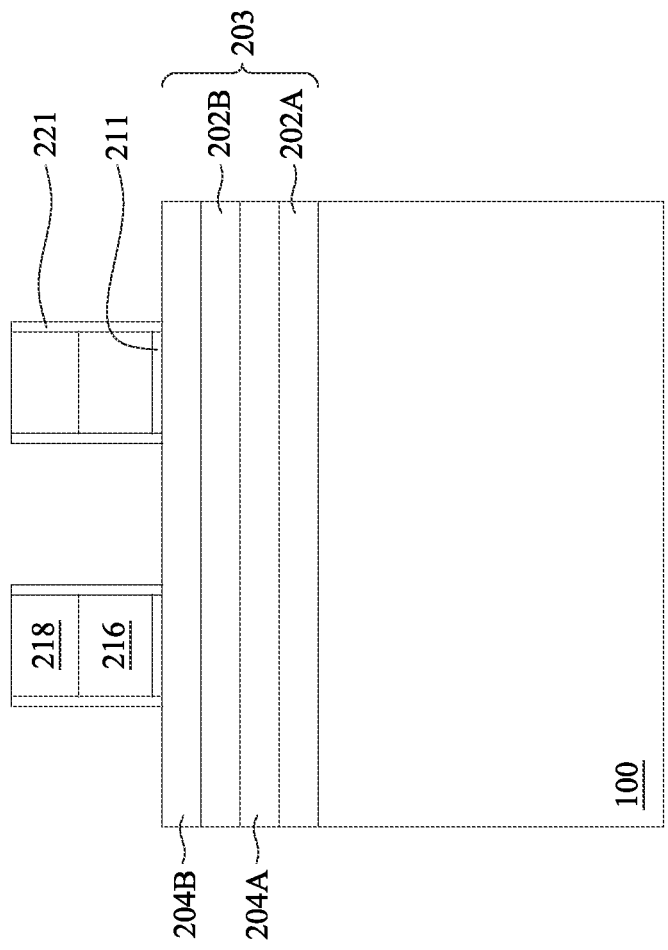
Figure 8A:
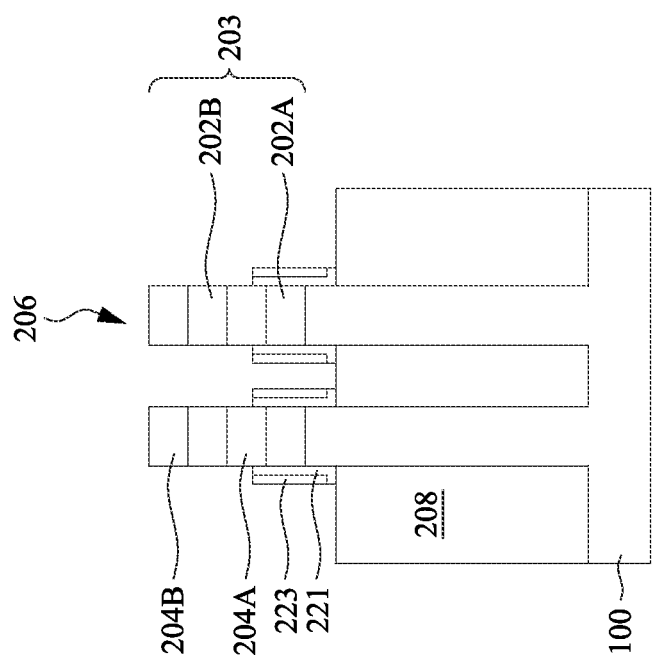

In FIGS. 8A and 8B, the first spacer layer 220 and the second spacer layer 222 are etched to form first spacers 221 and second spacers 223. As will be discussed in greater detail below, the first spacers 221 and the second spacers 223 act to self-align subsequently formed source and drain regions (collectively referred to as source/drain regions), as well as to protect sidewalls of the fin structures 206 and/or nanostructure 203 during subsequent processing. The first spacer layer 220 and the second spacer layer 222 may be etched using a suitable etching process, such as an isotropic etching process (e.g., a wet etching process), an anisotropic etching process (e.g., a dry etching process), or the like. In some embodiments, the material of the second spacer layer 222 has a different etch rate than the material of the first spacer layer 220, such that the first spacer layer 220 may act as an etch stop layer when patterning the second spacer layer 222 and such that the second spacer layer 222 may act as a mask when patterning the first spacer layer 220. For example, the second spacer layer 222 may be etched using an anisotropic etch process wherein the first spacer layer 220 acts as an etch stop layer, wherein remaining portions of the second spacer layer 222 form second spacers 223 as illustrated in FIG. 8A. Thereafter, the second spacers 223 acts as a mask while etching exposed portions of the first spacer layer 220, thereby forming first spacers 221 as illustrated in FIG. 8A.

As illustrated in FIG. 8A, the first spacers 221 and the second spacers 223 are disposed on sidewalls of the fin structures 206 and/or nanostructures 203. In some embodiments, the spacers 221 and 223 only partially remain on sidewalls of the fin structures 206. In some embodiments, no spacer remains on sidewalls of the fin structures 206. As illustrated in FIG. 8B, in some embodiments, the second spacer layer 222 may be removed from over the first spacer layer 220 adjacent the masks 218, the dummy gates 216, and the dummy gate dielectrics 211, and the first spacers 221 are disposed on sidewalls of the masks 218, the dummy gates 216, and the dummy dielectric layers 211. In other embodiments, a portion of the second spacer layer 222 may remain over the first spacer layer 220 adjacent the masks 218, the dummy gates 216, and the dummy gate dielectrics 211.

In some embodiments, the first spacers 221 on gate sidewalls (also called gate spacers) have a small thickness (e.g., in a range from about 1 nm to about 10 nm) so as to reduce gate-to-gate pitch without significant reduction in source/drain region size. In some embodiments, the first spacers 221 on gate sidewalls is formed of as low-dielectric constant (low-k) materials (e.g., porous silicon oxide) having a k-value, for example, less than about 3.5. The low-k material can aid in reducing parasitic capacitance between, for example, the subsequently formed metal gates and source/drain contacts.

The above disclosure generally describes a process of forming spacers. Other processes and sequences may be used. For example, fewer or additional spacers may be utilized, different sequence of steps may be utilized (e.g., the first spacers 221 may be patterned prior to depositing the second spacer layer 222), additional spacers may be formed and removed, and/or the like.

Figure 9B:
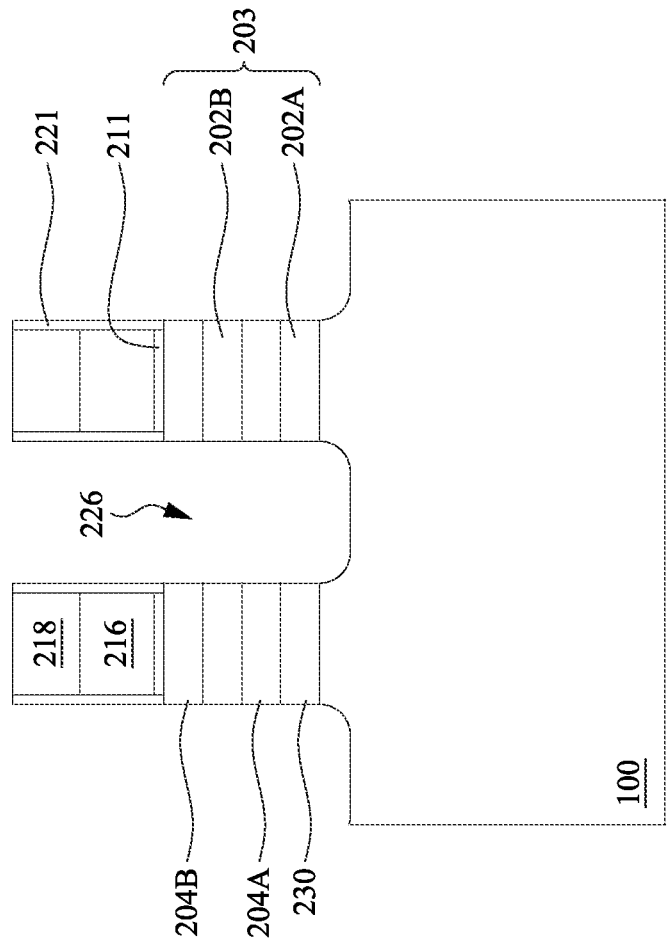
Figure 9A:
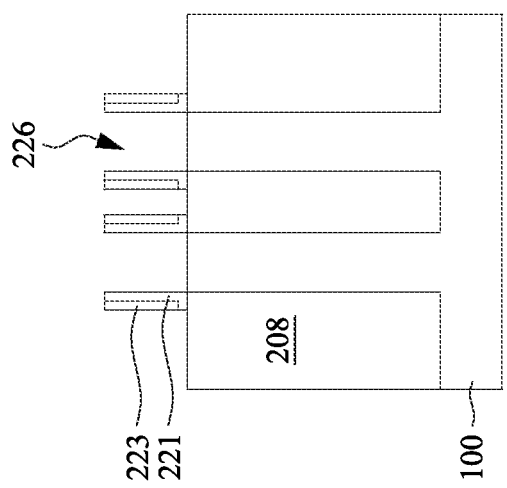

In FIGS. 9A and 9B, source/drain recesses 226 are formed in the fin structures 206, the nanostructures 203, and the substrate 100, in accordance with some embodiments. Epitaxial source/drain regions will be subsequently formed in the source/drain recesses 226. The source/drain recesses 226 may extend through the first nanostructures 202 and the second nanostructures 204, and into the substrate 100. As illustrated in FIG. 9A, bottom surfaces of the source/drain recesses 226 may be level with top surfaces of the STI regions 208, as an example. In some other embodiments, the fin structures 206 may be etched such that bottom surfaces of the source/drain recesses 226 are disposed below the top surfaces of the STI regions 208, or above the top surfaces of the STI regions 208. The source/drain recesses 226 may be formed by etching the fin structures 206, the nanostructures 203, and the substrate 100 using anisotropic etching processes, such as RIE, NBE, or the like. The first spacers 221, the second spacers 223, and the masks 218 mask portions of the fin structures 206, the nanostructures 203, and the substrate 100 during the etching processes used to form the source/drain recesses 226. A single etch process or multiple etch processes may be used to etch each layer of the nanostructures 203 and/or the fin structures 206. Timed etch processes may be used to stop the etching of the source/drain recesses 226 after the source/drain recesses 226 reach a target depth.

Figure 10B:
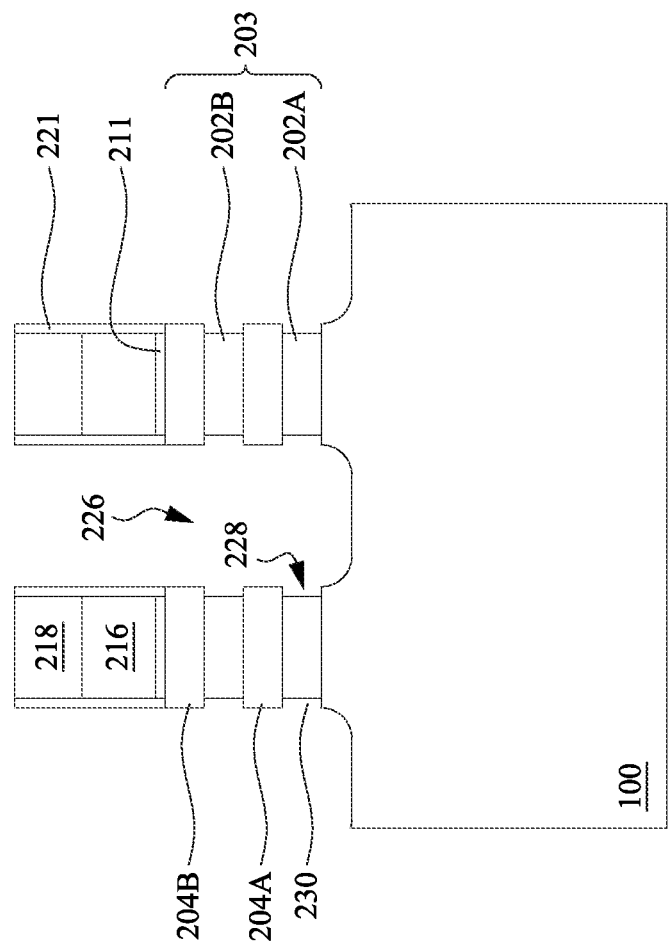
Figure 10A:
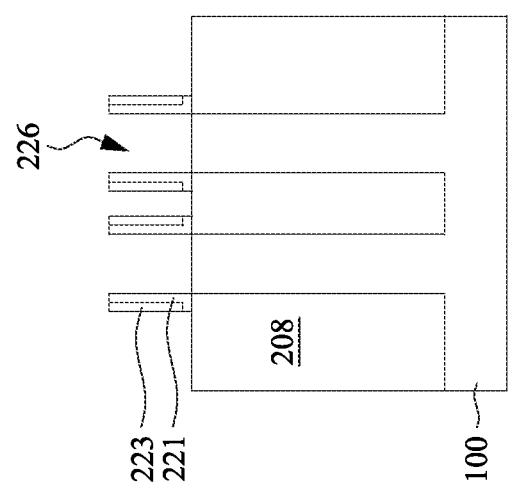

In FIGS. 10A and 10B, portions of sidewalls of the layers of the multi-layer stack 201 formed of the first semiconductor materials (e.g., the first nanostructures 202) exposed by the source/drain recesses 226 are etched to form sidewall recesses 228 between corresponding second nanostructures 204. Although sidewalls of the first nanostructures 202 in recesses 228 are illustrated as being straight in FIG. 10B, the sidewalls may be concave or convex. The sidewalls may be etched using isotropic etching processes, such as wet etching or the like. In some embodiments in which the first nanostructures 202 include, e.g., SiGe, and the second nanostructures 204 include, e.g., Si or SiC, a dry etch process with tetramethylammonium hydroxide (TMAH), ammonium hydroxide (NH$_4$OH), or the like may be used to etch sidewalls of the first nanostructures 202.

Figure 11B:
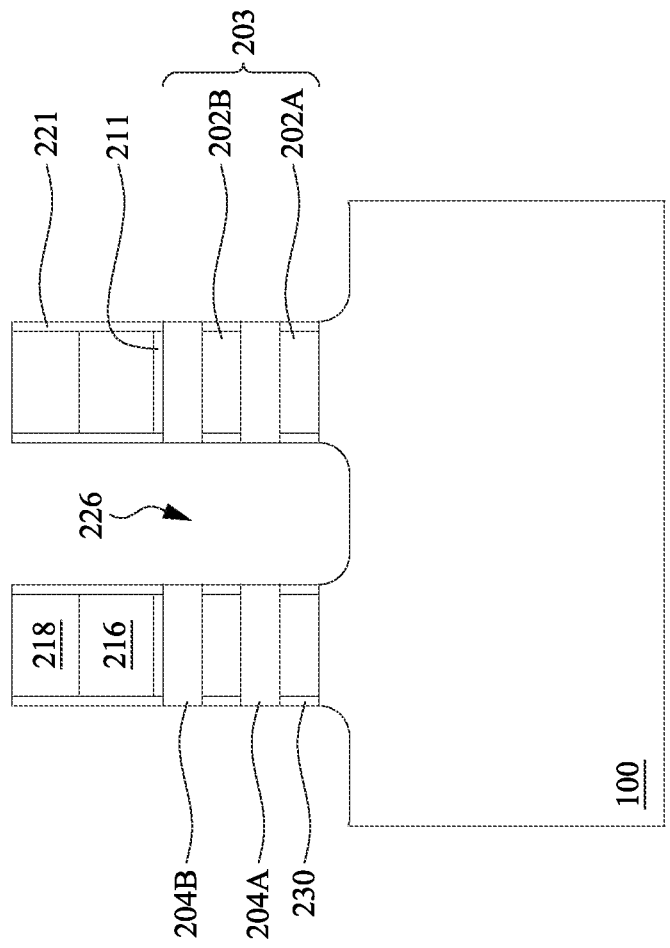
Figure 11A:
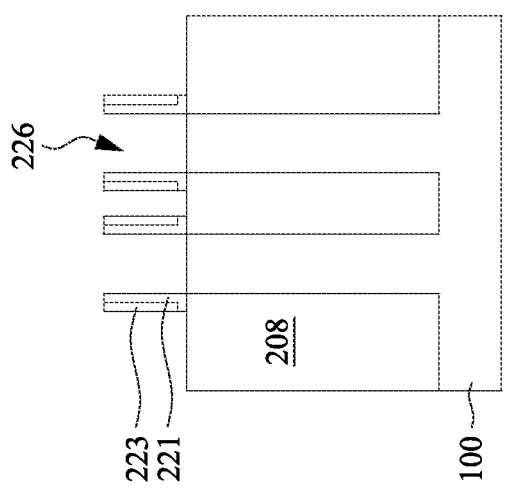
Figure 11C:
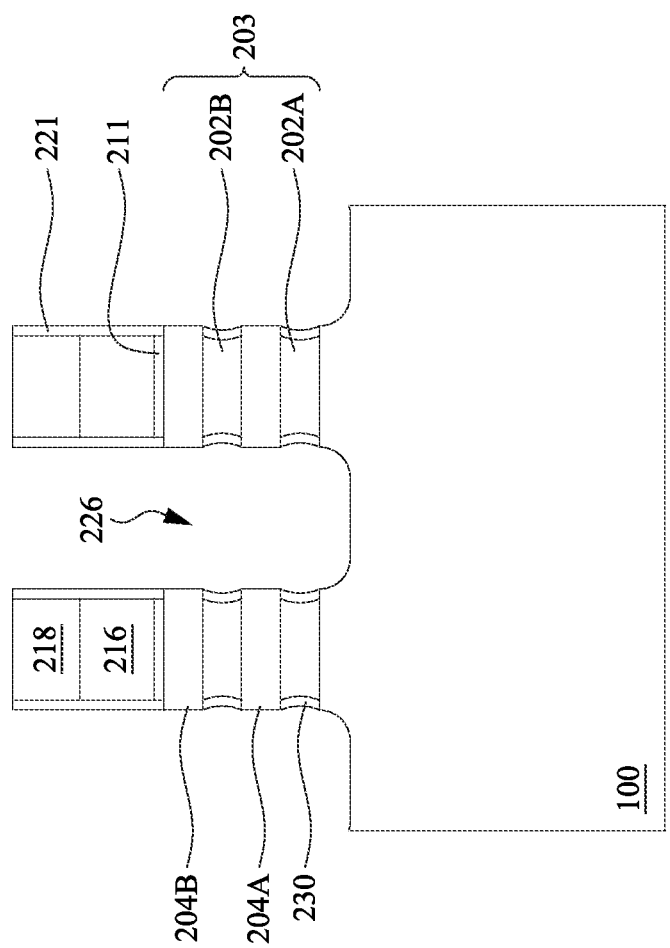

In FIGS. 11A-11C, inner spacers 230 are formed in the sidewall recess 228. The inner spacers 230 may be formed by depositing an inner spacer layer (not separately illustrated) over the structures illustrated in FIGS. 10A and 10B. The inner spacers 230 act as isolation features between subsequently formed source/drain regions and gate structure. As will be discussed in greater detail below, source/drain regions will be formed in the recesses 226, and the first nanostructures 202 will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the inner spacers 230. Although outer sidewalls of the inner spacers 230 are illustrated as being flush with sidewalls of the second nanostructures 204, the outer sidewalls of the inner spacers 230 may extend beyond or be recessed from sidewalls of the second nanostructures 204.

Moreover, although the outer sidewalls of the inner spacers 230 are illustrated as being straight in FIG. 11B, the outer sidewalls of the inner spacers 230 may be concave or convex. As an example, FIG. 11C illustrates an embodiment in which sidewalls of the first nanostructures 202 are concave, outer sidewalls of the inner spacers 230 are concave, and the inner spacers are recessed from sidewalls of the second nanostructures 204. The inner spacer layer may be etched by an anisotropic etching process, such as RIE, NBE, or the like. The inner spacers 230 may be used to prevent damage to subsequently formed source/drain regions (such as the epitaxial source/drain regions 232, discussed below with respect to FIGS. 12A-12D) by subsequent etching processes, such as etching processes used to form gate structures.

Figure 12B:
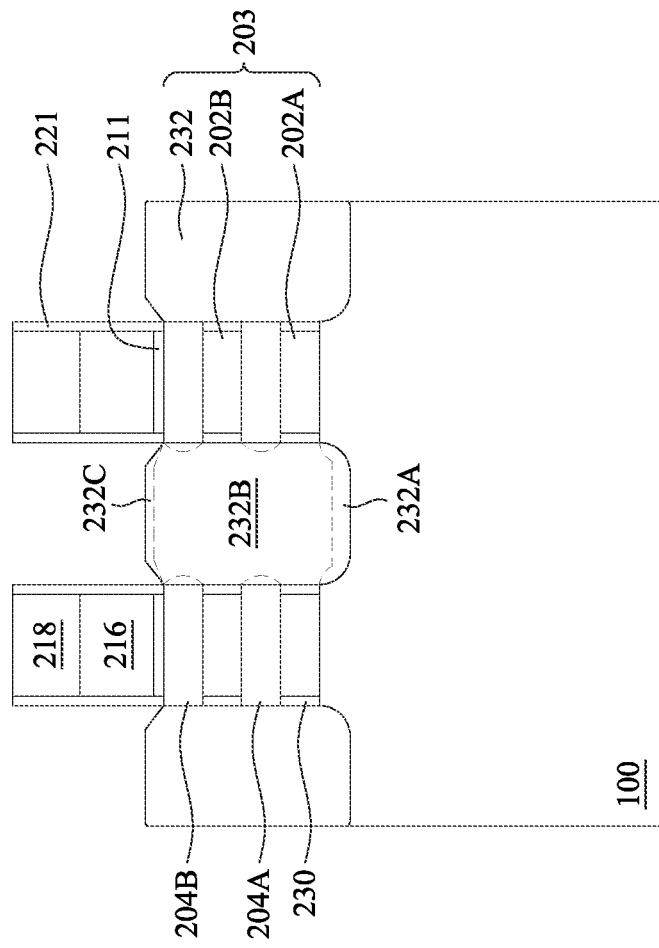

In FIGS. 12A-12D, epitaxial source/drain regions 232 are formed in the source/drain recesses 226. In some embodiments, the source/drain regions 232 may exert stress on the second nanostructures 204, thereby improving device performance. As illustrated in FIG. 12B, the epitaxial source/drain regions 232 are formed in the source/drain recesses 226 such that each dummy gate 216 is disposed between respective neighboring pairs of the epitaxial source/drain regions 232. In some embodiments, the first spacers 221 are used to separate the epitaxial source/drain regions 232 from the dummy gates 216, and the inner spacers 230 are used to separate the epitaxial source/drain regions 232 from the first nanostructures 202 by an appropriate lateral distance so that the epitaxial source/drain regions 232 do not short out with subsequently formed gates of the resulting bottom GAA-FETs.

In some embodiments, the epitaxial source/drain regions 232 may include any acceptable material appropriate for p-type GAA-FETs. For example, if the second nanostructures 204 are silicon, the epitaxial source/drain regions 232 may comprise materials exerting a compressive strain on the second nanostructures 204, such as silicon germanium, boron doped silicon germanium, germanium, germanium tin, or the like. The epitaxial source/drain regions 232 may have surfaces raised from respective upper surfaces of the nanostructures 203 and may have facets. In some embodiments, the epitaxial source/drain regions 232 may include any acceptable material appropriate for n-type GAA-FETs. For example, if the second nanostructures 204 are silicon, the epitaxial source/drain regions 232 may include materials exerting a tensile strain on the second nanostructures 204, such as silicon carbide, phosphorous doped silicon carbide, silicon phosphide, or the like.

The epitaxial source/drain regions 232 may be implanted with dopants to form source/drain regions, followed by an anneal process. The source/drain regions may have an impurity concentration of between about $1\times10^{17}$ atoms/cm$^3$ and about $1\times10^{22}$ atoms/cm$^3$. The n-type and/or p-type impurities for source/drain regions may be any of the impurities previously discussed. In some embodiments, the epitaxial source/drain regions 232 may be in situ doped during growth. In some embodiments where the epitaxial source/drain regions 232 are doped with an n-type dopant (e.g., phosphorus, arsenic, antimony), the bottom GAA-FETs can serve as n-type transistors. In some embodiments where the epitaxial source/drain regions 232 are doped with a p-type dopant (e.g., boron), the bottom GAA-FETs can serve as p-type transistors.

Figure 12A:
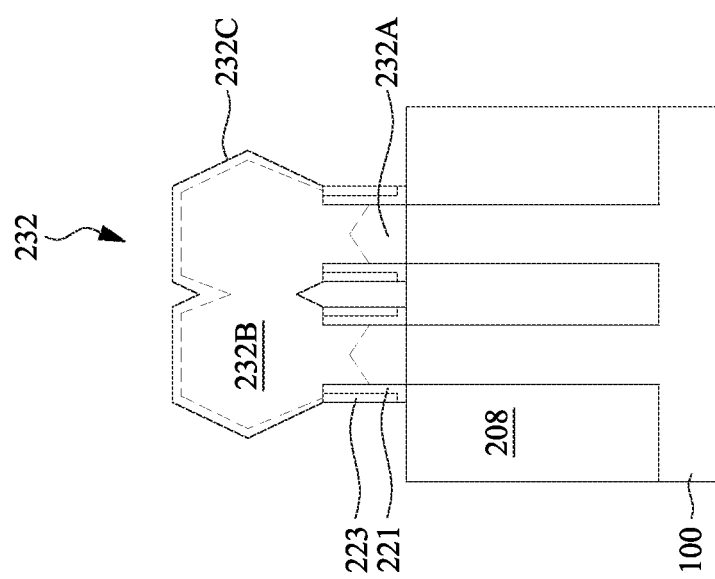

As a result of the epitaxy processes used to form the epitaxial source/drain regions 232, upper surfaces of the epitaxial source/drain regions 232 have facets which expand laterally outward beyond sidewalls of the nanostructures 203. In some embodiments, these facets cause adjacent epitaxial source/drain regions 232 to merge as illustrated by FIG. 12A. In some other embodiments, adjacent epitaxial source/drain regions 232 remain separated after the epitaxy process is completed as illustrated by FIG. 12C. In the embodiments illustrated in FIGS. 12A and 12C, the first spacers 221, 223 may be formed to a top surface of the STI regions 208 thereby blocking the lateral epitaxial growth. In some other embodiments, the spacer etch used to form the first spacers 221, 223 may be adjusted to remove the spacer material to allow the epitaxially grown region to extend to the surface of the STI region 208.

The epitaxial source/drain regions 232 may comprise one or more semiconductor material layers. For example, the epitaxial source/drain regions 232 may comprise a first semiconductor material layer 232A, a second semiconductor material layer 232B, and a third semiconductor material layer 232C, which are distinguished in FIGS. 12A and 12B by using dash lines. Any number of semiconductor material layers may be used for the epitaxial source/drain regions 232. Each of the first semiconductor material layer 232A, the second semiconductor material layer 232B, and the third semiconductor material layer 232C may be formed of different semiconductor materials and may be doped to different dopant concentrations. In some embodiments, the first semiconductor material layer 232A may have a dopant concentration less than the second semiconductor material layer 232B and greater than the third semiconductor material layer 232C. In embodiments in which the epitaxial source/drain regions 232 comprise three semiconductor material layers, the first semiconductor material layer 232A may be deposited, the second semiconductor material layer 232B may be deposited over the first semiconductor material layer 232A, and the third semiconductor material layer 232C may be deposited over the second semiconductor material layer 232B.

Figure 12D:
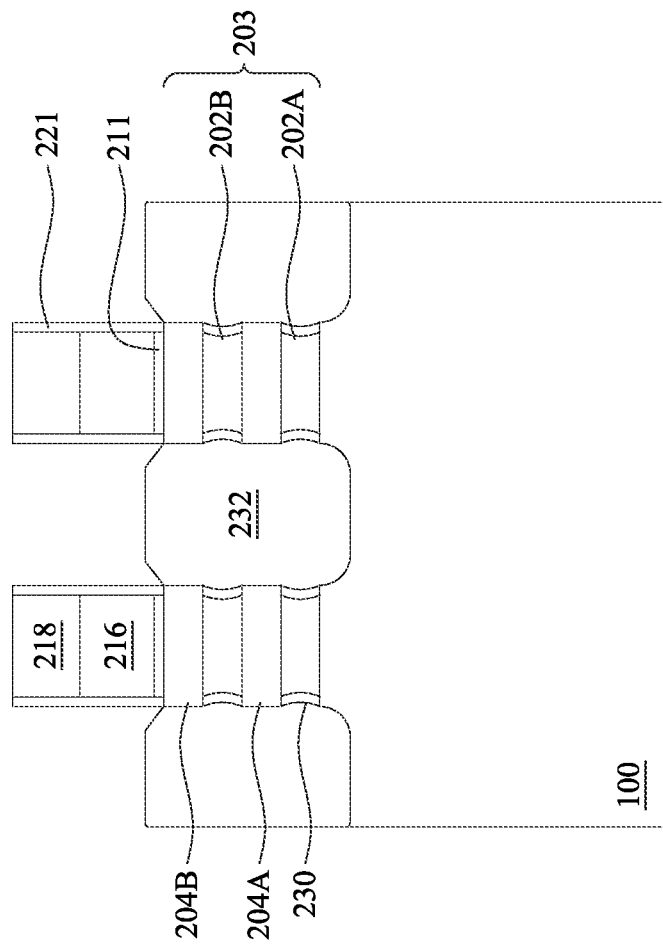
Figure 12C:
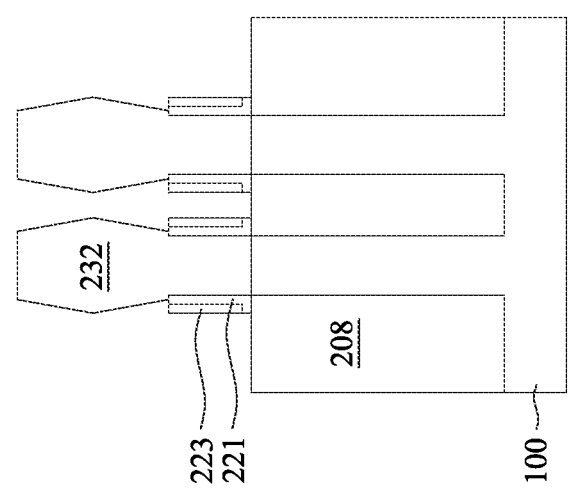

FIG. 12D illustrates an embodiment in which sidewalls of the first nanostructures 202 are concave, outer sidewalls of the inner spacers 230 are concave, and the inner spacers 230 are recessed from sidewalls of the second nanostructures 204. As illustrated in FIG. 12D, the epitaxial source/drain regions 232 may be formed in contact with the inner spacers 230 and may extend past sidewalls of the second nanostructures 204.

Figure 13B:
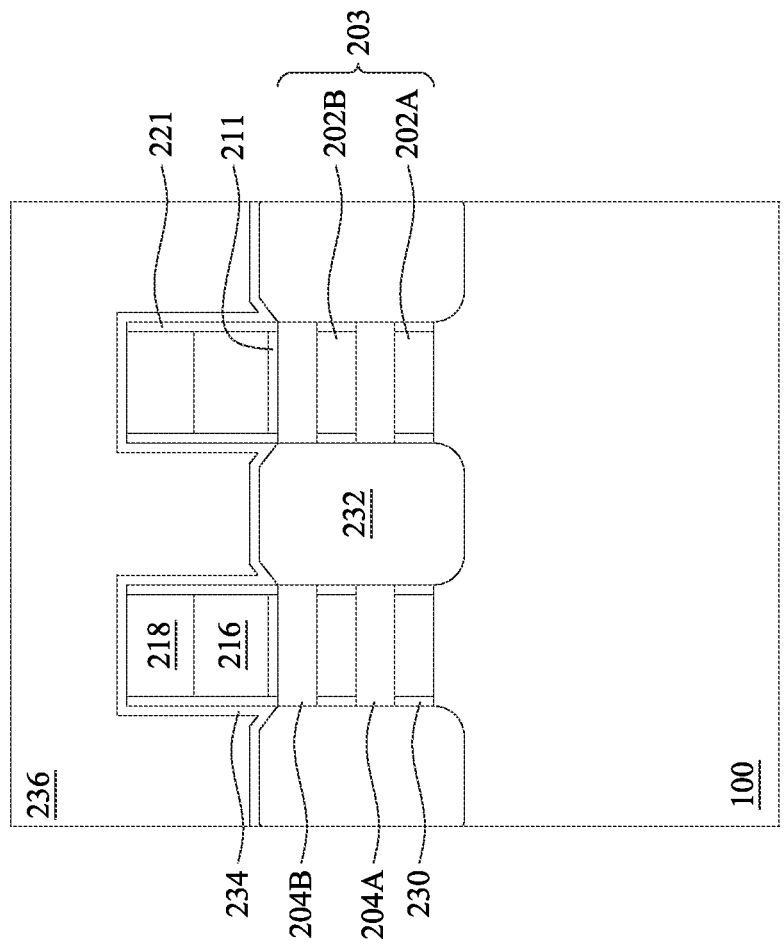
Figure 13A:
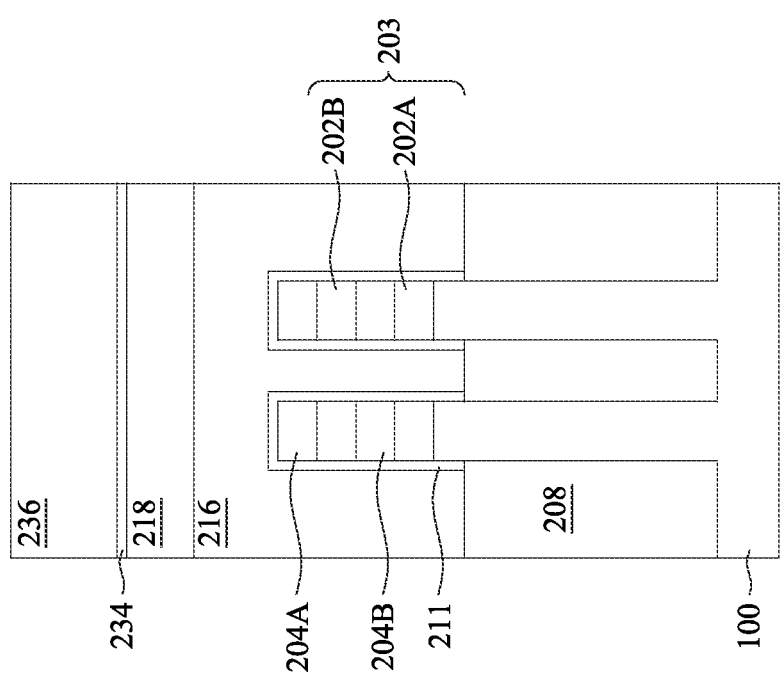
Figure 13C:
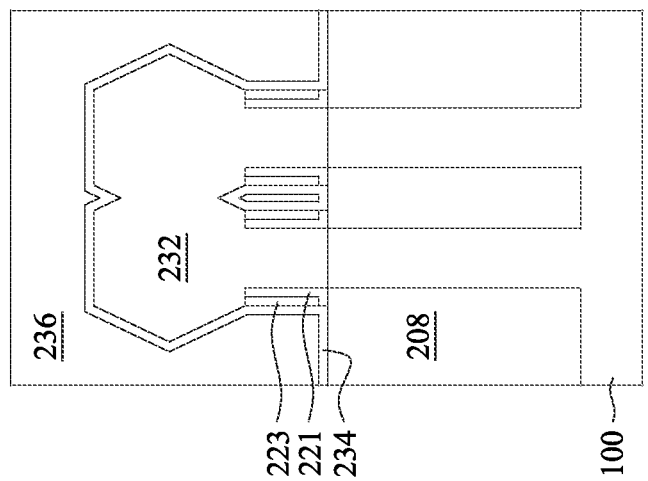

In FIGS. 13A-13C, an interlayer dielectric (ILD) layer 236 is deposited over the structure illustrated in FIGS. 12A-12D. The ILD layer 236 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 234 is disposed between the ILD layer 236 and the epitaxial source/drain regions 232, the masks 218, and the first spacers 221. The CESL 234 may comprise a dielectric material, such as, SiN, $SiO_x$, SiCN, SiON, SiOCN, $Al_2O_3$, $HfO_2$, $ZrO_2$, $HfAlO_x$, and $HfSiO_x$, or the like, having a different etch rate than the material of the overlying ILD layer 236.

Figure 14B:
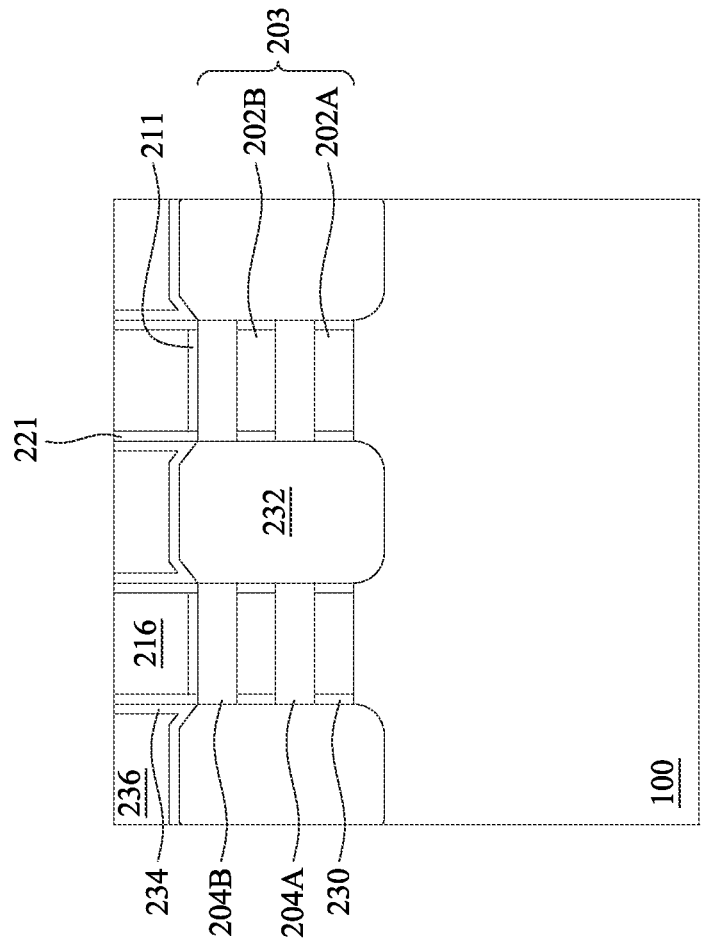
Figure 14A:
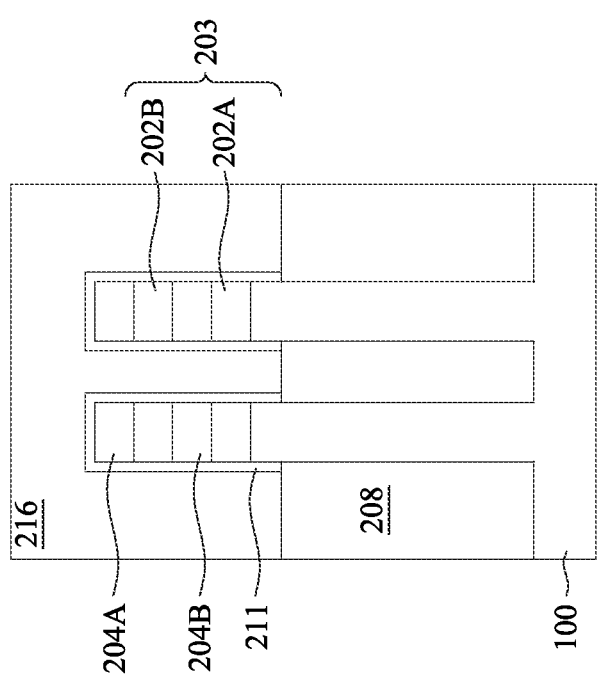

In FIGS. 14A-14B, a planarization process, such as a CMP, may be performed to level the top surface of the ILD layer 236 with the top surfaces of the dummy gates 216 or the masks 218. The planarization process may also remove the masks 218 on the dummy gates 216, and portions of the first spacers 221 along sidewalls of the masks 218. After the planarization process, top surfaces of the dummy gates 216, the first spacers 221, and the ILD layer 236 are level within process variations. Accordingly, the top surfaces of the dummy gates 216 are exposed through the ILD layer 236. In some embodiments, the masks 218 may remain, in which case the planarization process levels the top surface of the ILD layer 236 with top surface of the masks 218 and the first spacers 221.

Figure 15B:
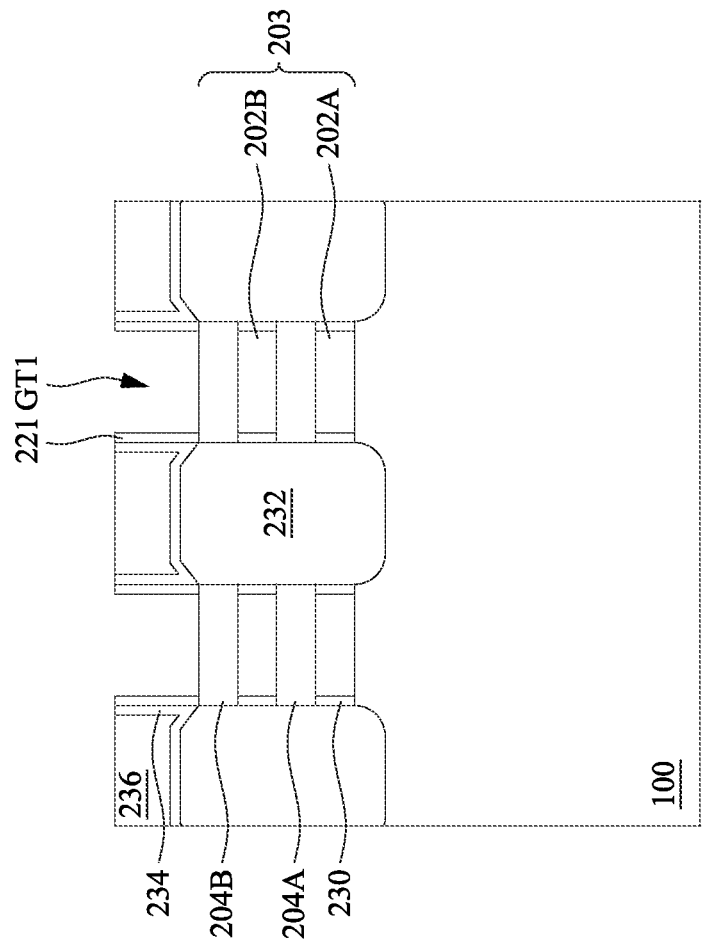
Figure 15A:
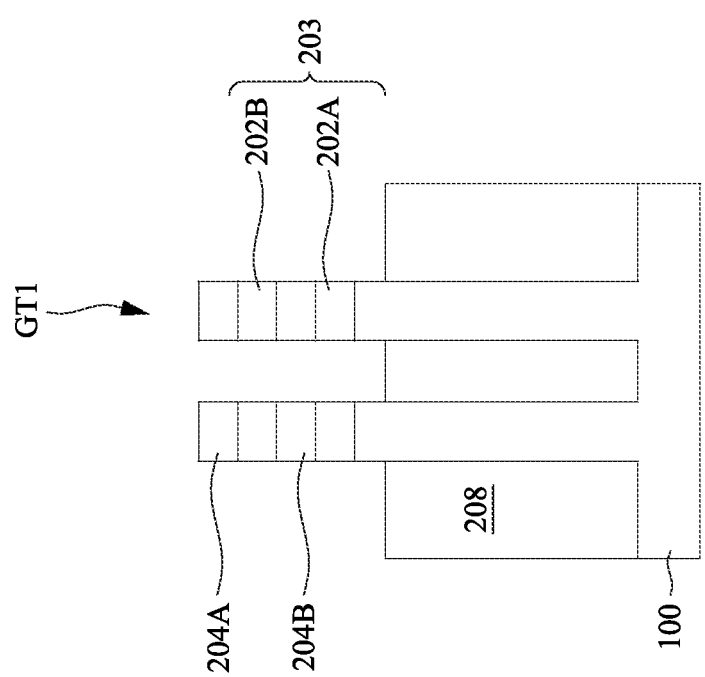

In FIGS. 15A and 15B, the dummy gates 216, and the masks 218 if present, are removed in one or more etching steps, so that gate trenches GT1 are formed between corresponding gate spacers 221. In some embodiments, portions of the dummy gate dielectrics 211 in the gate trenches GT1 are also be removed. In some embodiments, the dummy gates 216 and the dummy gate dielectrics 211 are removed by an anisotropic dry etch process. For example, the etching process may include a dry etch process using reaction gas(es) that selectively etch the dummy gates 216 at a faster rate than the first spacers 221. Each gate trench GT1 exposes and/or overlies portions of nanostructures 204, which will serve as channel regions in subsequently completed GAA-FETs. The nanostructures 204 serving as the channel regions are disposed between neighboring pairs of the epitaxial source/drain regions 232. During the removal, the dummy dielectric layers 211 may be used as etch stop layers when the dummy gates 216 are etched. The dummy dielectric layers 211 may then be removed after the removal of the dummy gates 216.

Figure 16B:
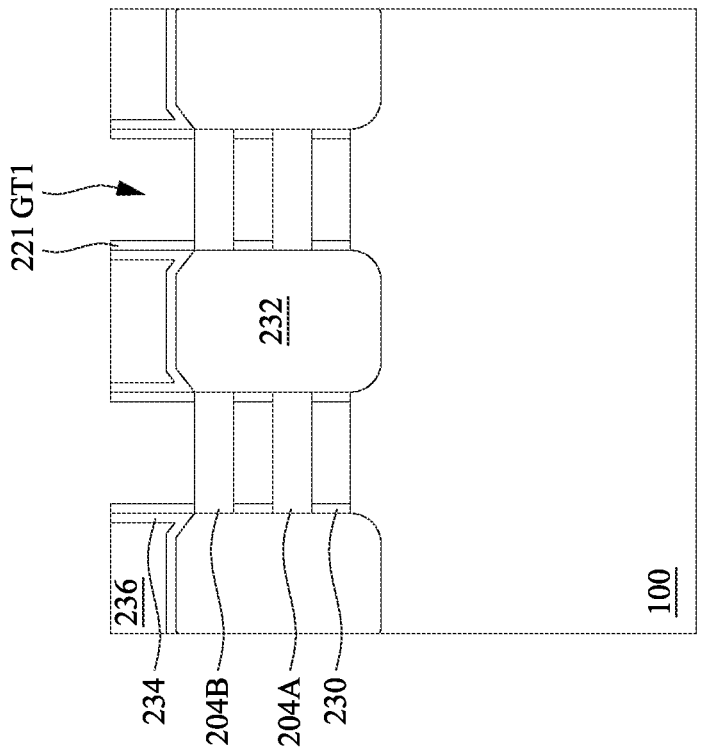
Figure 16A:
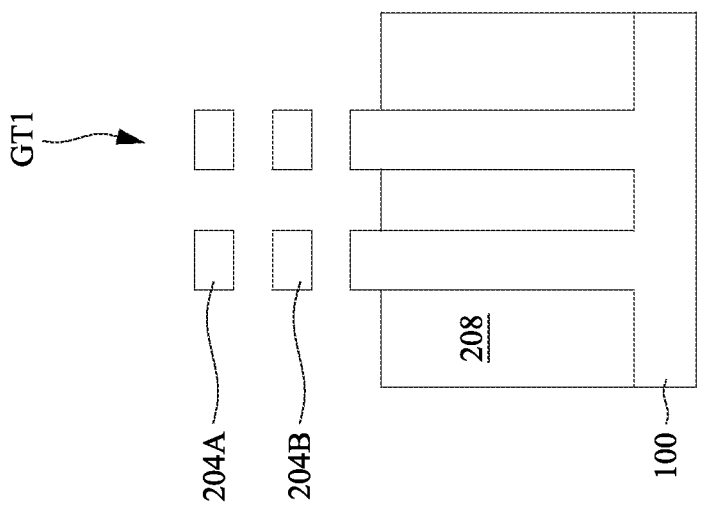

In FIGS. 16A and 16B, the first nanostructures 202 in the gate trenches GT1 are removed by an isotropic etching process such as wet etching or the like using etchants which are selective to the materials of the first nanostructures 202. Stated differently, the first nanostructures 202 are removed by using a selective etching process that etches the first nanostructures 202 at a faster etch rate than it etches the second nanostructures 204, thus forming spaces between the second nanostructures 204 (also referred to as sheet-to-sheet spaces if the nanostructures 204 are nanosheets). This step can be referred to as a channel release process. At this interim processing step, the spaces between second nanostructures 204 may be filled with ambient environment conditions (e.g., air, nitrogen, etc). In some embodiments, the second nanostructures 204 can be referred to as nanosheets, nanowires, nanoslabs, nanorings having nanoscale size (e.g., a few nanometers), depending on their geometry. For example, in some embodiments the second nanostructures 204 may be trimmed to have a substantial rounded shape (i.e., cylindrical) due to the selective etching process for completely removing the first nanostructures 202. In that case, the resultant second nanostructures 204 can be called nanowires.

In embodiments in which the first nanostructures 202 include, e.g., SiGe, and the second nanostructures 204 include, e.g., Si or SiC, tetramethylammonium hydroxide (TMAH), ammonium hydroxide ($NH_4OH$) or the like may be used to remove the first nanostructures 202. In some embodiments, both the channel release step and the previous step of laterally recessing first nanostructures 202 (i.e., the step as illustrated in FIGS. 10A-10B) use a selective etching process that etches first nanostructures 202 (e.g., SiGe) at a faster etch rate than etching second nanostructures 204 (e.g., Si), and therefore these two steps may use the same etchant chemistry in some embodiments. In this case, the etching time/duration of channel release step is longer than the etching time/duration of the previous step of laterally recessing first nanostructures 202, so as to completely remove the sacrificial nanostructures 202.

Figure 17B:
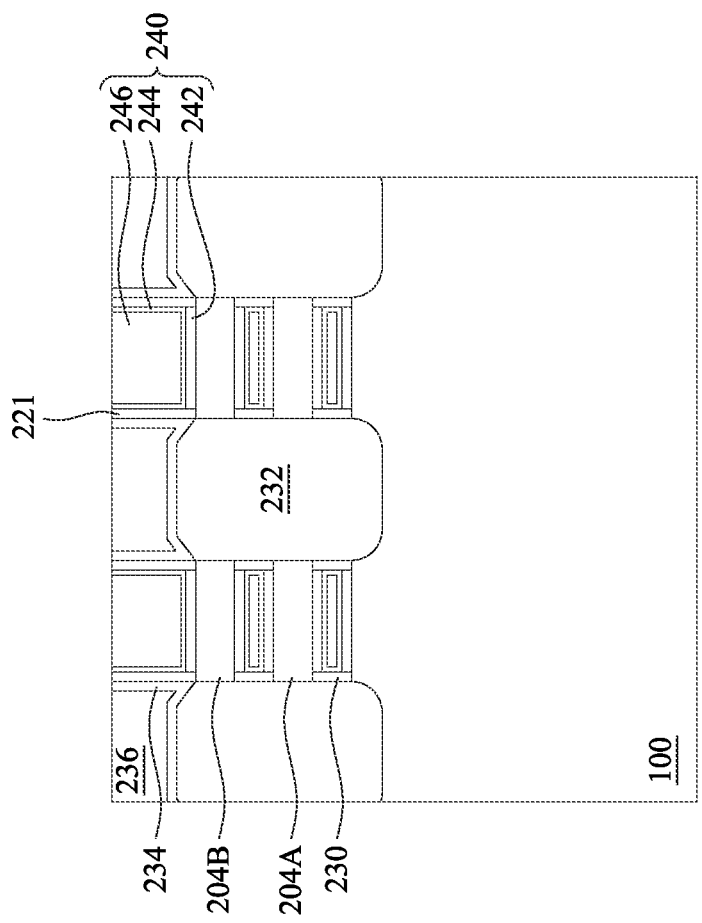
Figure 17A:
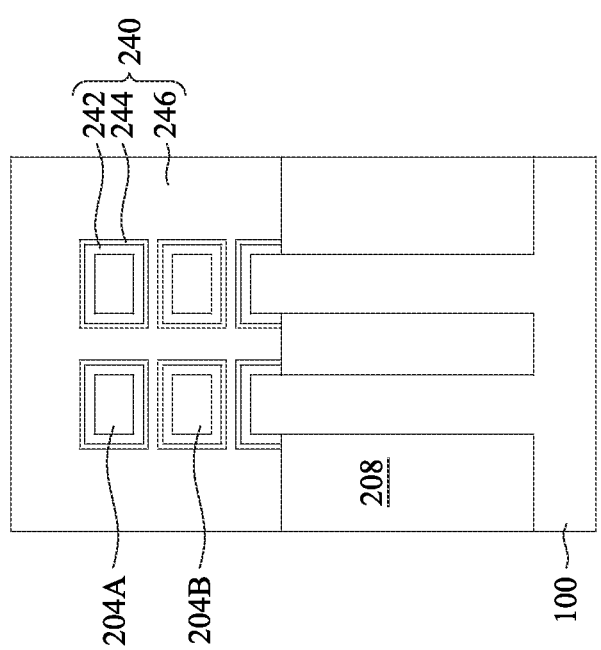

In FIGS. 17A and 17B, replacement gate structures 240 are respectively formed in the gate trenches GT1 to surround each of the nanosheets 204 suspended in the gate trenches GT1. The gate structures 240 may be final gates of bottom GAA FETs. The final gate structure may be a high-k/metal gate stack, however other compositions are possible. In some embodiments, each of the gate structures 240 forms the gate associated with the multi-channels provided by the plurality of nanosheets 204. For example, high-k/metal gate structures 240 are formed within the sheet-to-sheet spaces provided by the release of nanosheets 204. In various embodiments, the high-k/metal gate structure 240 includes an interfacial layer 242 formed around the nanosheets 204, a high-k gate dielectric layer 244 formed around the interfacial layer 242, and a gate metal layer 246 formed around the high-k gate dielectric layer 244 and filling a remainder of gate trenches GT1. Formation of the high-k/metal gate structures 240 may include one or more deposition processes to form various gate materials, followed by a CMP process to remove excessive gate materials, resulting in the high-k/metal gate structures 240 having top surfaces level with a top surface of the ILD layer. As illustrated in the cross-sectional view of FIG. 17A, the high-k/metal gate structure 240 surrounds each of the nanosheets 204, and thus is referred to as a gate of a bottom GAA FET.

In some embodiments, the interfacial layer 242 is semiconductor oxide (e.g., silicon oxide) formed on exposed surfaces of semiconductor materials (e.g., Si) in the gate trenches GT1 by using, for example, thermal oxidation, chemical oxidation, wet oxidation or the like. As a result, surface portions of the nanosheets 204 exposed in the gate trenches GT1 are oxidized into semiconductor oxide to form interfacial layer 242.

In some embodiments, the high-k gate dielectric layer 244 has a dielectric constant greater than a dielectric constant of $SiO_2$ (about 3.9). The high-k gate dielectric layer 244 includes dielectric materials such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), the like, or combinations thereof.

In some embodiments, the gate metal layer 246 includes one or more metal layers. For example, the gate metal layer 246 may include one or more work function metal layers stacked one over another and a fill metal filling up a remainder of gate trenches GT1. The one or more work function metal layers in the gate metal layer 246 provide a suitable work function for the high-k/metal gate structures 240. For an n-type GAA FET, the gate metal layer 246 may include one or more n-type work function metal (N-metal) layers. The n-type work function metal may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type GAA FET, the gate metal layer 246 may include one or more p-type work function metal (P-metal) layers. The p-type work function metal may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the fill metal in the gate metal layer 246 may exemplarily include, but are not limited to, tungsten, aluminum, copper, nickel, cobalt, titanium, tantalum, titanium nitride, tantalum nitride, nickel silicide, cobalt silicide, TaC. TaSiN, TaCN, TiAl, TiAlN, or other suitable materials.

Figure 18B:
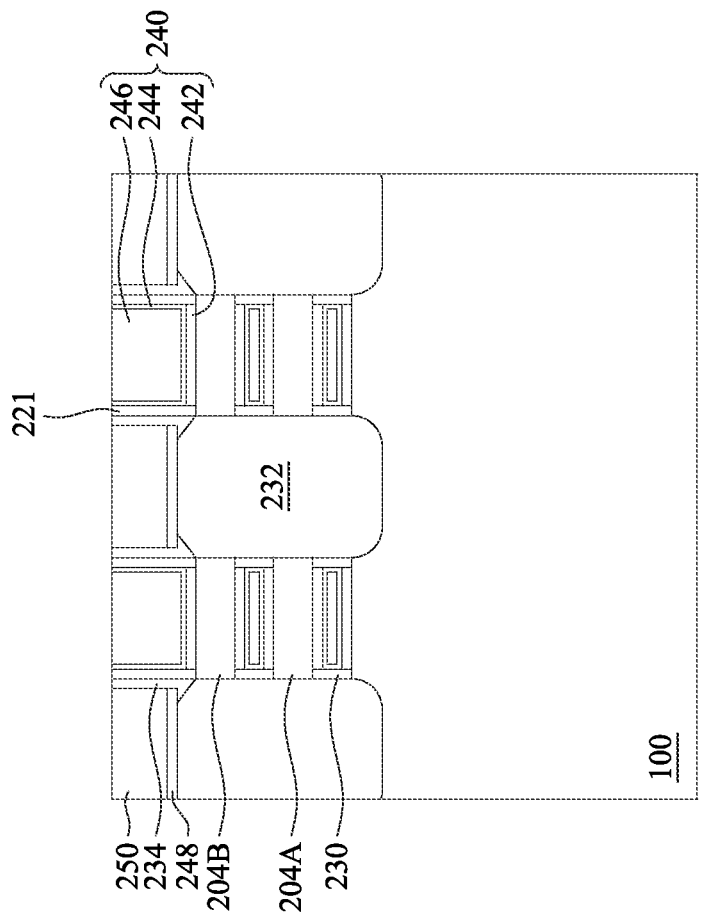
Figure 18A:
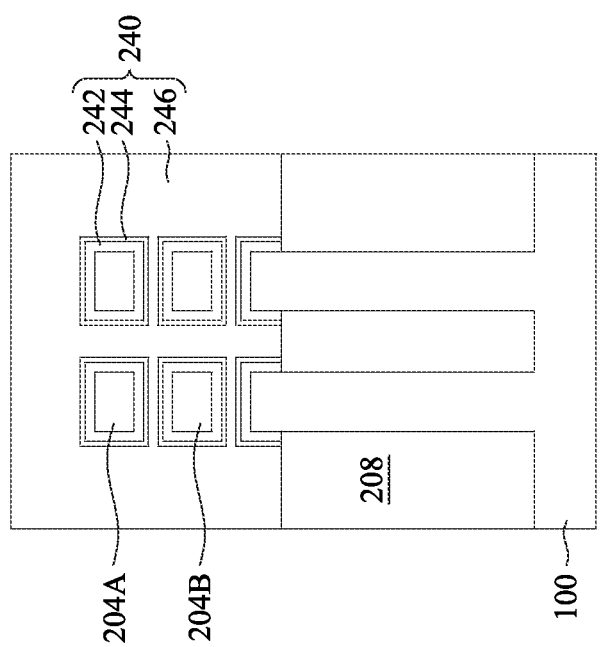

In FIGS. 18A-18B, source/drain contacts 250 are formed extending through the CESL 234 and the ILD layer 236. Formation of the source/drain contacts 262 includes, by way of example and not limitation, performing one or more etching processes to form contact openings extending though the ILD layer 236 and the CESL 234 to expose the epitaxial source/drain regions 232, depositing one or more metal materials (e.g., W, Ru, Co, Cu, Ti, TiN, Ta, TaN, Mo, Ni, the like or combinations thereof) overfilling the contact openings, and then performing a CMP process to remove excessive metal materials outside the contact openings. In some embodiments, silicide regions 248 are formed on the epitaxial source/drain regions 232 before depositing metal materials of the source/drain contacts 250 into the contact openings. For example, a silicidation process may be performed on epitaxial source/drain regions 232 to reduce the contact resistance between the source/drain regions 232 and the metal contacts 250. The silicidation process may involve depositing a thin layer of a metal, such as nickel (Ni), cobalt (Co), or titanium (Ti), on the exposed surfaces of the epitaxial source/drain regions 232, followed by an annealing step, such as rapid thermal annealing (RTA), during which the metal reacts with the semiconductor materials (e.g., Si) of the source/drain regions 232 to form a metal-silicide compound, while the metal over the dielectric materials remains unreacted. The unreacted metal can then be selectively removed using a wet or dry etching process, leaving the silicide regions 248 on the epitaxial source/drain regions 232.

Figure 19B:
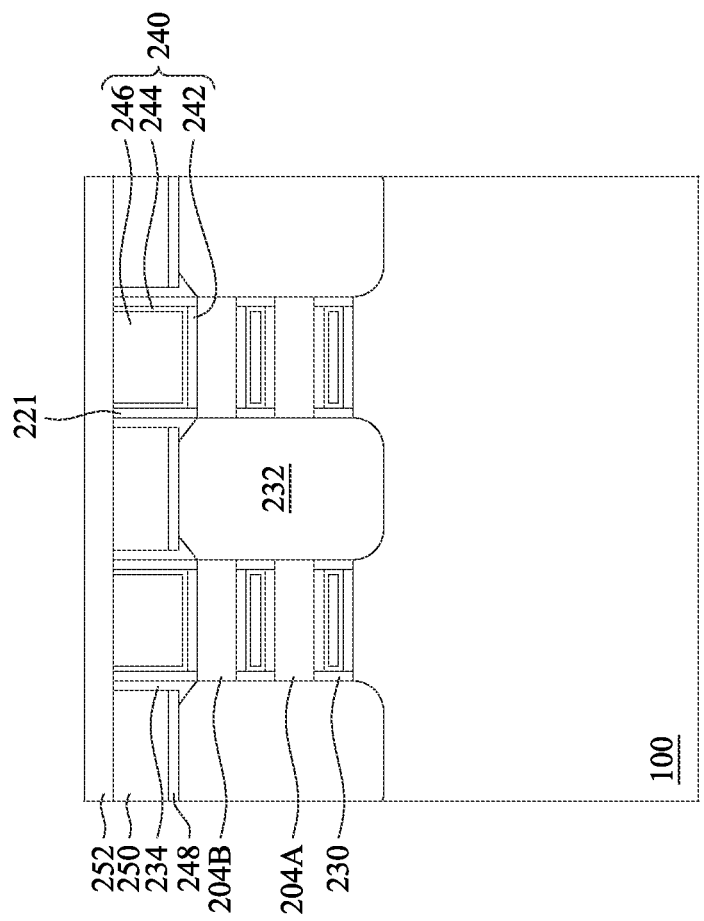
Figure 19A:
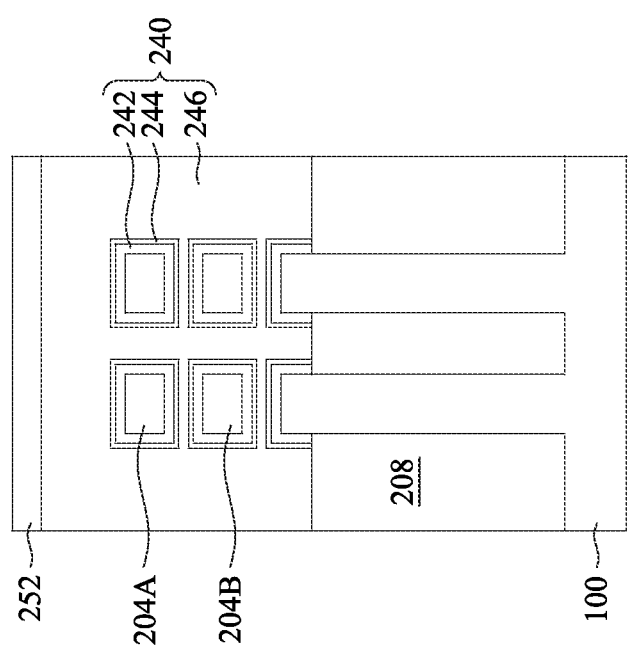

In FIGS. 19A and 19B, a first bonding dielectric layer 252 is globally formed over the substrate 100 by using suitable deposition techniques, such as chemical vapor deposition (CVD), plasma-enhanced chemical vapor deposition (PECVD), or atomic layer deposition (ALD). These deposition methods enable the formation of a uniform and conformal dielectric layer, ensuring effective electrical isolation and bonding between the various structures on the substrate. In some embodiments, the first bonding dielectric layer 250 is prepared for subsequent dielectric-to-dielectric bonding with another substrate. Examples of materials that can be used for the first bonding dielectric layer 250 include silicon dioxide ($SiO_2$), silicon nitride ($Si_3N_4$), or other oxide or nitride materials. In some embodiments, the bonding dielectric layer 250 has a thickness in a range from about 10 nm to about 100 μm.

Figure 20:
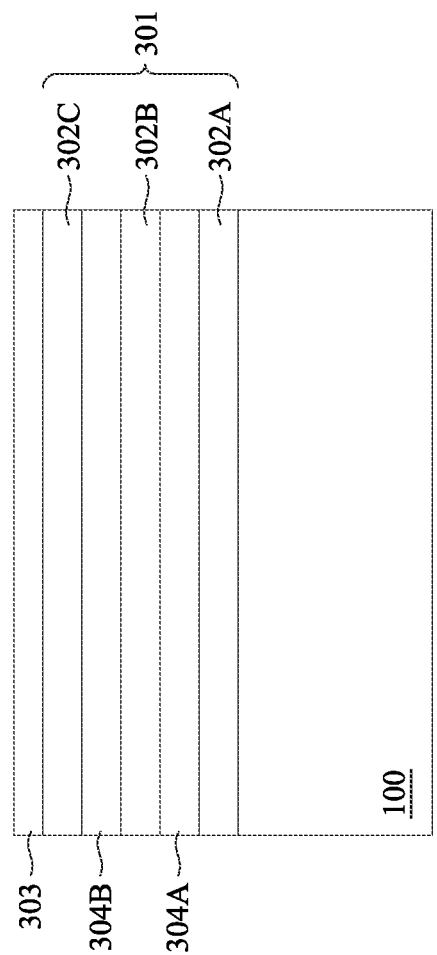

In FIG. 20, a second multi-layer stack 301 is formed on a sacrificial substrate 300, and will be bonded to the bottom GAA-FETs (as illustrated in FIGS. 19A and 19B) during a subsequent processing step. The sacrificial substrate 300 may be a semiconductor substrate, such as a bulk semiconductor, a semiconductor-on-insulator (SOI) substrate, or the like, which may be doped (e.g., with a p-type or an n-type dopant) or undoped. The substrate 300 may be a wafer, such as a silicon wafer. The multi-layer stack 301 includes alternating layers of first semiconductor layers 302A-C (collectively referred to as first semiconductor layers 302) and second semiconductor layers 304A-B (collectively referred to as second semiconductor layers 304). For purposes of illustration and as discussed in greater detail below, the first semiconductor layers 302 will be removed and the second semiconductor layers 304 will be patterned to form channel regions of top GAA-FETs.

The second multi-layer stack 301 is illustrated as including three layers of the first semiconductor layers 302 and two layers of the second semiconductor layers 304 for illustrative purposes. In some embodiments, the multi-layer stack 301 may include any number of the first semiconductor layers 302 and the second semiconductor layers 304. Each of the layers of the multi-layer stack 301 may be epitaxially grown using a process such as chemical vapor deposition (CVD), atomic layer deposition (ALD), vapor phase epitaxy (VPE), molecular beam epitaxy (MBE), or the like. In some embodiments, a number of the first semiconductor layers 302 is greater than a number of the second semiconductor layers 304.

The first semiconductor materials and the second semiconductor materials may be materials having a high-etch selectivity to one another. As such, the first semiconductor layers 302 of the first semiconductor material may be removed without significantly removing the second semiconductor layers 304 of the second semiconductor material, thereby allowing the second semiconductor layers 304 to serve as channel regions of top GAA-FETs.

In various embodiments, the second semiconductor layers 304 may be formed of a semiconductor material suitable for serving as channel regions of top GAA-FETs. For example, the second semiconductor layers 304 may include Ge-based materials, such as pure germanium or germanium-containing compound semiconductors. Ge-based materials exhibit higher carrier mobility compared to silicon, allowing for faster movement of charge carriers (electrons and holes)

within the Ge-based channel regions. This results in faster transistor switching speeds and reduced power consumption. In some embodiments, the Ge-based layers 304 include, for example, pure germanium (Ge), silicon germanium (GeSi$_x$, x ranging from about 0.05 to about 0.95), germanium tin (GeSn$_x$, x ranging from about 0.05 to about 0.95). In some embodiments, the first semiconductor layers 302 are silicon germanium and the second semiconductor layers 304 are pure germanium (Ge) having an etch selectivity to silicon germanium. In some embodiments, the first semiconductor layers 302 are pure germanium (Ge) and the second semiconductor layers 304 are silicon germanium having an etch selectivity to pure germanium. In some embodiments, the first semiconductor layers 202 are germanium tin (GeSn$_x$, x ranging from about 0.05 to about 0.95) and the second semiconductor layers 204 are pure germanium (Ge) having an etch selectivity to germanium tin.

FIG. 20 further illustrates a second bonding dielectric layer 303 formed over the second multi-layer stack 301 by using suitable deposition techniques, such as chemical vapor deposition (CVD), plasma-enhanced chemical vapor deposition (PECVD), or atomic layer deposition (ALD). In some embodiments, the second bonding dielectric layer 303 is prepared for subsequent dielectric-to-dielectric bonding with the first bonding layer 252 illustrated in FIGS. 19A-19B. Examples of materials that can be used for the second bonding dielectric layer 303 include silicon dioxide (SiO$_2$), silicon nitride (Si$_3$N$_4$), or other oxide or nitride materials. In some embodiments, the bonding dielectric layer 300 has a thickness in a range from about 10 nm to about 100 μm.

Figure 21B:
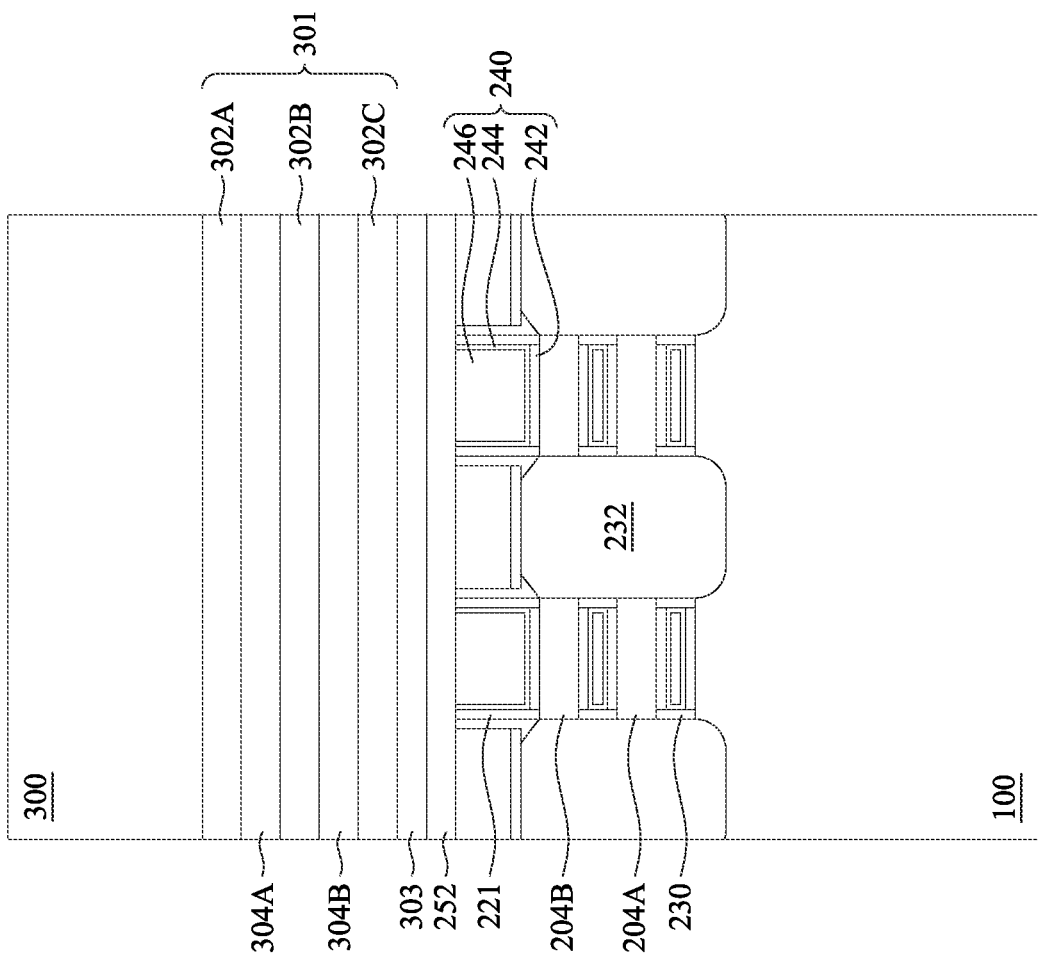
Figure 21A:
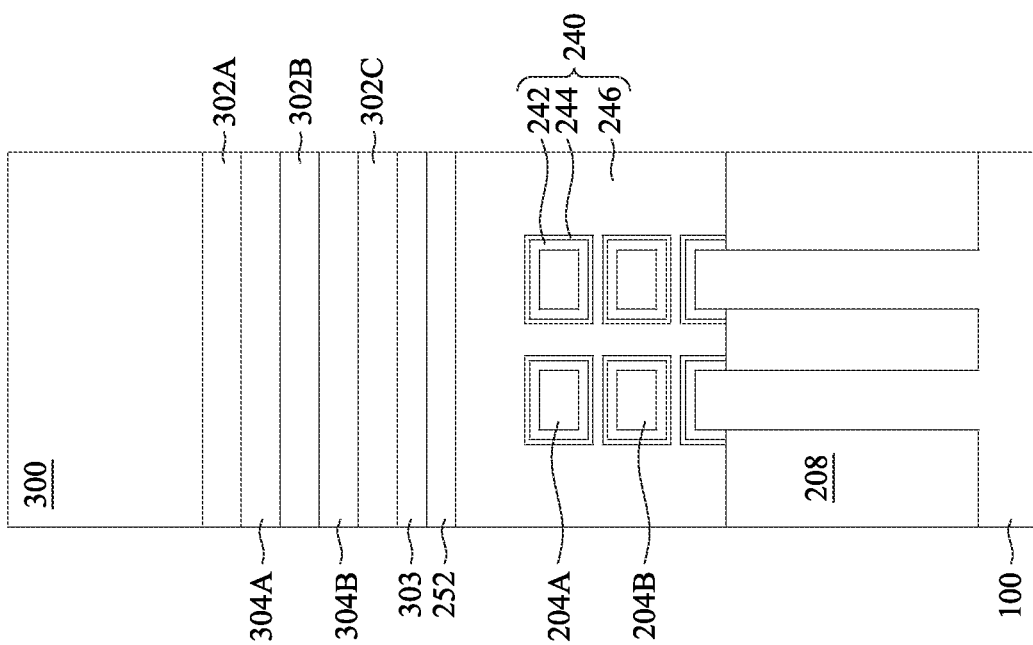

In FIGS. 21A-21B, the sacrificial substrate 300 is flipped and placed over the substrate 100, then bonded to the bottom GAA-FETs by using the bonding dielectric layers 303 and 252. In some embodiments, dielectric-to-dielectric bonding is employed to bond the bonding dielectric layers 303 and 252 to form a stacked structure, providing reliable mechanical connections between the bottom GAA-FETs and subsequently formed top GAA-FETs. Dielectric-to-dielectric bonding may be achieved using various techniques, including direct bonding, anodic bonding, or adhesive bonding. For example, direct bonding, also referred to as fusion bonding or wafer bonding, can be employed to bring two dielectric surfaces of the bonding dielectric layers 303 and 252 into intimate contact with each other, under controlled environmental conditions such as vacuum or an inert atmosphere. This bonding method relies on the surface forces, such as van der Waals forces, to create a strong bond between the bonding dielectric layers 303 and 252. Examples of dielectric materials used in direct bonding include silicon dioxide (SiO$_2$), silicon nitride (Si$_3$N$_4$), or other oxide or nitride materials.

Figure 22B:
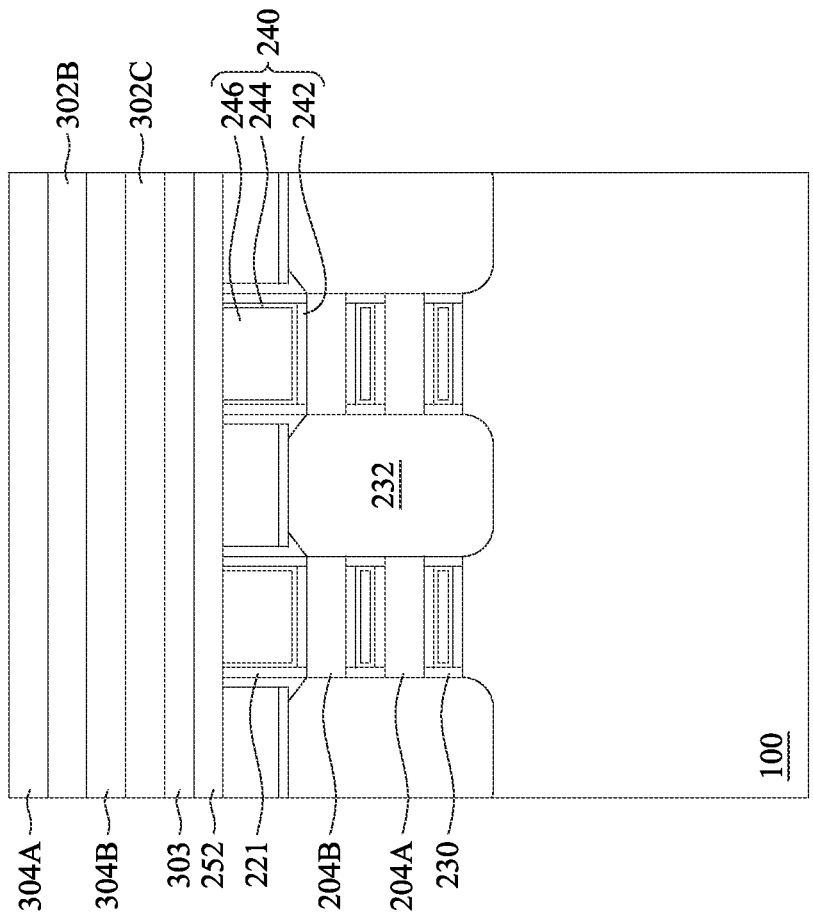
Figure 22A:
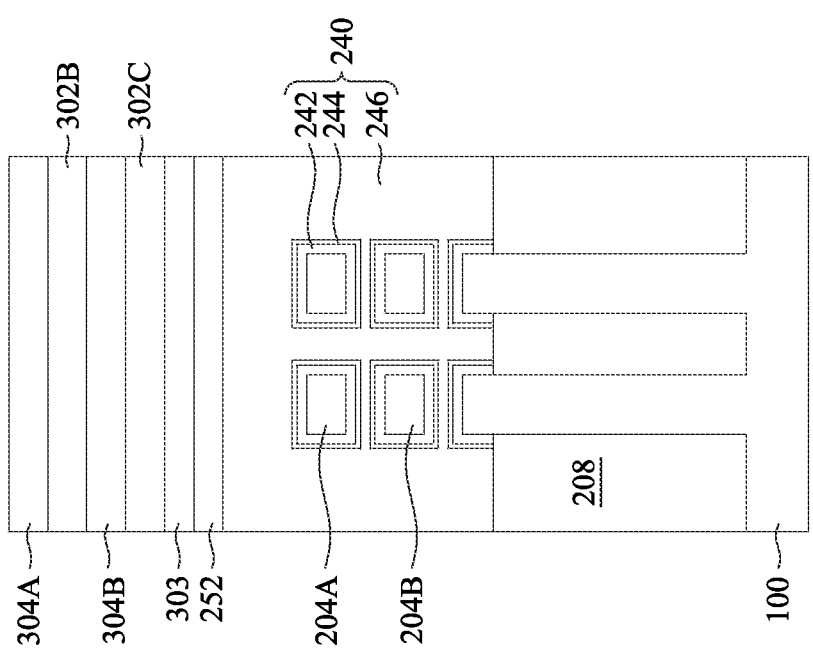

Next, as illustrated in FIGS. 22A-22B, the sacrificial substrate 300 is thinned down to expose the first semiconductor layer 302A. In some embodiments, the thinning step is accomplished by a CMP process, a grinding process, or the like. In some embodiments, the first semiconductor layer 302A can act as a CMP stop layer, which slows down the thinning process and enables the detection of the process endpoint. Upon completion of the thinning step, the first semiconductor layer 302A is removed using suitable selective etching process that etches the first semiconductor layer 302 while leaving the second semiconductor layer 302B substantially intact.

Figure 23B:
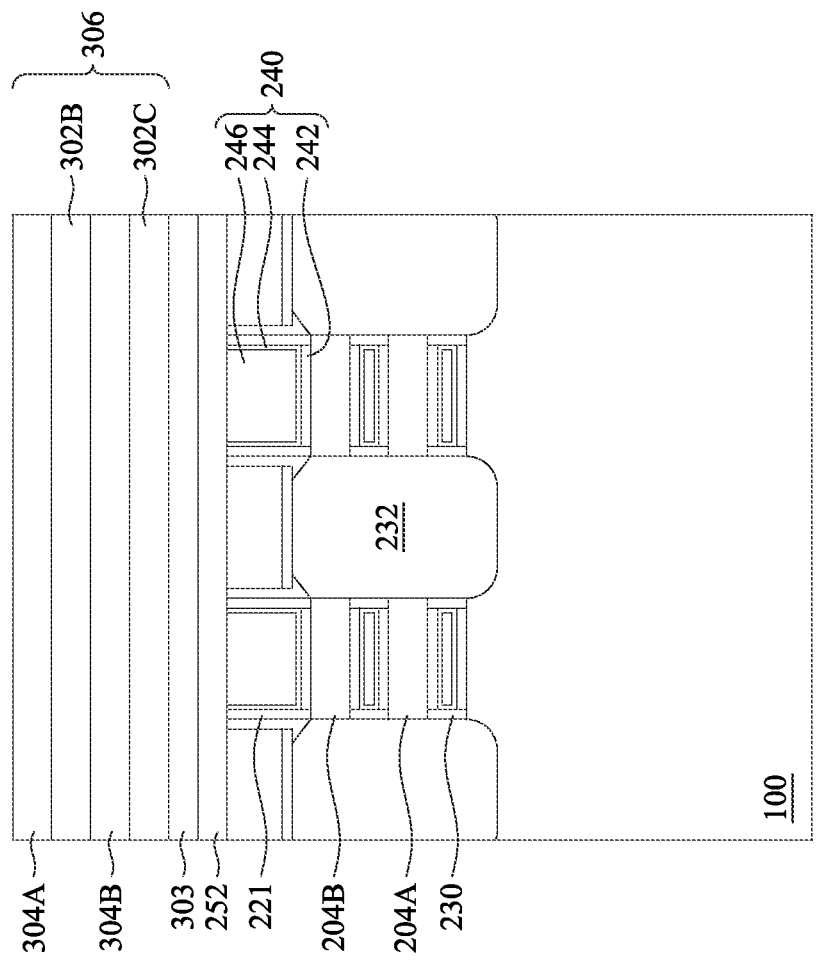
Figure 23A:
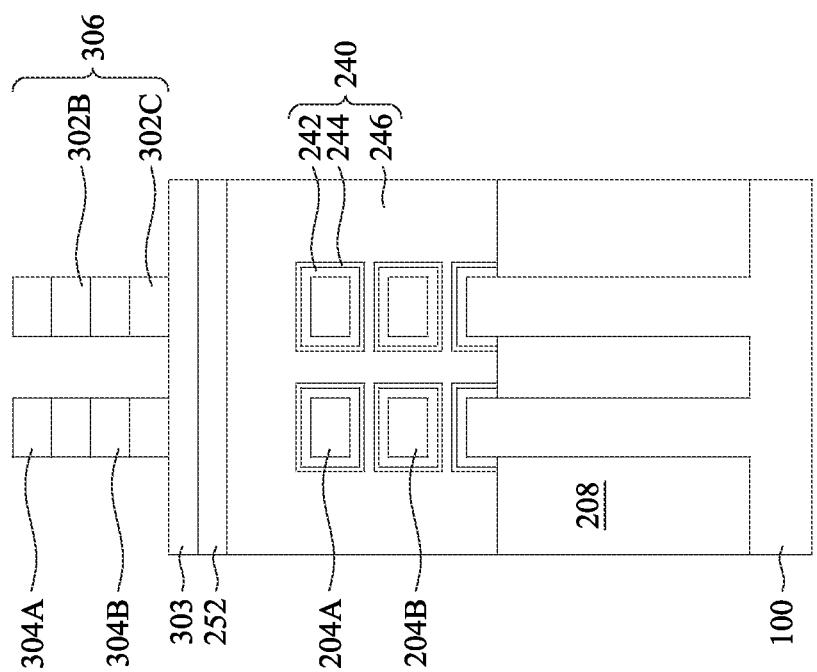

In FIGS. 23A-23B, fin structures 306 are formed in the multi-layer stack 301, in accordance with some embodiments. In some embodiments, the fin structures 306 may be formed in the multi-layer stack 301 by etching trenches in the multi-layer stack 301. The etching may be any acceptable etch process, such as a reactive ion etch (RIE), neutral beam etch (NBE), the like, or a combination thereof. The etching may be anisotropic. Forming the fin structures 306 by etching the multi-layer stack 301 may further define first nanostructures 302B-C (collectively referred to as the first nanostructures 302) from the first semiconductor layers 302B-C and define second nanostructures 304A-B (collectively referred to as the second nanostructures 304) from the second semiconductor layers 304A-B. The first nanostructures 302 and the second nanostructures 304 may further be collectively referred to as fin structures 306.

Figure 24B:
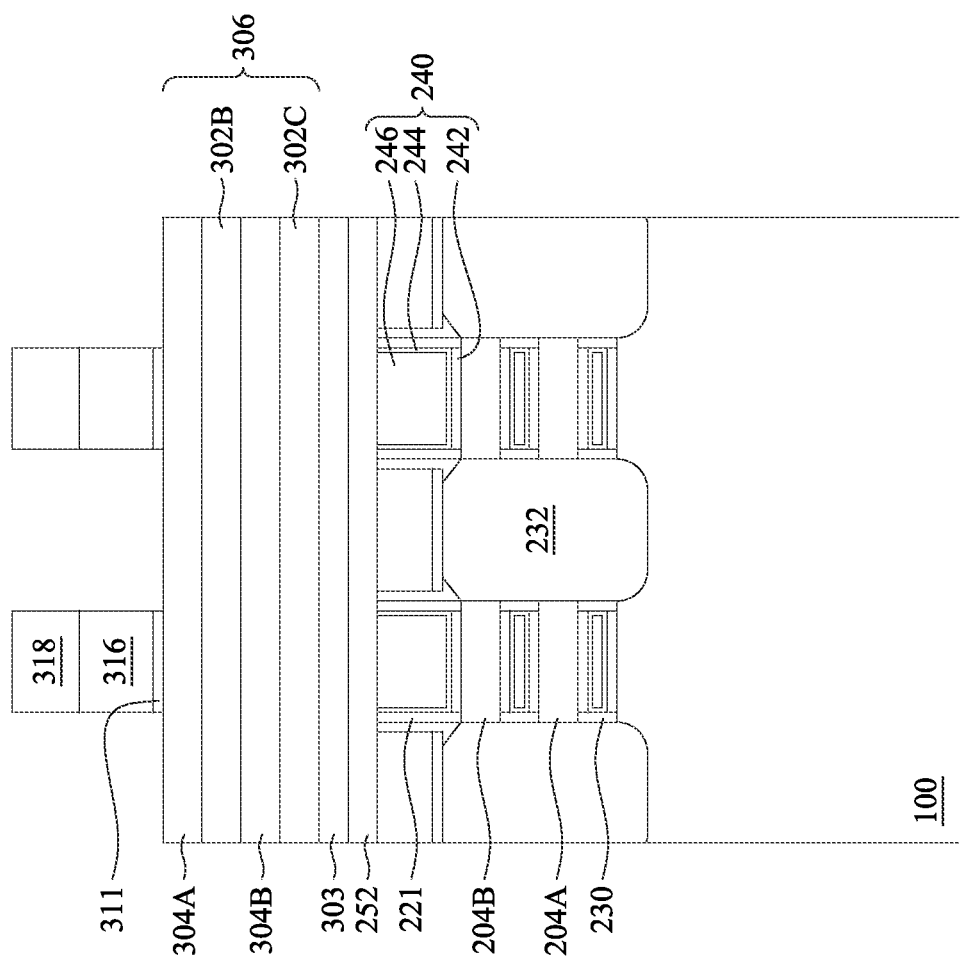
Figure 24A:
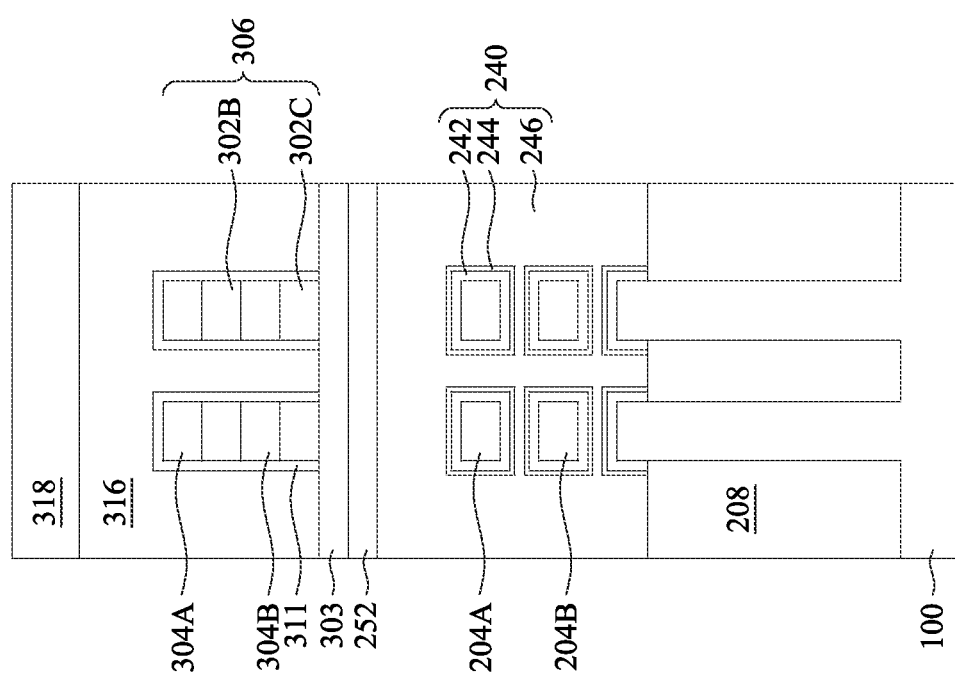

In FIGS. 24A and 24B, dummy gates 316 and dummy gate dielectrics 311 are formed over the fin structures 306. The dummy gates 316 have a lengthwise direction substantially perpendicular to the lengthwise direction of respective fin structures 306. In some embodiments, the dummy gates 316 and dummy gate dielectrics 311 can be formed by, for example, forming a layer of dummy gate dielectric material over the fin structures 306, a layer of dummy gate material over the layer of dummy gate dielectric material, and a mask layer over the layer of dummy gate material, followed by patterning the mask layer into masks 318, followed by transferring the pattern of masks 318 to the layer of dummy gate material and the layer of dummy gate dielectric material, resulting in formation of dummy gates 316 and dummy gate dielectrics 311, respectively. In some embodiments, the dummy gate dielectrics 311 may be, for example, silicon oxide, silicon nitride, a combination thereof, or the like, and may be deposited or thermally grown according to acceptable techniques. In some embodiments, the dummy gates 316 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. In some embodiments, the masks 318 may include, for example, silicon nitride, silicon oxynitride, or the like.

Figure 25:
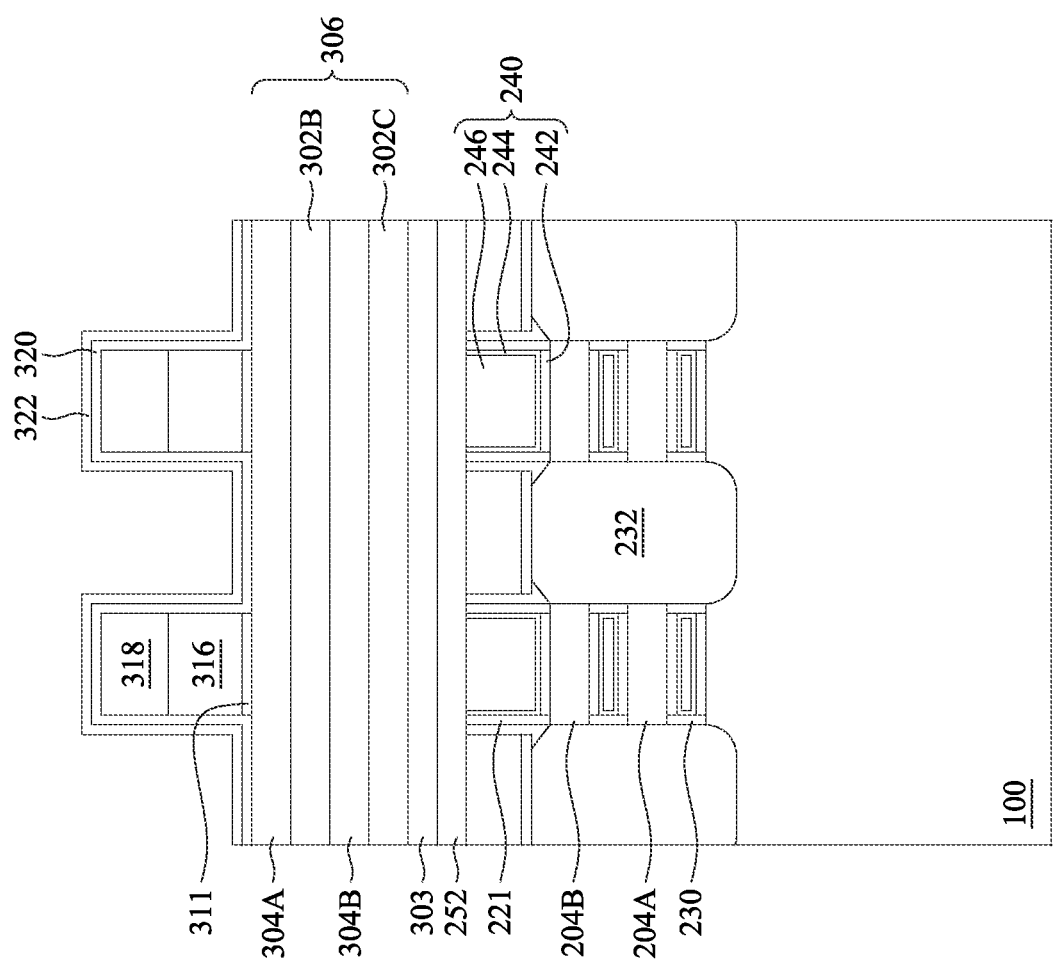

In FIG. 25, a first spacer layer 320 and a second spacer layer 322 are formed over the structures illustrated in FIGS. 24A and 24B. The first spacer layer 320 and the second spacer layer 322 will be subsequently patterned to act as spacers for forming self-aligned source/drain regions. In FIG. 25, the first spacer layer 320 is formed on top surfaces and sidewalls of the fin structures 306 and the masks 318; and sidewalls of the dummy gates 316 and the dummy gate dielectrics 311. The second spacer layer 322 is deposited over the first spacer layer 330. The first spacer layer 330 may be formed of silicon oxide, silicon nitride, silicon oxynitride, or the like, using techniques such as thermal oxidation or deposited by CVD, ALD, or the like. The second spacer layer 322 may be formed of a material having a different etch rate than the material of the first spacer layer 330, such as silicon oxide, silicon nitride, silicon oxynitride, or the like, and may be deposited by CVD, ALD, or the like.

Figure 26B:
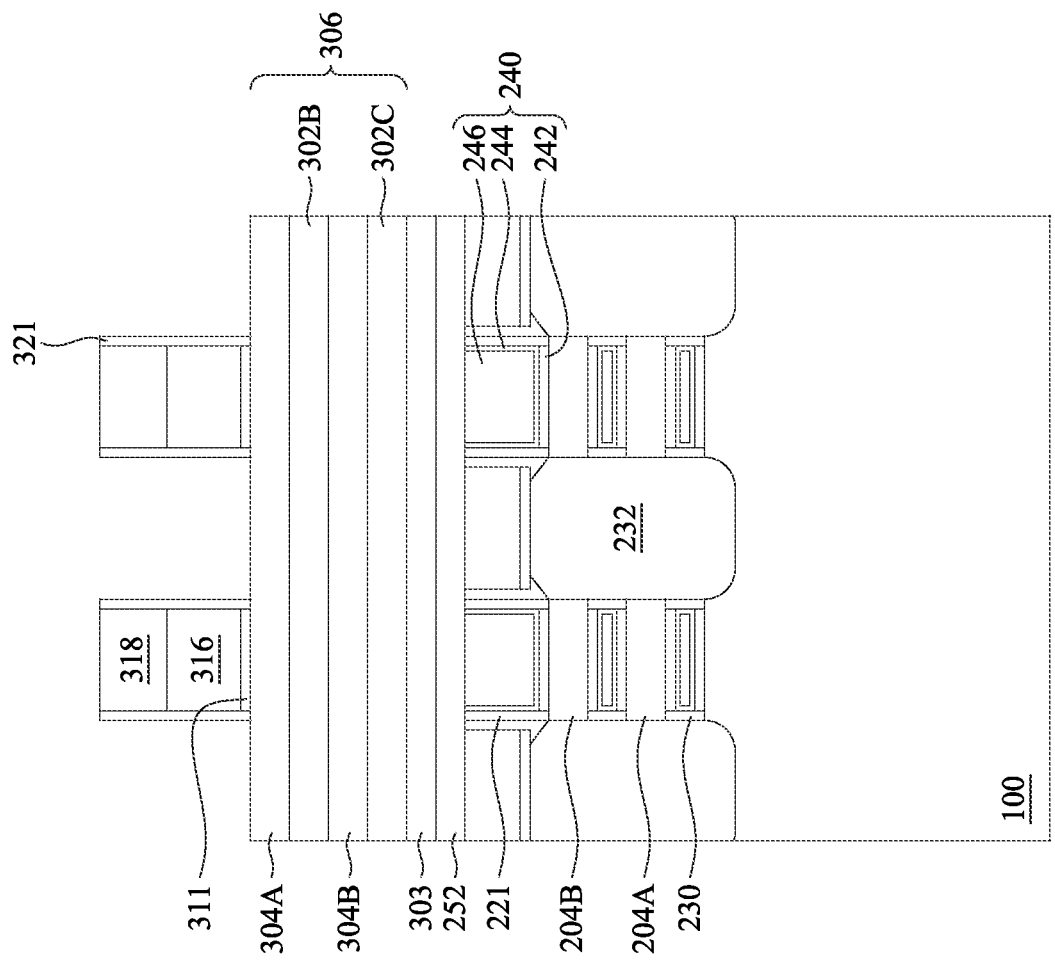
Figure 26A:
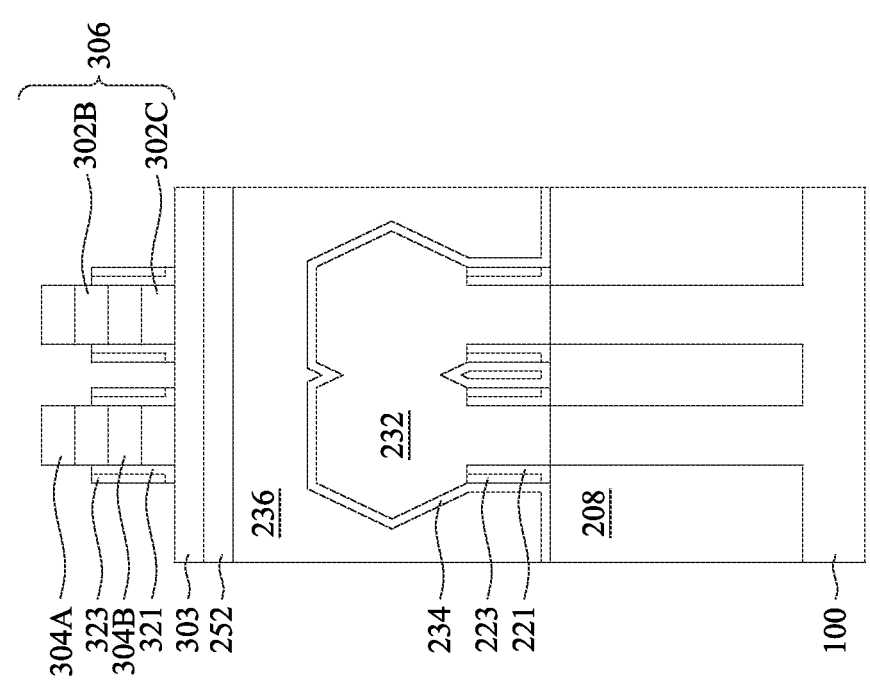

In FIGS. 26A and 26B, the first spacer layer 320 and the second spacer layer 322 are etched to form first spacers 321 and second spacers 323. As will be discussed in greater detail below, the first spacers 321 and the second spacers 323 act to self-align subsequently formed source and drain regions (collectively referred to as source/drain regions), as well as to protect sidewalls of the fin structures 306 during subsequent processing. The first spacer layer 320 and the second spacer layer 322 may be etched using a suitable etching process, such as an isotropic etching process (e.g., a wet etching process), an anisotropic etching process (e.g., a dry etching process), or the like. In some embodiments, the material of the second spacer layer 322 has a different etch rate than the material of the first spacer layer 320, such that the first spacer layer 320 may act as an etch stop layer when patterning the second spacer layer 322 and such that the second spacer layer 322 may act as a mask when patterning the first spacer layer 320. For example, the second spacer layer 322 may be etched using an anisotropic etch process wherein the first spacer layer 320 acts as an etch stop layer, wherein remaining portions of the second spacer layer 322 form second spacers 323 as illustrated in FIG. 26A. Thereafter, the second spacers 323 acts as a mask while etching exposed portions of the first spacer layer 320, thereby forming first spacers 321 as illustrated in FIG. 26A.

As illustrated in FIG. 26A, the first spacers 321 and the second spacers 323 are disposed on sidewalls of the fin structures 306. In some embodiments, the spacers 321 and 323 only partially remain on sidewalls of the fin structures 306. In some embodiments, no spacer remains on sidewalls of the fin structures 306. As illustrated in FIG. 26B, in some embodiments, the second spacer layer 322 may be removed from over the first spacer layer 320 adjacent the masks 318, the dummy gates 316, and the dummy gate dielectrics 311, and the first spacers 321 are disposed on sidewalls of the masks 318, the dummy gates 316, and the dummy dielectric layers 311. In other embodiments, a portion of the second spacer layer 322 may remain over the first spacer layer 320 adjacent the masks 318, the dummy gates 316, and the dummy gate dielectrics 311.

In some embodiments, the first spacers 321 on gate sidewalls (also called gate spacers) have a small thickness (e.g., in a range from about 1 nm to about 10 nm) so as to reduce gate-to-gate pitch without significant reduction in source/drain region size. In some embodiments, the first spacers 321 on gate sidewalls is formed of as low-dielectric constant (low-k) materials (e.g., porous silicon oxide) having a k-value, for example, less than about 3.5. The low-k material can aid in reducing parasitic capacitance between, for example, the subsequently formed metal gates and source/drain contacts.

The above disclosure generally describes a process of forming spacers. Other processes and sequences may be used. For example, fewer or additional spacers may be utilized, different sequence of steps may be utilized (e.g., the first spacers 321 may be patterned prior to depositing the second spacer layer 322), additional spacers may be formed and removed, and/or the like.

Figure 27A:
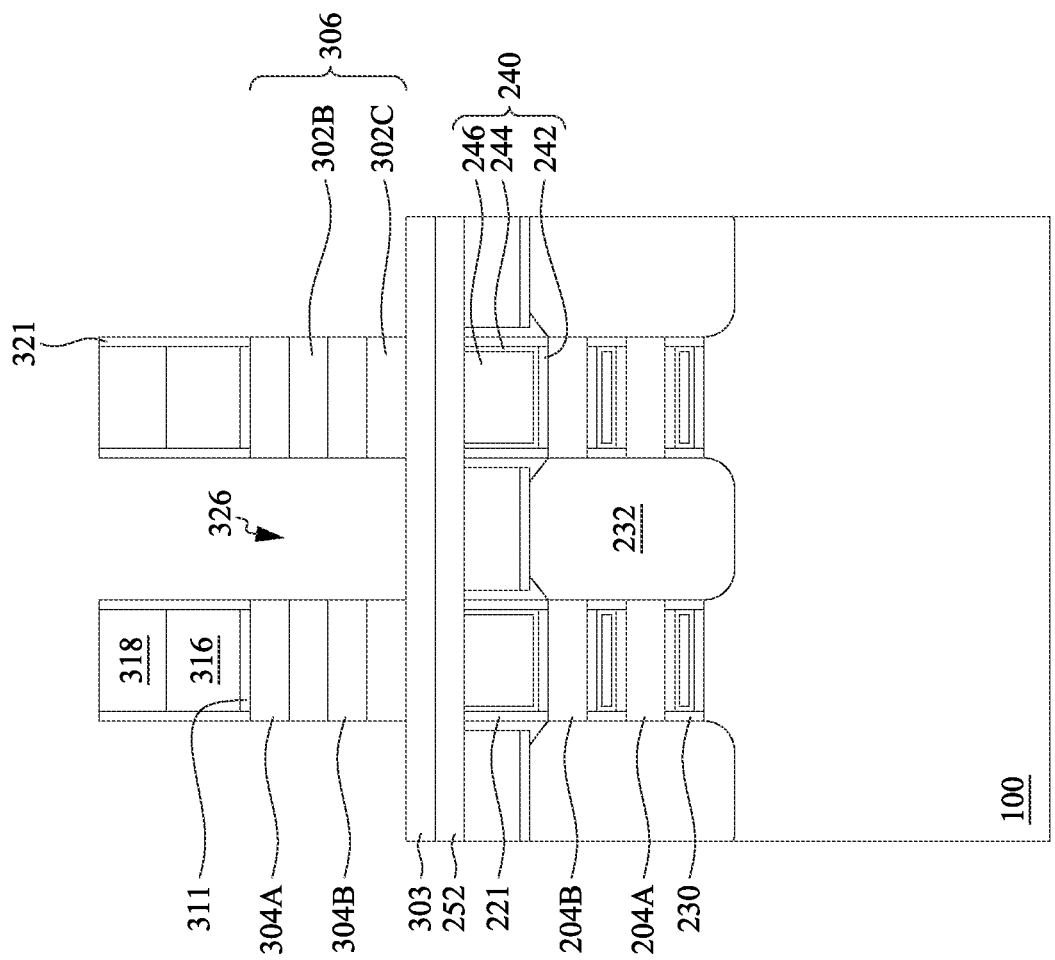
Figure 27B:
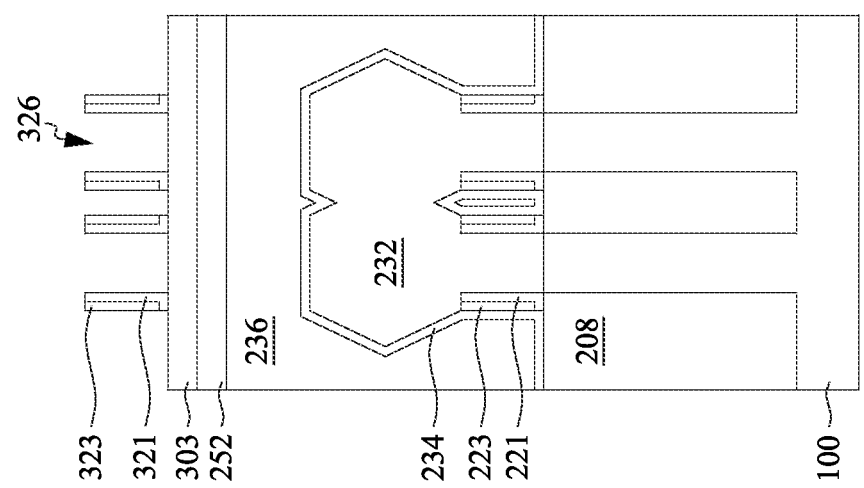

In FIGS. 27A and 27B, source/drain recesses 326 are formed in the fin structures 306, in accordance with some embodiments. Epitaxial source/drain regions will be subsequently formed in the source/drain recesses 326. The source/drain recesses 326 may extend through the first nanostructures 302 and the second nanostructures 304. As illustrated in FIG. 27A, bottom surfaces of the source/drain recesses 326 may be level with top surfaces of the bonding dielectric layer 303, as an example. In some other embodiments, the bonding dielectric layer 303 may be etched such that bottom surfaces of the source/drain recesses 326 are disposed below the top surface of the bonding dielectric layer 303, or above the top surface of bonding dielectric layer 303. The source/drain recesses 326 may be formed by etching the fin structures 306 using anisotropic etching processes, such as RIE, NBE, or the like. The first spacers 321, the second spacers 323, and the masks 318 mask portions of the fin structures 306 during the etching processes used to form the source/drain recesses 326. A single etch process or multiple etch processes may be used to etch each layer of the fin structures 306. Timed etch processes may be used to stop the etching of the source/drain recesses 326 after the source/drain recesses 326 reach a target depth.

Figure 28B:
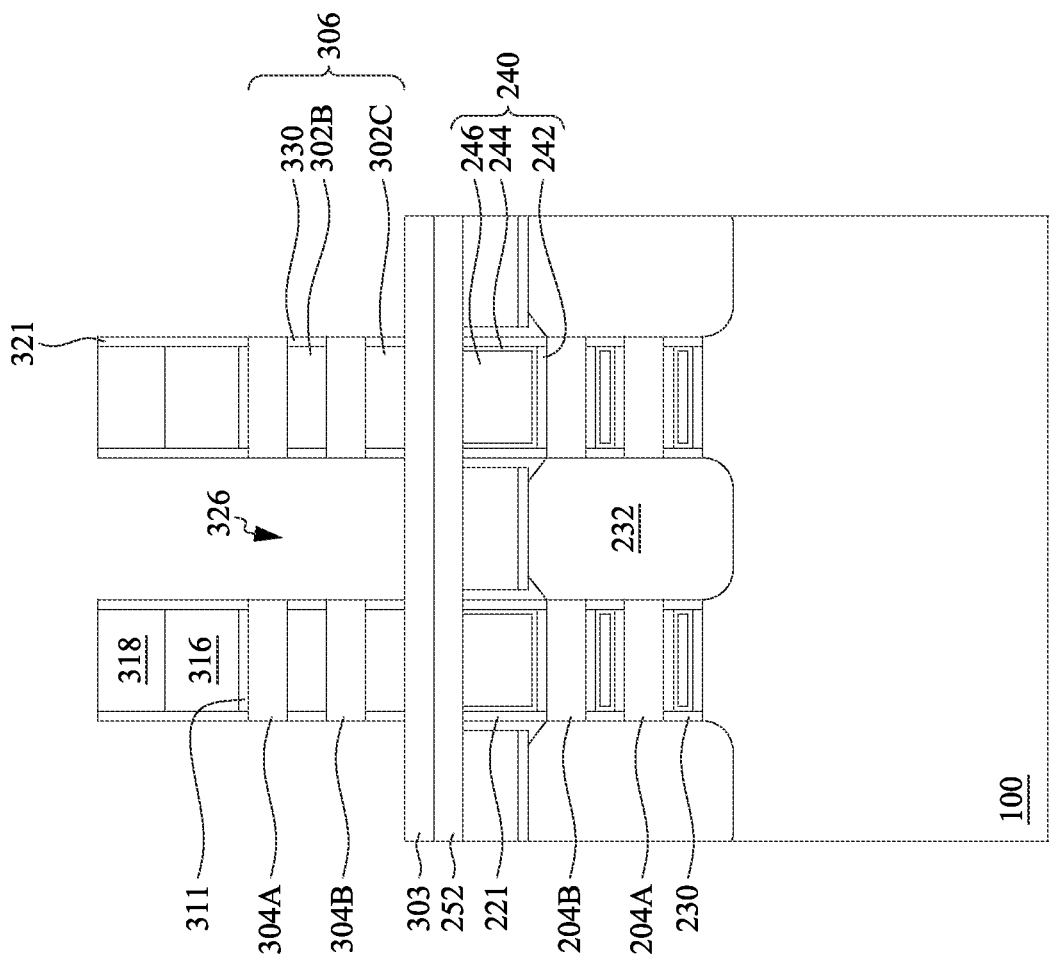
Figure 28A:
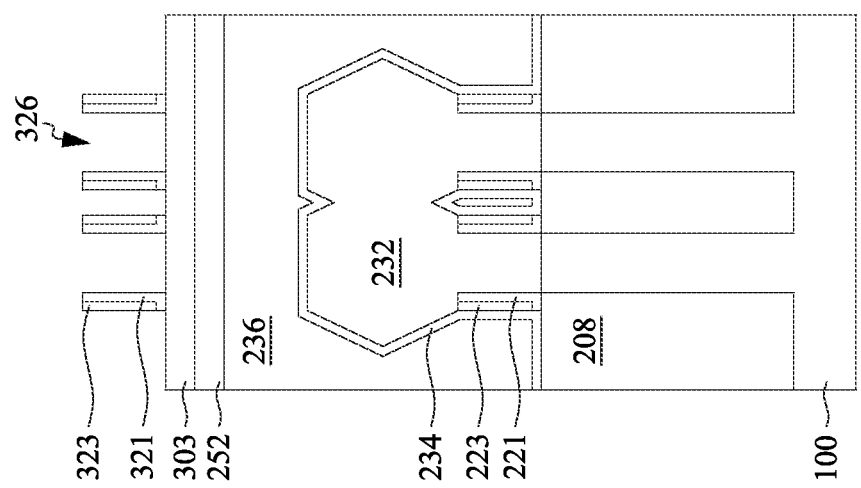
Figure 28C:
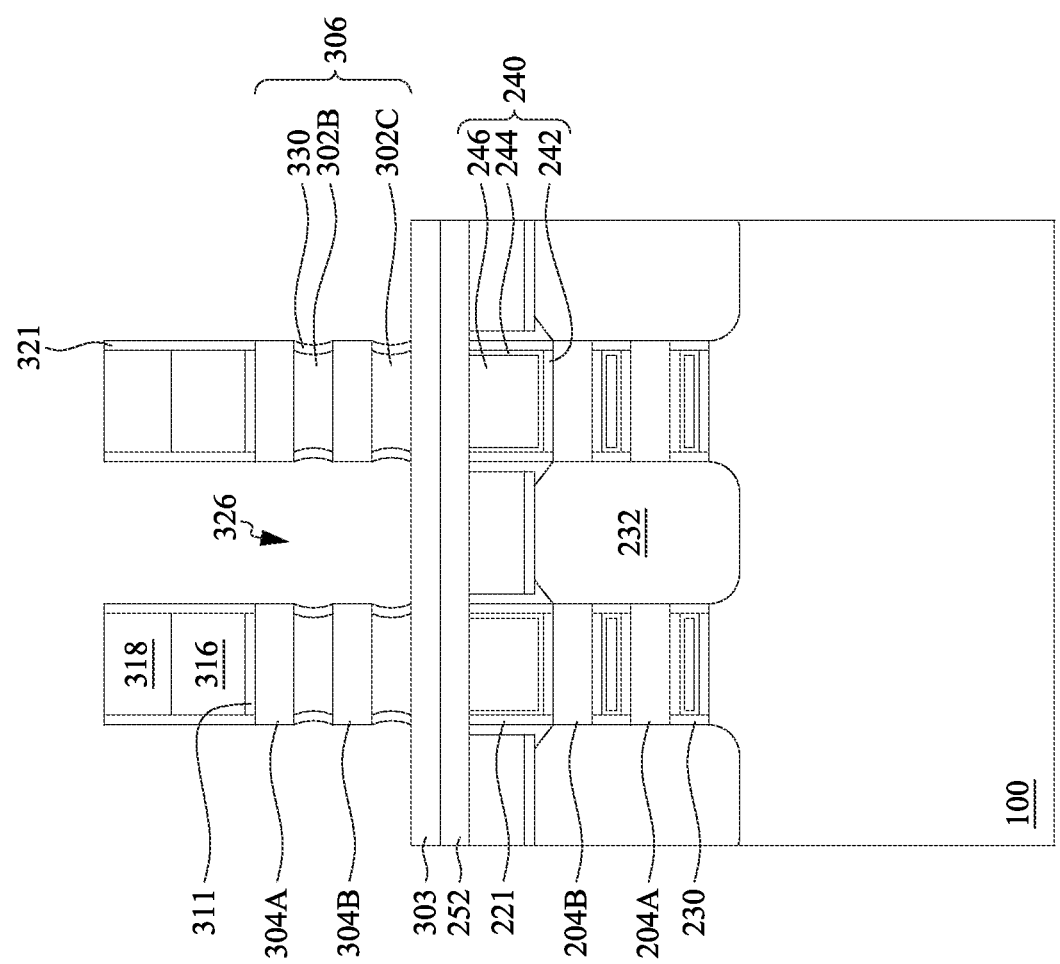

In FIGS. 28A-28C, portions of sidewalls of the layers of the fin structures 306 formed of the first semiconductor materials (e.g., the first nanostructures 302) exposed by the source/drain recesses 326 are etched to form sidewall recesses between corresponding second nanostructures 304. Inner spacers 330 are then formed in the sidewall recesses. The inner spacers 330 act as isolation features between subsequently formed source/drain regions and gate structure. As will be discussed in greater detail below, source/drain regions will be formed in the recesses 326, and the first nanostructures 302 will be replaced with corresponding gate structures. In some embodiments, the inner spacers 330 can be formed by, for example, depositing an inner spacer layer in the sidewall recesses in the fin structures 306, followed by etching the inner spacer layer using, for example, an anisotropic etching process, such as RIE, NBE, or the like. Moreover, although the outer sidewalls of the inner spacers 330 are illustrated as being straight in FIG. 28B, the outer sidewalls of the inner spacers 330 may be concave or convex. As an example, FIG. 28C illustrates an embodiment in which sidewalls of the first nanostructures 302 are concave, outer sidewalls of the inner spacers 330 are concave, and the inner spacers are recessed from sidewalls of the second nanostructures 304.

Figure 29B:
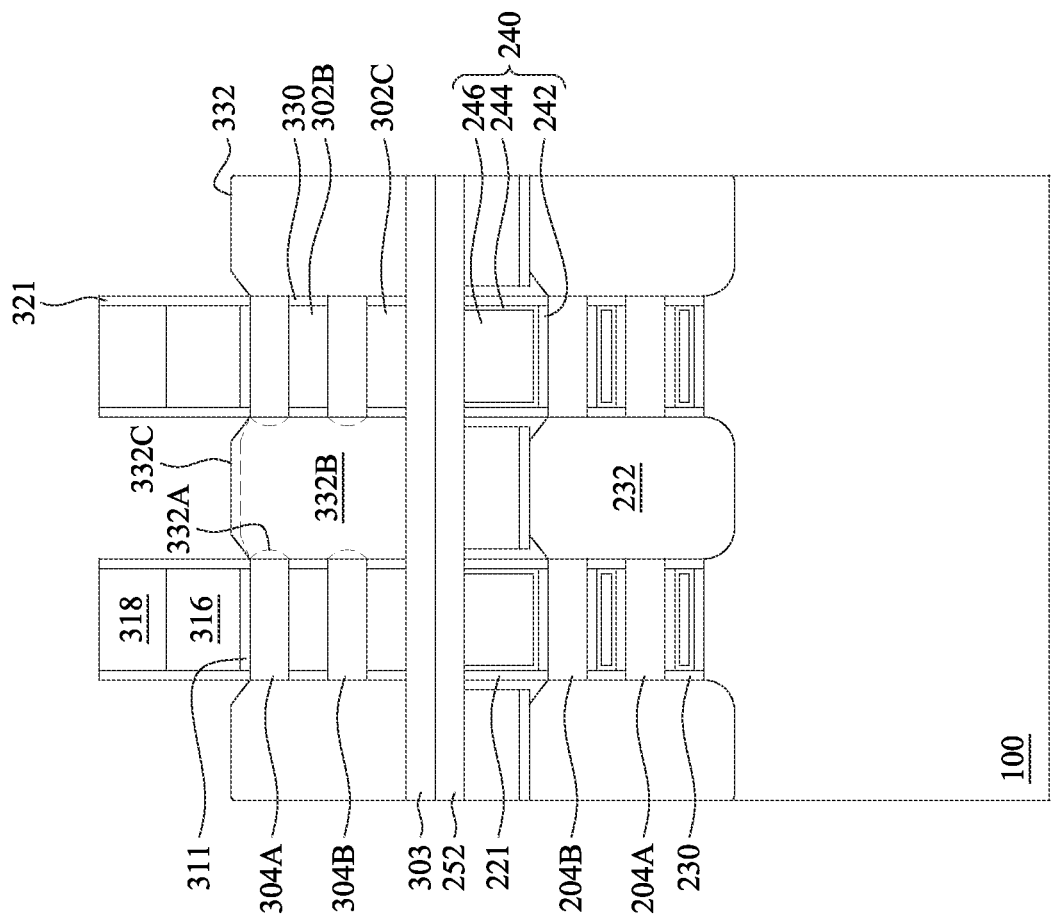
Figure 29A:
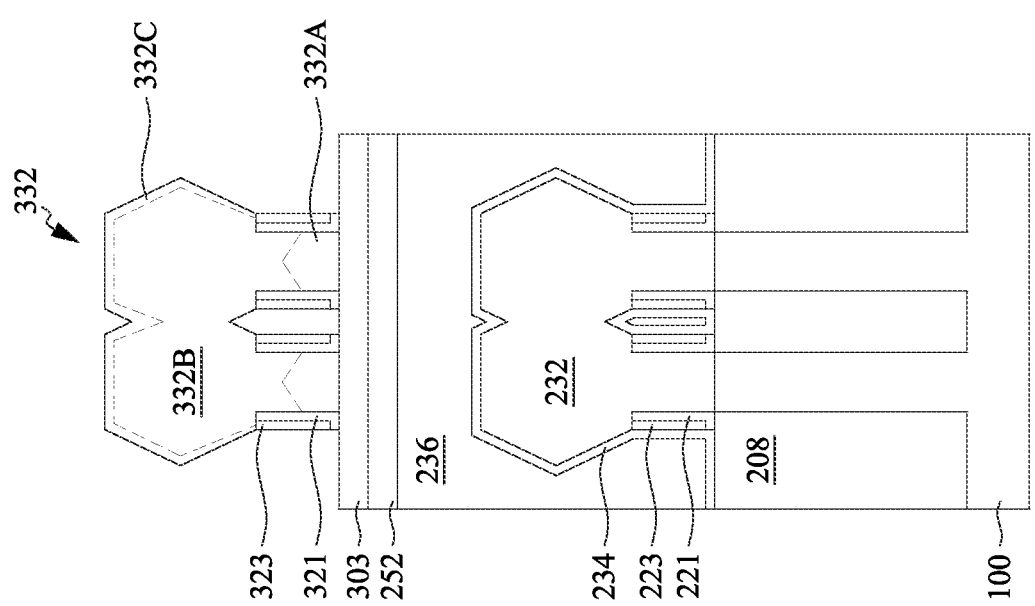

In FIGS. 29A-29C, epitaxial source/drain regions 332 are formed in the source/drain recesses 326. In some embodiments, the source/drain regions 332 may exert stress on the second nanostructures 304, thereby improving device performance. As illustrated in FIG. 29B, the epitaxial source/drain regions 332 are formed in the source/drain recesses 326 such that each dummy gate 316 is disposed between respective neighboring pairs of the epitaxial source/drain regions 332. In some embodiments, the first spacers 321 are used to separate the epitaxial source/drain regions 332 from the dummy gates 312, and the inner spacers 330 are used to separate the epitaxial source/drain regions 332 from the first nanostructures 302 by an appropriate lateral distance so that the epitaxial source/drain regions 332 do not short out with subsequently formed gates of the resulting top GAA-FETs.

In some embodiments, the epitaxial source/drain regions 332 may include any acceptable material appropriate for p-type GAA-FETs. For example, if the second nanostructures 304 are Ge, the epitaxial source/drain regions 332 may comprise materials exerting a compressive strain on the second nanostructures 304, such as SiGe with a higher germanium concentration than the Ge-based channel. The epitaxial source/drain regions 332 may have surfaces raised from respective upper surfaces of the nanostructures 304 and may have facets. In some embodiments, the epitaxial source/drain regions 332 may include any acceptable material appropriate for n-type GAA-FETs. For example, if the second nanostructures 304 are Ge, the epitaxial source/drain regions 332 may include materials exerting a tensile strain on the second nanostructures 304, such as SiGe with a lower germanium concentration than the Ge-based channel.

The epitaxial source/drain regions 332 may be implanted with dopants to form source/drain regions, followed by an anneal process. The source/drain regions may have an impurity concentration of between about $1 \times 10^{17}$ atoms/cm$^3$ and about $1 \times 10^{22}$ atoms/cm$^3$. The n-type and/or p-type impurities for source/drain regions may be any of the impurities previously discussed. In some embodiments, the epitaxial source/drain regions 332 may be in situ doped during growth. In some embodiments where the epitaxial source/drain regions 332 are doped with a p-type dopant (e.g., boron), the top GAA-FETs can serve as p-type transistors. In some embodiments where the epitaxial source/drain regions 332 are doped with an n-type dopant (e.g., phosphorus, arsenic, antimony), the top GAA-FETs can serve as n-type transistors. In some embodiments, the epitaxial source/drain regions 332 are of a conductivity type different from a conductivity type the epitaxial source/drain regions 232, and thus the top GAA-FETs are of a conductivity type different from a conductivity type of the bottom GAA-FETs, which enables the formation of a CFET structure.

As a result of the epitaxy processes used to form the epitaxial source/drain regions 332, upper surfaces of the epitaxial source/drain regions 332 have facets which expand laterally outward beyond sidewalls of the nanostructures 303. In some embodiments, these facets cause adjacent epitaxial source/drain regions 332 to merge as illustrated by FIG. 29A. In some other embodiments, adjacent epitaxial source/drain regions 332 remain separated after the epitaxy process is completed as illustrated by FIG. 29C. In the embodiments illustrated in FIGS. 29A and 29C, the first spacers 321, 323 may be formed to a top surface of the bonding dielectric layer 303 thereby blocking the lateral epitaxial growth. In some other embodiments, the spacer etch used to form the first spacers 321, 323 may be adjusted to remove the spacer material to allow the epitaxially grown region to extend to the surface of the bonding dielectric layer 303.

The epitaxial source/drain regions 332 may comprise one or more semiconductor material layers. For example, the epitaxial source/drain regions 332 may comprise a first semiconductor material layer 332A, a second semiconductor material layer 332B, and a third semiconductor material layer 332C, which are distinguished in FIGS. 29A and 29B by using dash lines. Any number of semiconductor material layers may be used for the epitaxial source/drain regions 332. Each of the first semiconductor material layer 332A, the second semiconductor material layer 332B, and the third semiconductor material layer 332C may be formed of different semiconductor materials and may be doped to different dopant concentrations. In some embodiments, the first semiconductor material layer 332A may have a dopant concentration less than the second semiconductor material layer 332B and greater than the third semiconductor material layer 332C. In embodiments in which the epitaxial source/drain regions 332 comprise three semiconductor material layers, the first semiconductor material layer 332A may be deposited, the second semiconductor material layer 332B may be deposited over the first semiconductor material layer 332A, and the third semiconductor material layer 332C may be deposited over the second semiconductor material layer 332B.

Figure 30B:
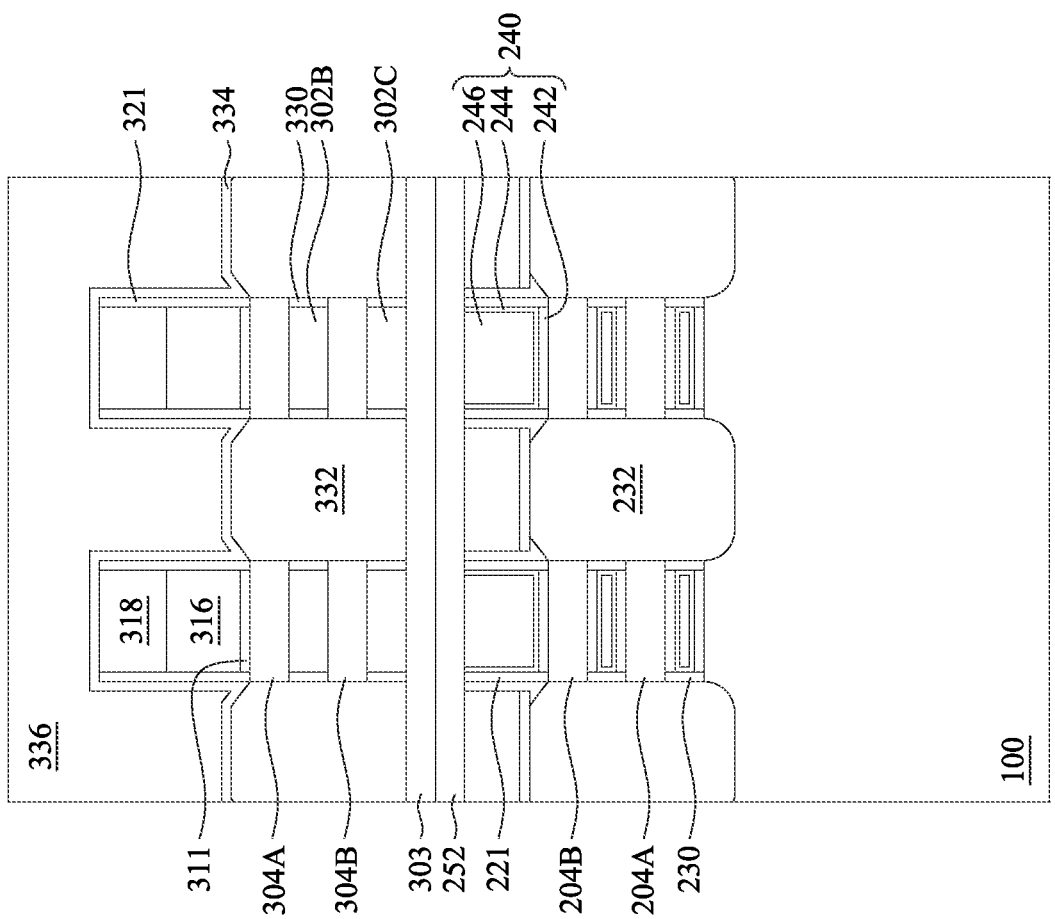
Figure 30A:
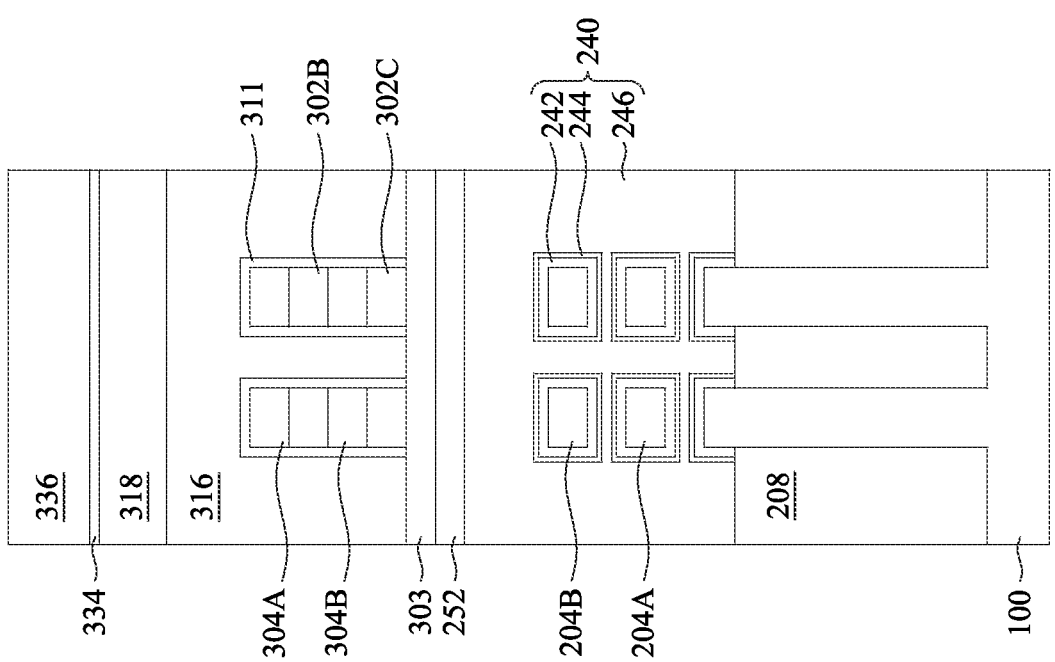
Figure 30C:
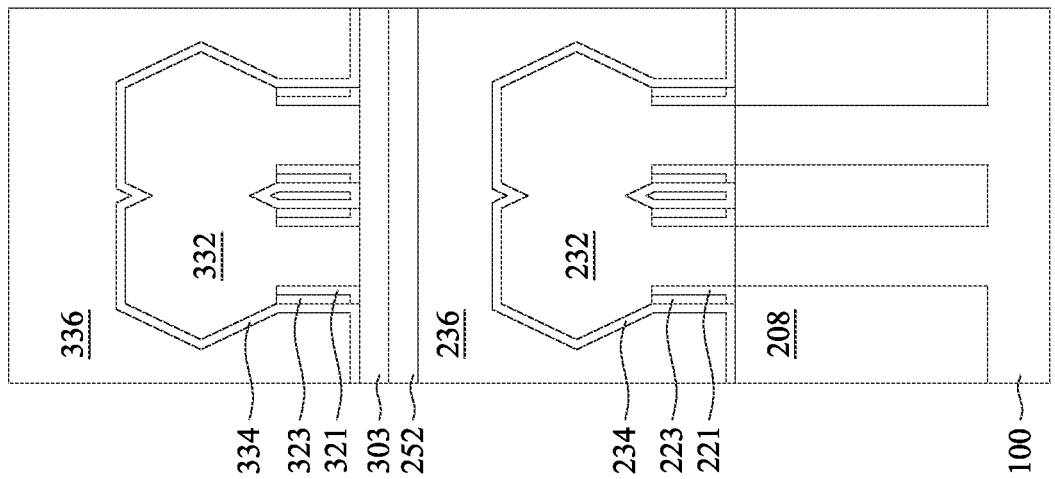

In FIGS. 30A-30C, an interlayer dielectric (ILD) layer 336 is deposited over the structure illustrated in FIGS. 29A-29C. The ILD layer 336 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 334 is disposed between the ILD layer 336 and the epitaxial source/drain regions 332, the masks 318, and the first spacers 321. The CESL 334 may comprise a dielectric material, such as, SiN, $SiO_x$, SiCN, SiON, SiOCN, $Al_2O_3$, $HfO_2$, $ZrO_2$, $HfAlO_x$, and $HfSiO_x$, or the like, having a different etch rate than the material of the overlying ILD layer 336.

Figure 31B:
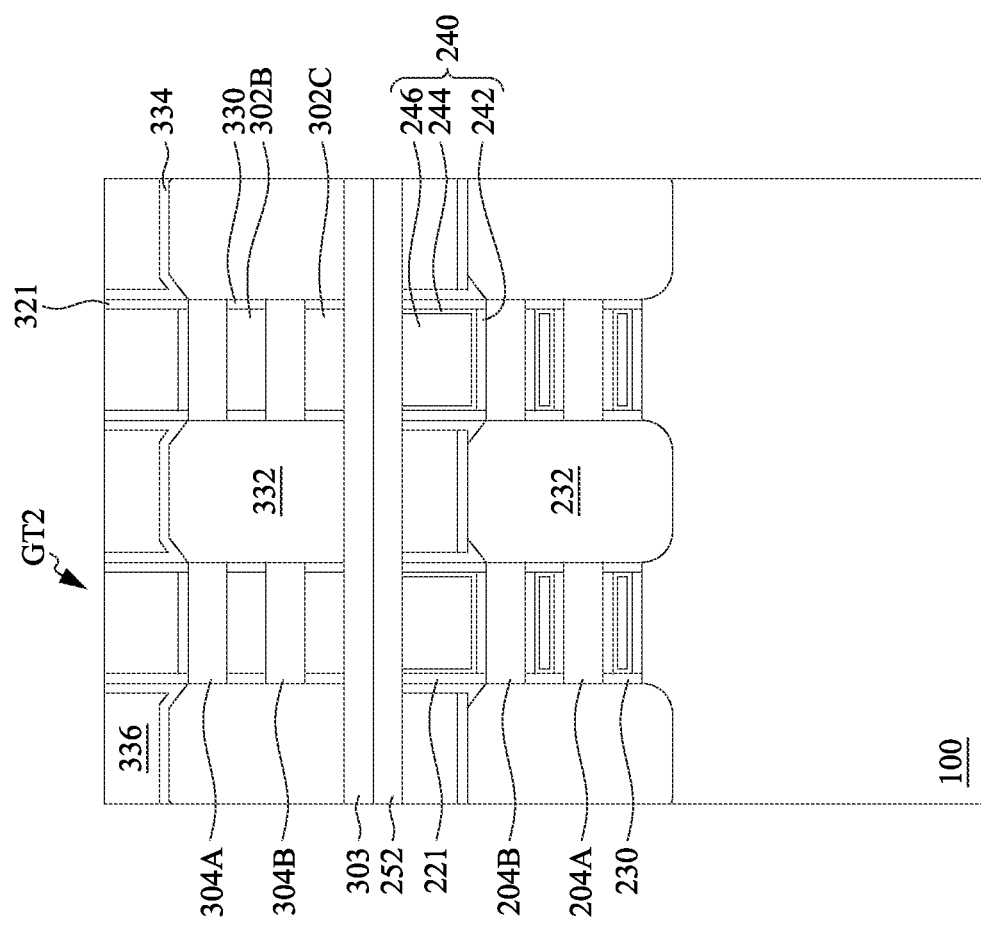
Figure 31A:
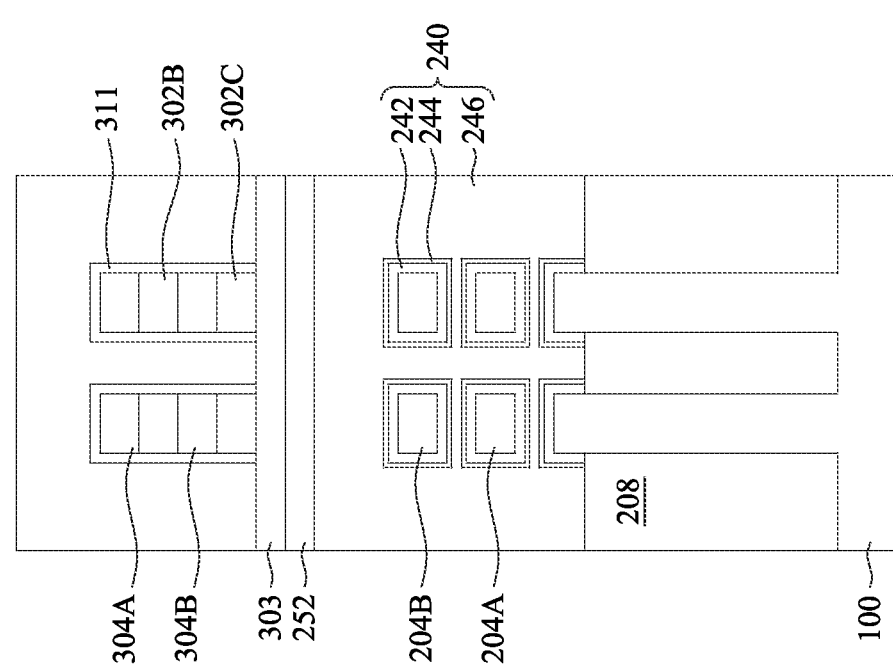

In FIGS. 31A-31B, a planarization process, such as a CMP, may be performed to level the top surface of the ILD layer 336 with the top surfaces of the dummy gates 316 or the masks 318. The planarization process may also remove the masks 318 on the dummy gates 316, and portions of the first spacers 321 along sidewalls of the masks 318. After the planarization process, top surfaces of the dummy gates 316, the first spacers 321, and the ILD layer 336 are level within process variations. Accordingly, the top surfaces of the dummy gates 316 are exposed through the ILD layer 336. In some embodiments, the masks 318 may remain, in which case the planarization process levels the top surface of the ILD layer 336 with top surface of the masks 318 and the first spacers 321.

In FIGS. 32A and 32B, the dummy gates 316, and the masks 318 if present, are removed in one or more etching steps, so that gate trenches GT2 are formed between corresponding gate spacers 321. In some embodiments, portions of the dummy gate dielectrics 311 in the gate trenches GT2 are also be removed. In some embodiments, the dummy gates 316 and the dummy gate dielectrics 311 are removed by an anisotropic dry etch process. For example, the etching process may include a dry etch process using reaction gas(es) that selectively etch the dummy gates 316 at a faster rate than the first spacers 321. Each gate trench GT2 exposes and/or overlies portions of nanostructures 304, which will serve as channel regions in subsequently completed GAA-FETs. The nanostructures 304 serving as the channel regions are disposed between neighboring pairs of the epitaxial source/drain regions 332. During the removal, the dummy dielectric layers 311 may be used as etch stop layers when the dummy gates 316 are etched. The dummy dielectric layers 311 may then be removed after the removal of the dummy gates 316.

Figure 33B:
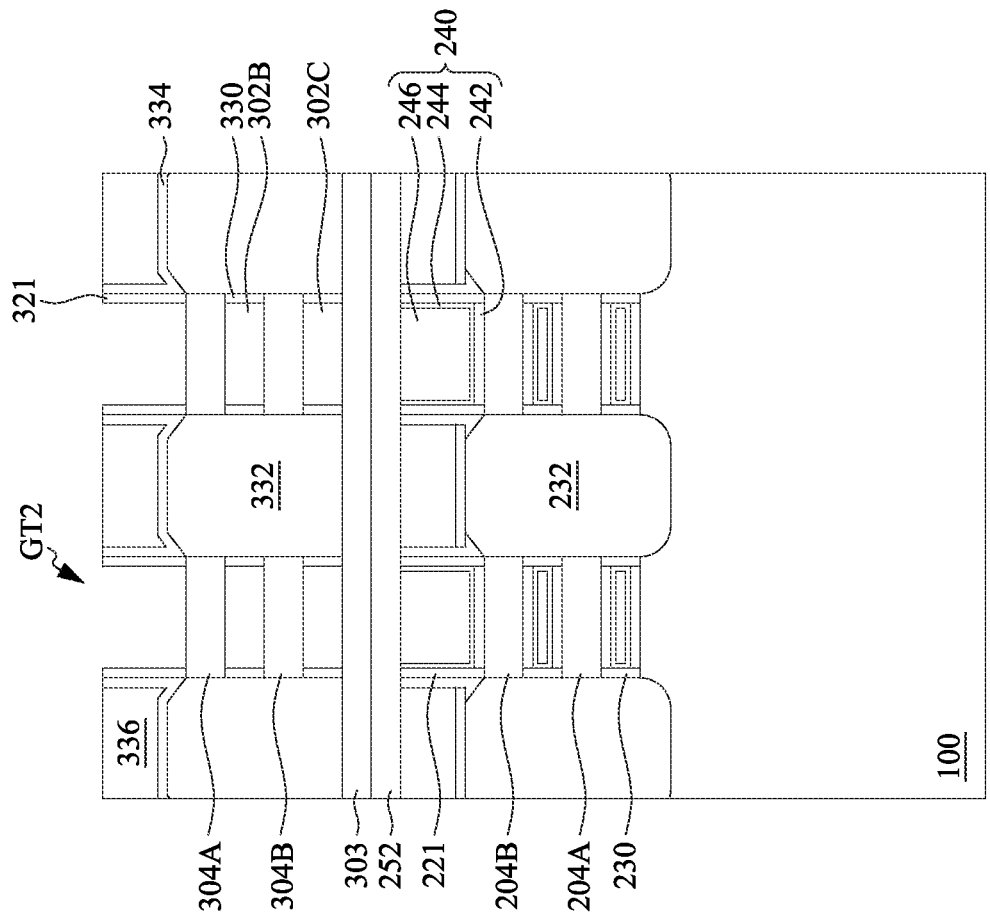
Figure 33A:
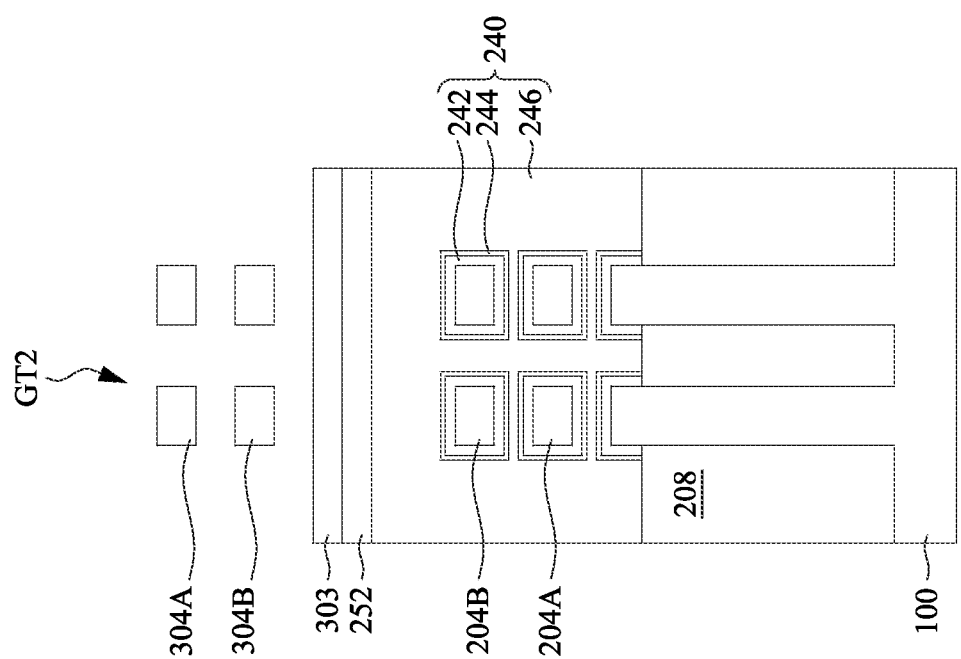
Figure 34C:
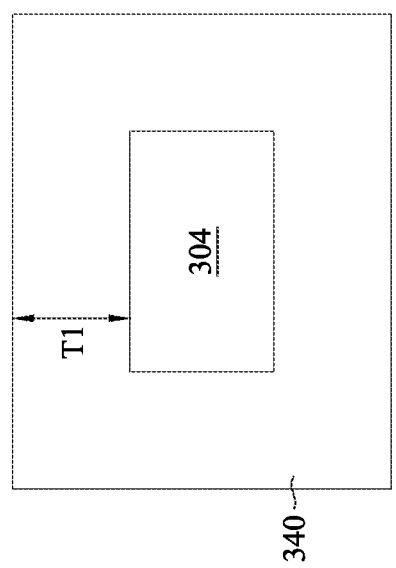

In FIGS. 33A and 33B, the first nanostructures 302 in the gate trenches GT2 are removed by an isotropic etching process such as wet etching or the like using etchants which are selective to the materials of the first nanostructures 302. Stated differently, the first nanostructures 302 are removed by using a selective etching process that etches the first nanostructures 302 at a faster etch rate than it etches the second nanostructures 304, thus forming spaces between the second nanostructures 304 (also referred to as sheet-to-sheet spaces if the nanostructures 304 are nanosheets). This step can be referred to as a channel release process. At this interim processing step, the spaces between second nanostructures 304 may be filled with ambient environment conditions (e.g., air, nitrogen, etc). In some embodiments, the second nanostructures 304 can be referred to as nanosheets, nanowires, nanoslabs, nanorings having nanoscale size (e.g., a few nanometers), depending on their geometry. For example, in some embodiments the second nanostructures 304 may be trimmed to have a substantial rounded shape (i.e., cylindrical) due to the selective etching process for completely removing the first nanostructures 302. In that case, the resultant second nanostructures 304 can be called nanowires. In some embodiments, the second nanostructures 304 are interchangeably referred to as Ge-based or Ge-containing nanostructures as it includes Ge-based or Ge-containing materials.

In embodiments in which the first nanostructures 302 include, e.g., silicon germanium, and the second nanostructures 304 include, e.g., pure germanium, a selective etching process, such as wet etching with a solution of hydrogen peroxide ($H_2O_2$) and hydrofluoric acid (HF) or another appropriate etchant, may be used to remove the first nanostructures 302. In embodiments in which the first nanostructures 302 include, e.g., pure germanium, and the second nanostructures 304 include, e.g., silicon germanium, a selective etching process, such as wet etching with a solution of hydrogen peroxide ($H_2O_2$) and hydrochloric acid (HCl) or another appropriate etchant, may be used to remove the first nanostructures 302. In embodiments in which the first nanostructures 302 include, e.g., pure germanium, and the second nanostructures 304 include, e.g., germanium tin, a selective etching process, such as wet etching with a solution of hydrogen peroxide ($H_2O_2$) and hydrofluoric acid (HF) or another appropriate etchant that selectively removes pure germanium over germanium tin, may be used to remove the first nanostructures 302.

In FIGS. 34A-34C, interfacial layers 340 are respectively formed on the Ge-based nanostructures 304. Each interfacial layer 340 may comprise germanium oxide ($GeO_2$) grown from the respective Ge-based nanostructure 304. The growth of the germanium oxide interfacial layers 340 can be achieved using various oxidation techniques, such as thermal oxidation, plasma oxidation, or ozone-based oxidation. In some embodiments, germanium oxide interfacial layers serve for reducing interface trap densities at the interface between Ge-based nanostructures 304 and other layers, such as a high-k dielectric layer formed in subsequent processing. Interface trap densities may impact the performance and reliability of GAA-FETs, particularly in terms of carrier mobility and threshold voltage stability. Germanium oxide has a unique ability to reduce interface trap densities due to its compatibility with Ge-based materials and its stable interface formation. The formation of germanium oxide interfacial layer 340 on the Ge-based nanostructures 304 promotes the passivation of dangling bonds and other defects at the interface. This passivation allows for minimizing the number of interface traps and creating a smoother, more uniform interface. The reduction of interface trap densities by the germanium oxide interfacial layers 340 can lead to several advantages for the GAA-FETs, such as, improved carrier mobility lower gate leakage current, or the like.

As illustrated in FIG. 34C, each germanium oxide interfacial layer 340 encloses four sides of a corresponding Ge-based nanostructure 304 when viewed in a cross-section taken along a gate lengthwise direction. The germanium oxide interfacial layer 340 has a thickness T1, which is controlled to ensure that a remaining portion of the germanium oxide interfacial layer 340 after subsequent nitridation processing remains sufficiently thick for reducing interface trap densities. The controlled thickness T1 can be can be achieved by adjusting the oxidation time, temperature, and/or the oxidation environment during the growth of the germanium oxide interfacial layers 340.

Figure 35B:
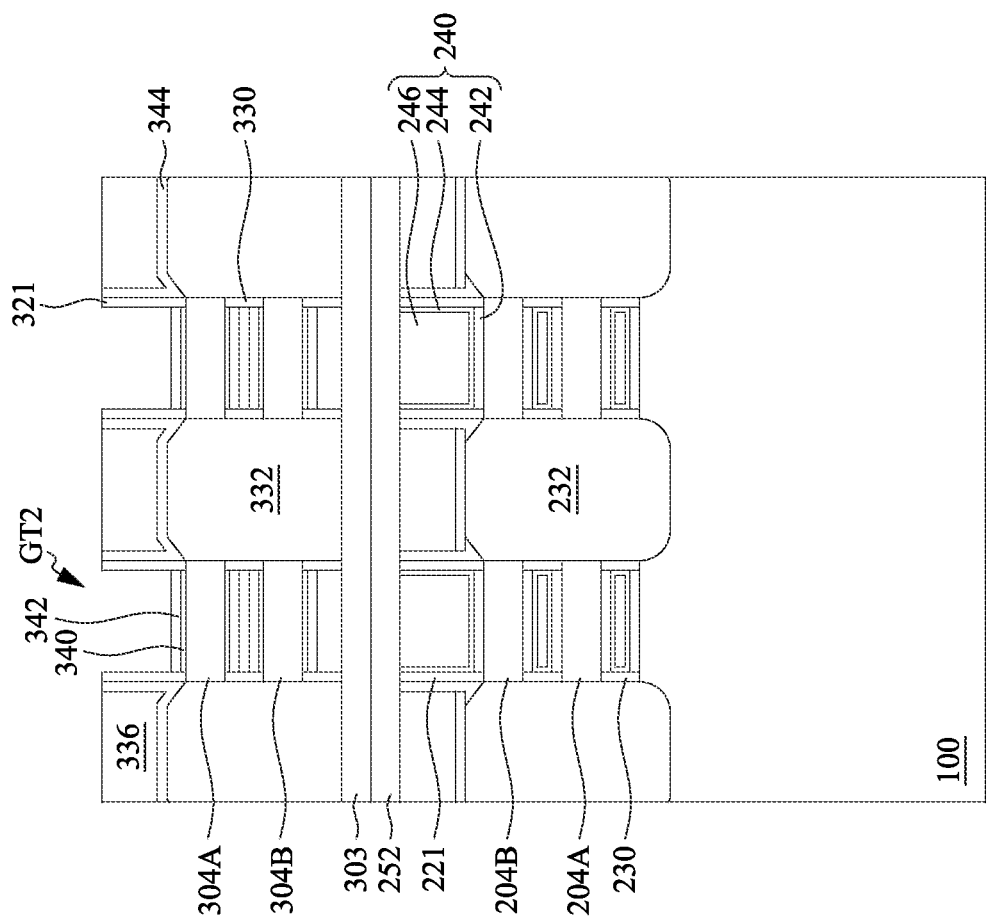
Figure 35A:
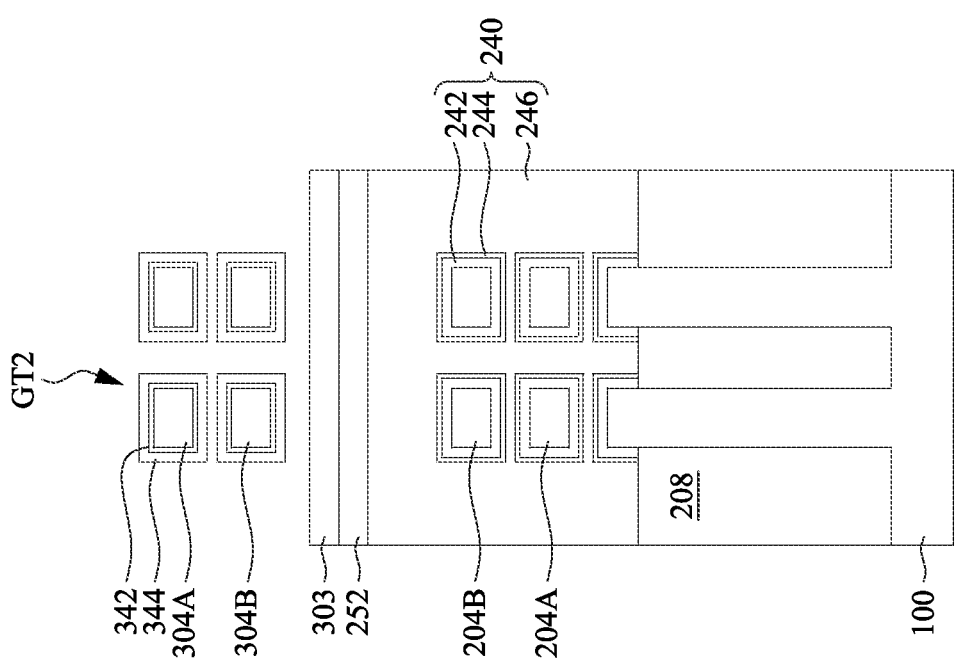
Figure 35C:
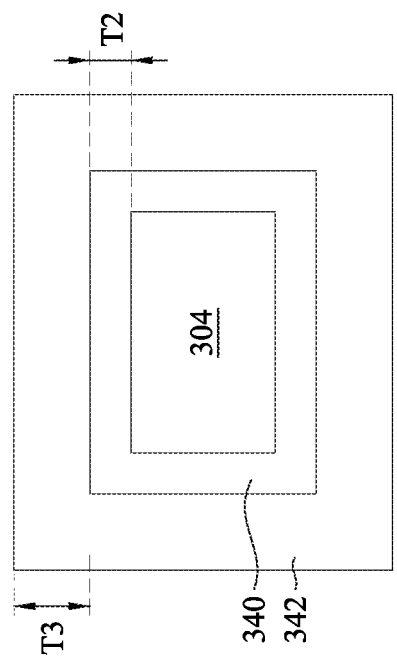
Figure 36B:
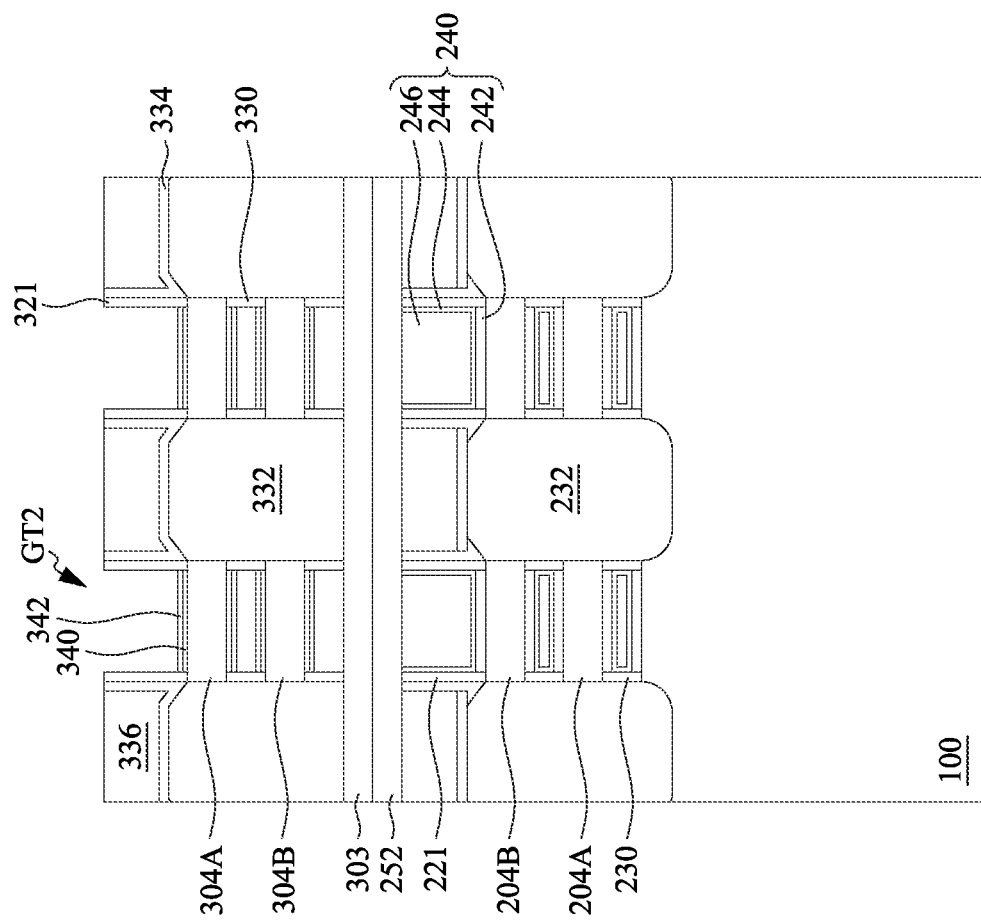

In FIGS. 35A-35C, a nitridation treatment is performed on the germanium oxide interfacial layers 340 to covert a surface layer of each germanium oxide interfacial layer into a germanium oxynitride layer 342. The nitridation treatment can be carried out using various techniques such as plasma nitridation, thermal nitridation, or exposure to a nitrogen-containing gas, such as ammonia ($NH_3$) or nitrogen ($N_2$) gas, at an elevated temperature. This nitridation process introduces nitrogen atoms into the germanium oxide interfacial layers 340, thereby transforming the surface layer of each germanium oxide interfacial layer 340 into a germanium oxynitride layer 342. Thus, the germanium oxynitride layer 342 can be interchangeably referred to as a nitrogen-containing layer. The germanium oxynitride layer 342 provides enhanced stability and a barrier against intermixing with the subsequently deposited high-k dielectric material, while maintaining the benefits of reduced interface trap densities associated with the germanium oxide interfacial layers 340. In some embodiments, the nitridation treatment can be in-situ or ex-situ with formation of the germanium oxide interacial layers 340. In some embodiments, the nitridation process may be performed at a temperature in a range from about 150° C. to about 500° C. and at a pressure in a range from about 1 torr to about 10 torr, depending on the specific nitridation technique employed.

As illustrated in FIG. 35C, after the nitridation process, the remaining germanium oxide interfacial layer 340 has a reduced thickness, denoted as T2, which is smaller than the initial thickness, T1, prior to the nitridation process. This reduction in thickness occurs due to the conversion of the surface layer of the germanium oxide interfacial layer 340 into the germanium oxynitride layer 342 during the nitridation process. The thickness reduction of the germanium oxide interfacial layer 340 (i.e., the difference between T1 and T2) depends on factors such as the nitridation process parameters, including nitridation temperature, nitridation time, gas flow rates, and the type of nitrogen-containing precursor used during the nitridation process. These factors influence the extent of conversion of the germanium oxide into germanium oxynitride, thus affecting the reduction in thickness of the germanium oxide interfacial layer 340.

As illustrated in FIG. 35C, each germanium oxynitride layer 342 encloses four sides of a corresponding germanium oxide interfacial layer 340 when viewed in a cross-section taken along a gate lengthwise direction. The germanium oxynitride layer 342 has a thickness T3, which is controlled to ensure enough barrier against intermixing with the subsequently deposited high-k dielectric material. This control of the thickness T3 helps maintain the desirable electrical properties and interface characteristics of the GAA-FETs while preventing unwanted diffusion or mixing between the germanium oxide interfacial layer 340 and the high-k dielectric material. The thickness T3 of the germanium oxynitride layer 342 depends on factors such as the nitridation process parameters, including nitridation temperature, nitridation time, gas flow rates, and the type of nitrogen-containing precursor used during the nitridation process. In the depicted embodiments, the thickness T3 of the germanium oxynitride layer 342 is greater than the thickness T2 of the germanium oxide interfacial layer 340. In some other embodiments, the thickness T3 of the germanium oxynitride layer 342 is less than the thickness T2 of the germanium oxide interfacial layer 340.

Figure 36A:
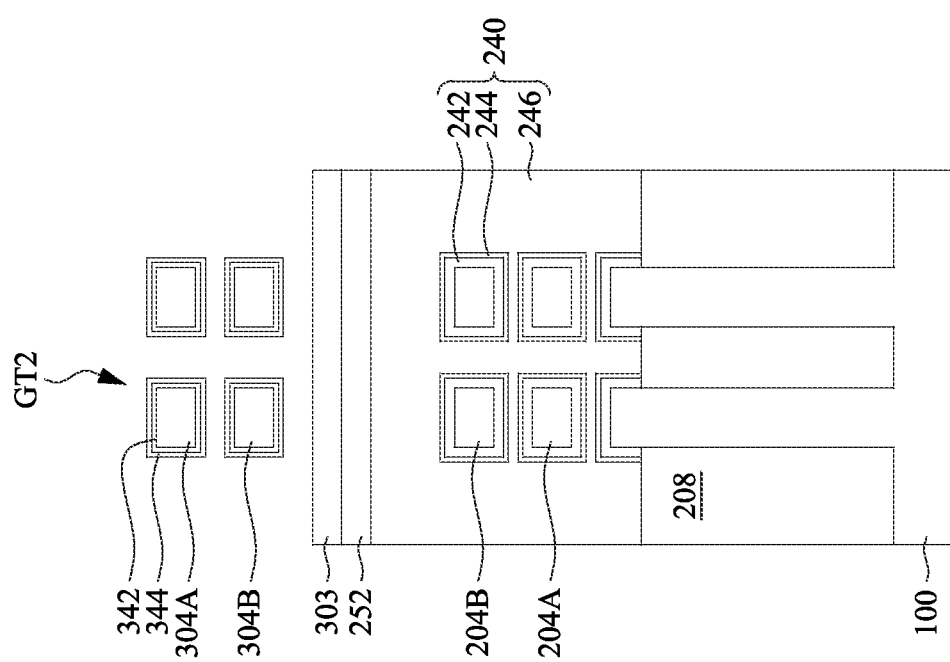

In FIGS. 36A-36C, a post-annealing process is performed to trigger GeO desorption from the germanium oxynitride layer 342, which in turn reduces a thickness of the germanium oxynitride layer 342. This desorption process is facilitated by the chemical reaction between germanium dioxide ($GeO_2$) and germanium (Ge) within the germanium oxynitride layer 342. The reaction can be represented as follows: $GeO_2(s) + Ge(s) \rightarrow 2\ GeO(g)$. In this reaction, solid germanium dioxide ($GeO_2$) reacts with solid germanium (Ge) to produce gaseous germanium monoxide (GeO). The formation of gaseous GeO results in the desorption of GeO from the germanium oxynitride layer 342, leading to a reduction in its thickness. The GeO desorption helps achieve further EOT scaling. In some embodiments, the post-annealing process can be in-situ or ex-situ with the foregoing nitridation treatment.

As illustrated in FIG. 36C, after the post-annealing treatment, the remaining germanium oxynitride layer 342 has a reduced thickness, denoted as T4, which is smaller than the initial thickness, T3 (as shown in FIG. 35C), prior to the post-annealing process. This reduction in thickness occurs due to the desorption of GeO from the germanium oxynitride layer 342 during the post-annealing process. The thickness reduction in the germanium oxynitride layer 342 depends on factors such as the temperature and duration of the post-annealing process, and the partial pressure of the GeO gas formed during the desorption process. By controlling the thickness reduction, the thickness T4 of the remaining germanium oxynitride layer 342 can reach a target value, which provides an adequate barrier against intermixing with the subsequently deposited high-k dielectric material. In depicted embodiments, the thickness T4 of the germanium oxynitride layer 342 is less than the thickness T3 of the germanium oxide layer 340. In some other embodiments, the thickness T4 of the germanium oxynitride layer 342 is greater than the thickness T3 of the germanium oxide layer 340. In some embodiments, a combined thickness of the germanium oxynitride layer 342 and the germanium oxide layer 340 is in a range from about 0.1 nm to about 1 nm. In some embodiments, the post-annealing process is performed at a temperature lower than about 500° C., making it suitable for EOT scaling engineering in fabricating the top device of a CFET. This is because high temperatures (e.g., exceeding about 550° C.) may degrade the electrical performance and/or reliability of the bottom transistor of the CFET.

After the post-annealing process, various gradient nitrogen concentration profiles can be observed within the germanium oxynitride layer 342. These gradient nitrogen concentration profiles are characterized by a gradual change in the nitrogen concentration as a function of thickness within the germanium oxynitride layer 342. This gradient in nitrogen concentration can be attributed to the nitridation process and the subsequent post-annealing process, which may lead to redistribution and desorption of nitrogen and germanium oxide species within the germanium oxynitride layer 342. These gradient nitrogen concentration profiles can be tailored by adjusting the parameters of the nitridation process, such as the duration, temperature, and pressure, as well as the post-annealing process conditions. By controlling these parameters, it is feasible to achieve desired nitrogen concentration profiles within the germanium oxynitride layer 342, which can further influence the electrical properties and the interfacial characteristics between the germanium oxynitride layer 342 and the high-k dielectric material.

FIG. 36D illustrates an example nitrogen concentration profile within the germanium oxynitide layer 342, wherein the nitrogen concentration increases from a top surface to a concentration peak at a position within the germanium oxynitide layer 342 and then decreases from the concentration peak to an interface between the germanium oxynitride layer 342 and the germanium oxide layer 340. FIG. 36E illustrates another example nitrogen concentration profile within the germanium oxynitride layer 342, wherein the nitrogen concentration decreases from a top surface to an interface between the germanium oxynitride layer 342 and the germanium oxide layer 340. In some embodiments, the nitrogen profile within the germanium oxynitride layer 342 can be observed using various analytical techniques such as energy-dispersive X-ray spectroscopy (EDS), electron energy loss spectroscopy (EELS), and secondary ion mass spectrometry (SIMS). These techniques enable the accurate determination of the nitrogen concentration and its distribution within the germanium oxynitride layer 342.

Figures 37A, 37B:
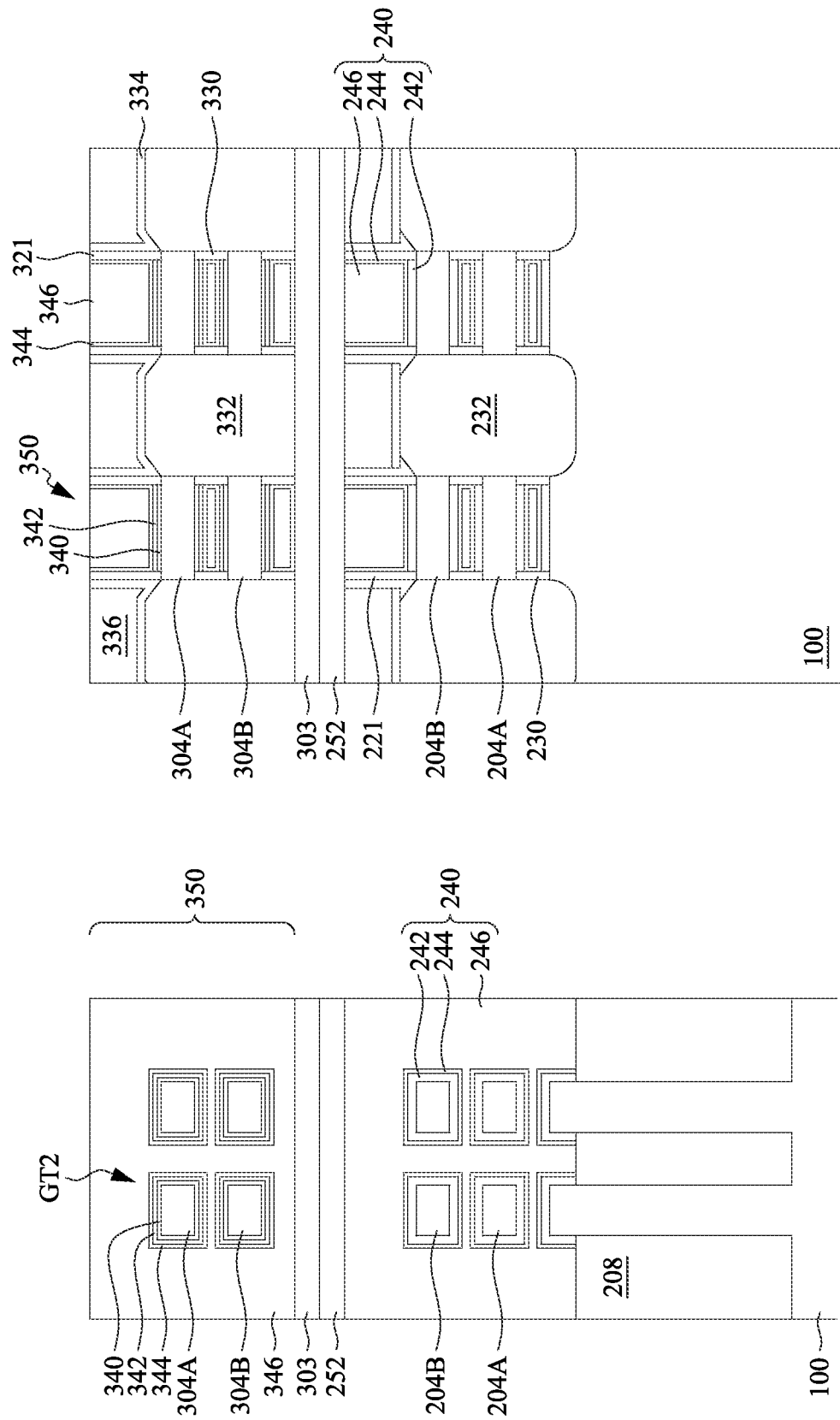
Figure 37C:
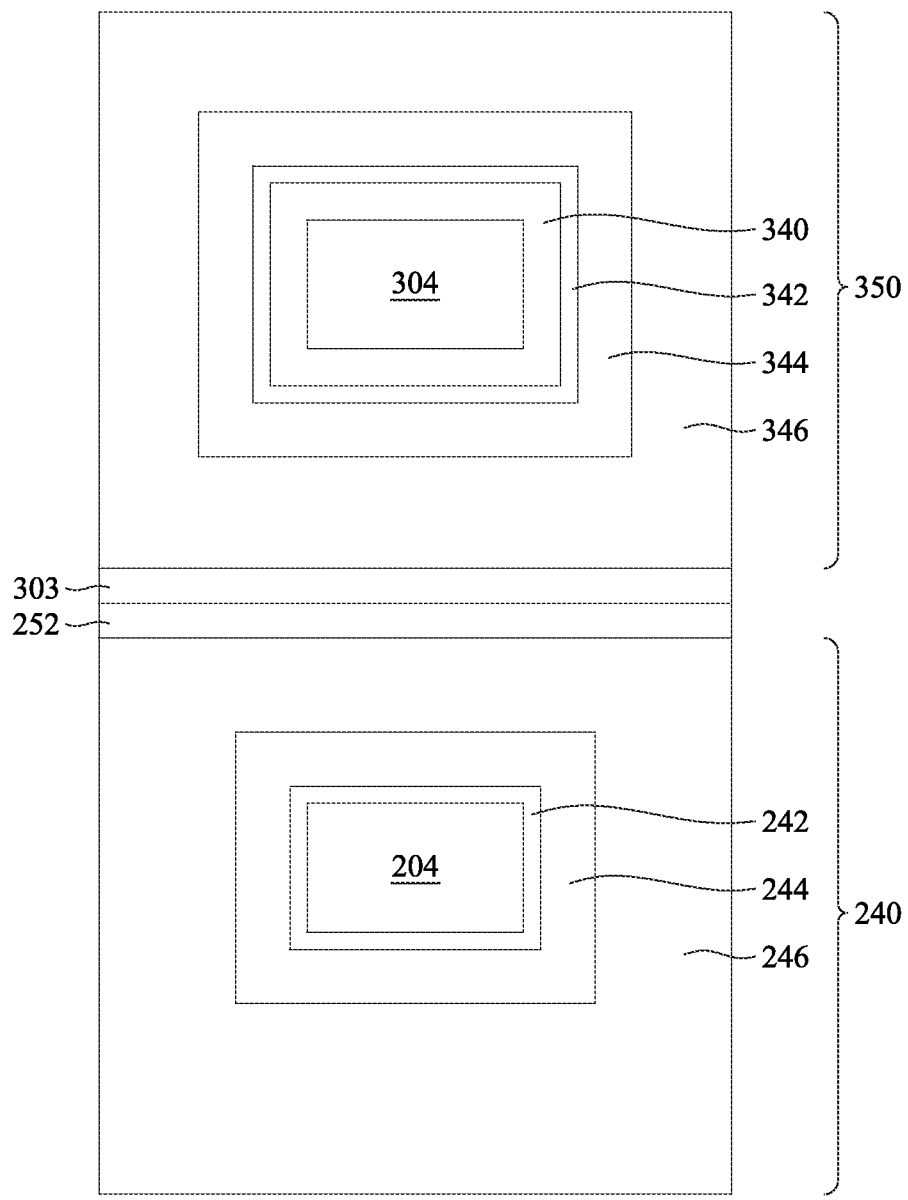
FIG. 37C illustrates a combined zoom-in view of the top device and the bottom device illustrated in FIG. 37A, in accordance with some embodiments of the present disclosure.

In FIGS. 37A-37C, a high-k gate dielectric layer 344 is formed over the germanium oxynitride layer 342. The high-k gate dielectric layer 344 can be formed using various deposition techniques, such as atomic layer deposition (ALD), chemical vapor deposition (CVD), or physical vapor deposition (PVD). These techniques enable the formation of a uniform and conformal high-k gate dielectric layer 344 over the germanium oxynitride layer 342 and the underlying nanostructures. The formation of the high-k gate dielectric layer 344 is performed in such a way that the interface between the high-k gate dielectric layer 344 and the germanium oxynitride layer 342 is of high quality. The germanium oxynitride layer 342, with its controlled thickness and nitrogen concentration profile, provides a barrier against intermixing between the high-k gate dielectric layer 344 and the germanium oxide interfacial layer 340, ensuring the preservation of the desired electrical properties and performance of the top GAA-FETs.

In some embodiments, the high-k gate dielectric layer 344 has a dielectric constant greater than a dielectric constant of $SiO_2$ (about 3.9). The high-k gate dielectric layer 344 includes dielectric materials such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), the like, or combinations thereof. In some embodiments, the high-k gate dielectric layer 344 is thicker than the germanium oxynitride layer 342, the germanium oxide interfacial layer 340, or a combination thereof. For example, the high-k gate dielectric layer 344 has a thickness in a range from about 1 nm to about 5 nm. In some embodiments, the high-k gate dielectric layer 344 is deposited using a thermal or plasma-assisted process. In some embodiments, the high-k gate dielectric layer 344 is deposited at a temperature in a range from about 150° C. to about 300° C.

A gate metal layer 346 is deposited around the high-k gate dielectric layer 344 and filling a remainder of gate trenches GT2 using various deposition techniques, such as chemical vapor deposition (CVD), physical vapor deposition (PVD), or atomic layer deposition (ALD), followed by followed by a CMP process to remove excessive materials of the gate metal layer 346 and the high-k dielectric layer 344, resulting in high-k/metal gate structures 350 having top surfaces level with a top surface of the ILD layer 336. In each gate trench GT2, the germanium oxide interfacial layer 340, the germanium oxynitride layer 342, the high-k gate dielectric layer 344, and the gate metal layer 346 collectively serve as a high-k/metal gate (HKMG) structure 350. The HKMG structure 350 surrounds each of the Ge-based nanostructures 304, and thus is referred to as a gate of a top GAA-FET.

In some embodiments, the gate metal layer 346 includes one or more metal layers. For example, the gate metal layer 346 may include one or more work function metal layers stacked one over another and a fill metal filling up a remainder of gate trenches GT2. The one or more work function metal layers in the gate metal layer 346 provide a suitable work function for the high-k/metal gate structures 350. For an n-type GAA FET, the gate metal layer 346 may include one or more n-type work function metal (N-metal) layers. The n-type work function metal may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TIC), aluminum carbide (AIC)), aluminides, and/or other suitable materials. On the other hand, for a p-type GAA FET, the gate metal layer 346 may include one or more p-type work function metal (P-metal) layers. The p-type work function metal may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the fill metal in the gate metal layer 346 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl. TiAlN, or other suitable materials. In some embodiments, each layer in the gate metal layer 346 has a thickness in a range from about 0.5 nm to about 5 nm.

Figure 38:
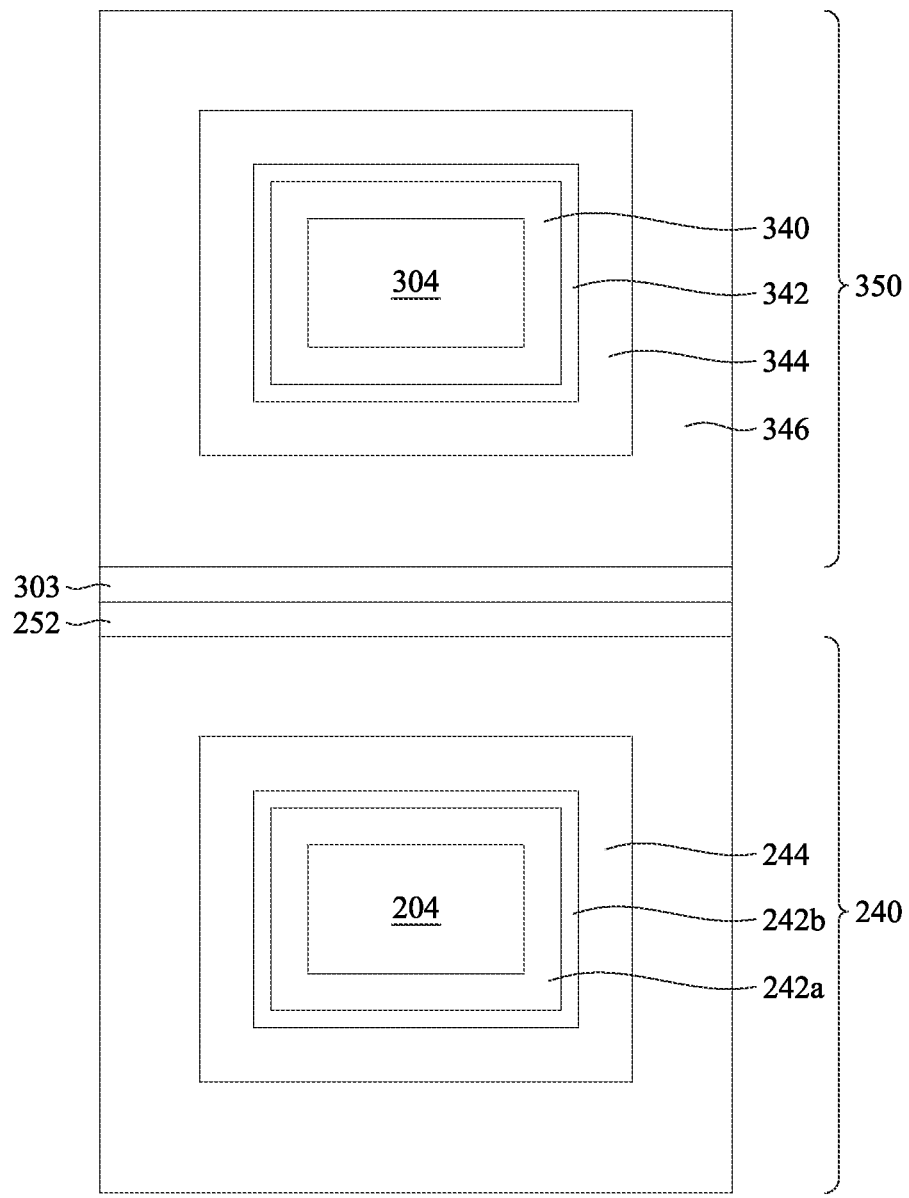
FIG. 38 illustrates a combined zoom-in view of a top device and a bottom device, in accordance with some embodiments of the present disclosure.

FIG. 37C illustrates a combined zoom-in view of the top HKMG structure 350 and the bottom HKMG structure 240. In some embodiments where the nanostructure 204 is Si, a silicon oxide interfacial layer 242 may be formed on the Si nanostructure 204 using oxidation techniques, and a high-k dielectric layer 244 formed on the silicon oxide interfacial layer 242 in the bottom high-k metal gate (HKMG) structure 240. Due to the nature of the materials involved, no or negligible intermixing occurs between the high-k dielectric layer 244 and the silicon oxide interfacial layer 242. Therefore, no oxynitride material is included between the silicon oxide interfacial layer 242 and the high-k dielectric layer 244. In contrast, the top HKMG structure 350 includes a germanium oxynitride layer 342 between the germanium oxide interfacial layer 340 and the high-k dielectric layer 344 to prevent intermixing between germanium oxide and the high-k dielectric material. Alternatively, as illustrated in FIG. 38, in some embodiments where the nanostructure 204 is Ge-based material, a germanium oxide interfacial layer 242a is formed on the Ge-based nanostructure 204, and a germanium oxynitride layer 242b can be formed between the germanium oxide interfacial layer 242a and the high-k dielectric layer 244 to prevent intermixing between germanium oxide and the high-k dielectric material. Details about formation of the germanium oxynitride layer 242b and the germanium oxide layer 242a are similar to that of the germanium oxynitride layer 342 and the germanium oxide layer 340 discussed previously with respect to FIGS. 34A-36C, and therefore these details are not repeated for the sake of brevity.

Based on the above discussions, it can be seen that the present disclosure in various embodiments offers advantages. It is understood, however, that other embodiments may offer additional advantages, and not all advantages are necessarily disclosed herein, and that no particular advantage is required for all embodiments. One advantage is that interface trap density can be reduced by using the germanium oxide interfacial layer. Another advantage is that intermixing between the high-k dielectric material and the germanium oxide interfacial layer can be prevented by using the germanium oxynitride layer.

In some embodiments, a method comprises forming a germanium-based channel material over a substrate, forming a germanium oxide interfacial layer over the germanium-based channel material, forming a germanium oxynitride layer over the germanium oxide interfacial layer, forming a high-k dielectric layer over the germanium oxynitride layer, and forming a gate metal layer over the high-k dielectric layer. In some embodiments, the germanium oxynitride layer is formed by nitridating a surface layer of the germanium oxide interfacial layer. In some embodiments, the method further comprises performing an annealing process on the germanium oxynitride layer. In some embodiments, the annealing process is performed at a temperature lower than about 500° C. In some embodiments, the annealing process is performed such that a thickness of the germanium oxynitride layer is reduced. In some embodiments, the annealing process is performed before forming the high-k dielectric layer over the germanium oxynitride layer. In some embodiments, the germanium oxide interfacial layer is formed by performing an oxidation process on the germanium-based channel material.

In some embodiments, a method comprises forming a plurality of first transistors over a substrate, forming a first bonding dielectric layer over the plurality of first transistors, bonding a multi-layer stack to the first bonding dielectric layer using a second bonding dielectric layer. The multi-layer stack comprises alternating first semiconductor layers and second semiconductor layers. First portions of the first semiconductor layers are replaced with a gate structure. The gate structure comprises a germanium oxide layer interfacing one of the second semiconductor layer, a germanium oxynitride layer interfacing the germanium oxide layer, a high-k gate dielectric layer over the germanium oxynitride layer, and a gate metal layer over the high-k dielectric layer. In some embodiments, the germanium oxynitride layer has a nitrogen concentration gradient. In some embodiments, the method further comprises removing second portions of the first semiconductor layers to form source/drain recesses, and forming epitaxial source/drain regions in the source/drain recesses. In some embodiments, the first transistors are of a first conductivity type, and the epitaxial source/drain regions are of a second conductivity type different from the first conductivity type. In some embodiments, the second semiconductor layers are germanium-containing semiconductor layers. In some embodiments, the high-k gate dielectric layer is in contact with the germanium oxynitride layer. In some embodiments, the germanium oxynitride layer is formed by performing a nitridation process on the germanium oxide layer. In some embodiments, the germanium oxide layer is formed by performing an oxidation process on the semiconductor layers.

In some embodiments, an IC structure comprises a first transistor and a second transistor. The first transistor comprises a first channel region and a first gate structure over the first channel region. The second transistor is stacked over the first transistor. The second transistor comprises a second channel region and a second gate structure over the second channel region. The second gate structure comprises a germanium oxide layer over the second channel region, a high-k dielectric layer over the germanium oxide layer, a gate metal layer over the high-k dielectric layer, and a nitrogen-containing layer spacing apart the germanium oxide layer from the high-k dielectric layer. In some embodiments, the nitrogen-containing layer comprises germanium oxynitride. In some embodiments, the nitrogen-containing layer has a non-uniform nitrogen concentration. In some embodiments, the nitrogen-containing layer has a nitrogen concentration changing as a function of thickness of the nitrogen-containing layer. In some embodiments, the first transistor and the second transistor are of different conductivity types.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a germanium-based channel material over a substrate;
   forming a germanium oxide interfacial layer over the germanium-based channel material;
   forming a germanium oxynitride layer over the germanium oxide interfacial layer;
   forming a high-k dielectric layer over the germanium oxynitride layer; and
   forming a gate metal layer over the high-k dielectric layer.

2. The method of claim 1, wherein the germanium oxynitride layer is formed by nitridating a surface layer of the germanium oxide interfacial layer.

3. The method of claim 1, further comprising:
   performing an annealing process on the germanium oxynitride layer.

4. The method of claim 3, wherein the annealing process is performed at a temperature lower than about 500° C.

5. The method of claim 3, wherein the annealing process is performed such that a thickness of the germanium oxynitride layer is reduced.

6. The method of claim 3, wherein the annealing process is performed before forming the high-k dielectric layer over the germanium oxynitride layer.

7. The method of claim 1, wherein the germanium oxide interfacial layer is formed by performing an oxidation process on the germanium-based channel material.

8. A method, comprising:
   forming a plurality of first transistors over a substrate;
   forming a first bonding dielectric layer over the plurality of first transistors;
   bonding a multi-layer stack to the first bonding dielectric layer using a second bonding dielectric layer, the multi-layer stack comprising alternating first semiconductor layers and second semiconductor layers; and
   replacing first portions of the first semiconductor layers with a gate structure, the gate structure comprising:
   a germanium oxide layer interfacing one of the second semiconductor layer;
   a germanium oxynitride layer interfacing the germanium oxide layer;
   a high-k dielectric layer over the germanium oxynitride layer; and
   a gate metal layer over the high-k dielectric layer.

9. The method of claim 8, wherein the germanium oxynitride layer has a nitrogen concentration gradient.

10. The method of claim 8, further comprising:
    removing second portions of the first semiconductor layers to form source/drain recesses; and
    forming epitaxial source/drain regions in the source/drain recesses.

11. The method of claim 10, wherein the first transistors are of a first conductivity type, and the epitaxial source/drain regions are of a second conductivity type different from the first conductivity type.

12. The method of claim 8, wherein the second semiconductor layers are germanium-containing semiconductor layers.

13. The method of claim 8, wherein the high-k dielectric layer is in contact with the germanium oxynitride layer.

14. The method of claim 8, wherein the germanium oxynitride layer is formed by performing a nitridation process on the germanium oxide layer.

15. The method of claim 8, wherein the germanium oxide layer is formed by performing an oxidation process on the second semiconductor layers.

16. An integrated circuit (IC) structure, comprising:
    a first transistor comprising a first channel region and a first gate structure over the first channel region; and
    a second transistor stacked over the first transistor, the second transistor comprising a second channel region and a second gate structure over the second channel region, the second gate structure comprising:
    a germanium oxide layer over the second channel region;
    a high-k dielectric layer over the germanium oxide layer;
    a gate metal layer over the high-k dielectric layer; and
    a nitrogen-containing layer spacing apart the germanium oxide layer from the high-k dielectric layer.

17. The IC structure of claim 16, wherein the nitrogen-containing layer comprises germanium oxynitride.

18. The IC structure of claim 16, wherein the nitrogen-containing layer has a non-uniform nitrogen concentration.

19. The IC structure of claim 16, wherein the nitrogen-containing layer has a nitrogen concentration changing as a function of thickness of the nitrogen-containing layer.

20. The IC structure of claim 16, wherein the first transistor and the second transistor are of different conductivity types.

* * * * *